United States Patent
Peng et al.

(10) Patent No.: US 12,494,411 B2
(45) Date of Patent: Dec. 9, 2025

(54) INTEGRATED CIRCUIT AND METHOD OF FORMING THE SAME

(71) Applicant: TAIWAN SEMICONDUCTOR MANUFACTURING COMPANY, LTD., Hsinchu (TW)

(72) Inventors: Shih-Wei Peng, Hsinchu (TW); Chih-Min Hsiao, Hsinchu (TW); Chia-Tien Wu, Hsinchu (TW); Chien-Wen Lai, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 700 days.

(21) Appl. No.: 17/827,525

(22) Filed: May 27, 2022

(65) Prior Publication Data

US 2023/0260878 A1     Aug. 17, 2023

Related U.S. Application Data

(60) Provisional application No. 63/311,347, filed on Feb. 17, 2022.

(51) Int. Cl.
*H01L 23/48* (2006.01)
*H10D 84/83* (2025.01)

(52) U.S. Cl.
CPC ......... *H01L 23/481* (2013.01); *H10D 84/834* (2025.01)

(58) Field of Classification Search
CPC ............... H01L 23/481; H01L 23/5226; H01L 23/5283; H10D 89/10
See application file for complete search history.

(56) References Cited

U.S. PATENT DOCUMENTS

2016/0300826 A1* 10/2016 Lee .................. H01L 23/528
2017/0154686 A1*  6/2017 Liaw ................ H10D 30/6211

FOREIGN PATENT DOCUMENTS

| TW | 201729384 | 8/2017 |
| TW | 202022880 | 6/2020 |
| TW | 202205447 | 2/2022 |

* cited by examiner

*Primary Examiner* — Syed I Gheyas
(74) *Attorney, Agent, or Firm* — Hauptman Ham, LLP

(57) ABSTRACT

An integrated circuit includes a first active region, a first contact, a first gate, a first conductive line, a first conductor and a first via. In some embodiments, the first active region extends in a first direction. In some embodiments, the first contact extends in a second direction, and overlaps at least the first active region. In some embodiments, the first gate extends in the second direction, and overlaps the first active region. In some embodiments, the first conductive line extends in the first direction, and overlaps the first gate. In some embodiments, the first conductor overlaps the first contact, the first gate and the first conductive line, and extends in the first direction and the second direction. In some embodiments, the first via is between the first conductor and the first conductive line, and electrically couples the first conductor and the first conductive line together.

20 Claims, 34 Drawing Sheets

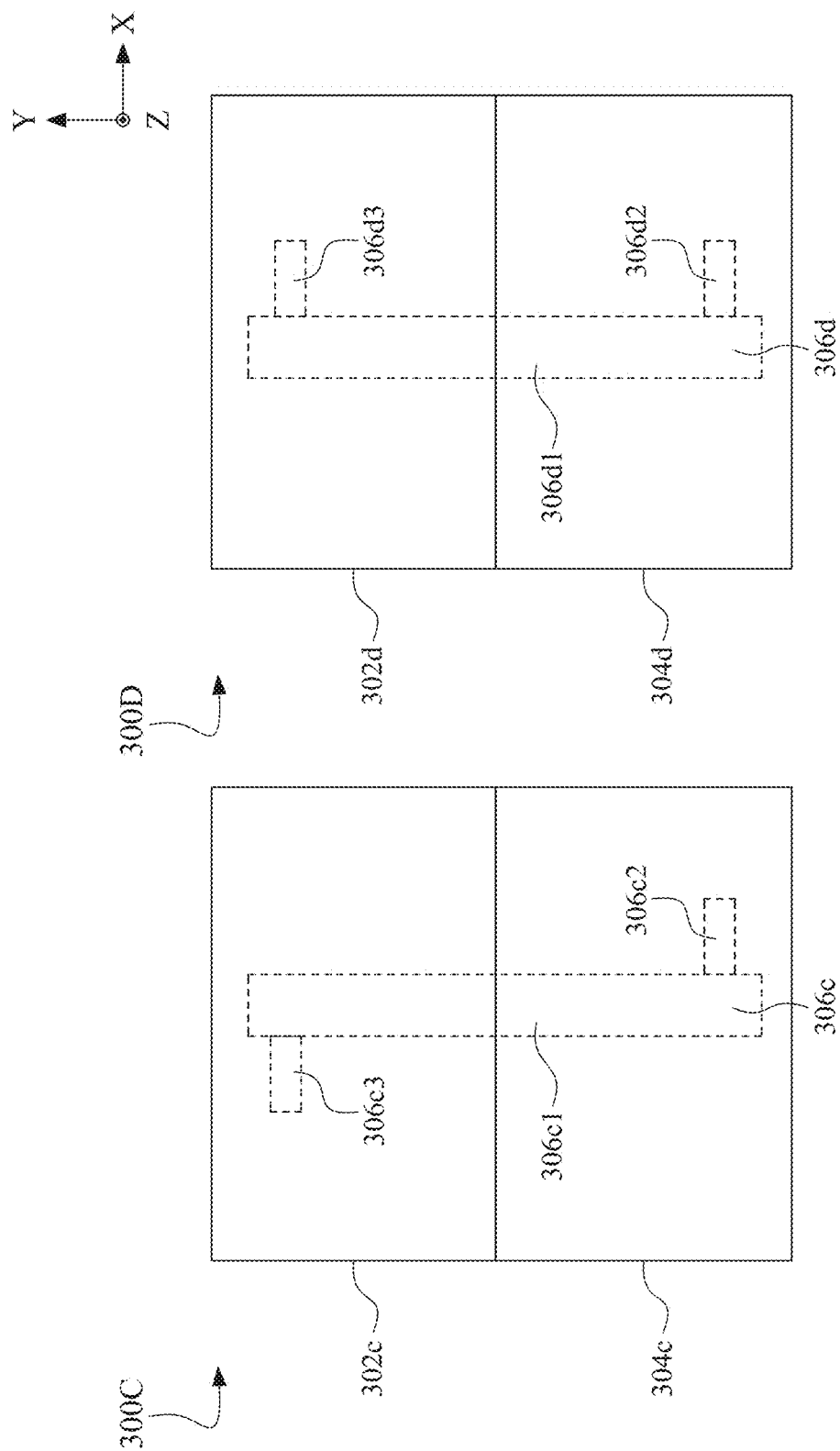

INTEGRATED CIRCUIT AND METHOD OF FORMING THE SAME

PRIORITY CLAIM

This application claims the benefit of U.S. Provisional Application No. 63/311,347, filed Feb. 17, 2022, which is herein incorporated by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D are corresponding top views of a corresponding integrated circuit, in accordance with some embodiments.

DETAILED DESCRIPTION

Figure 1A:
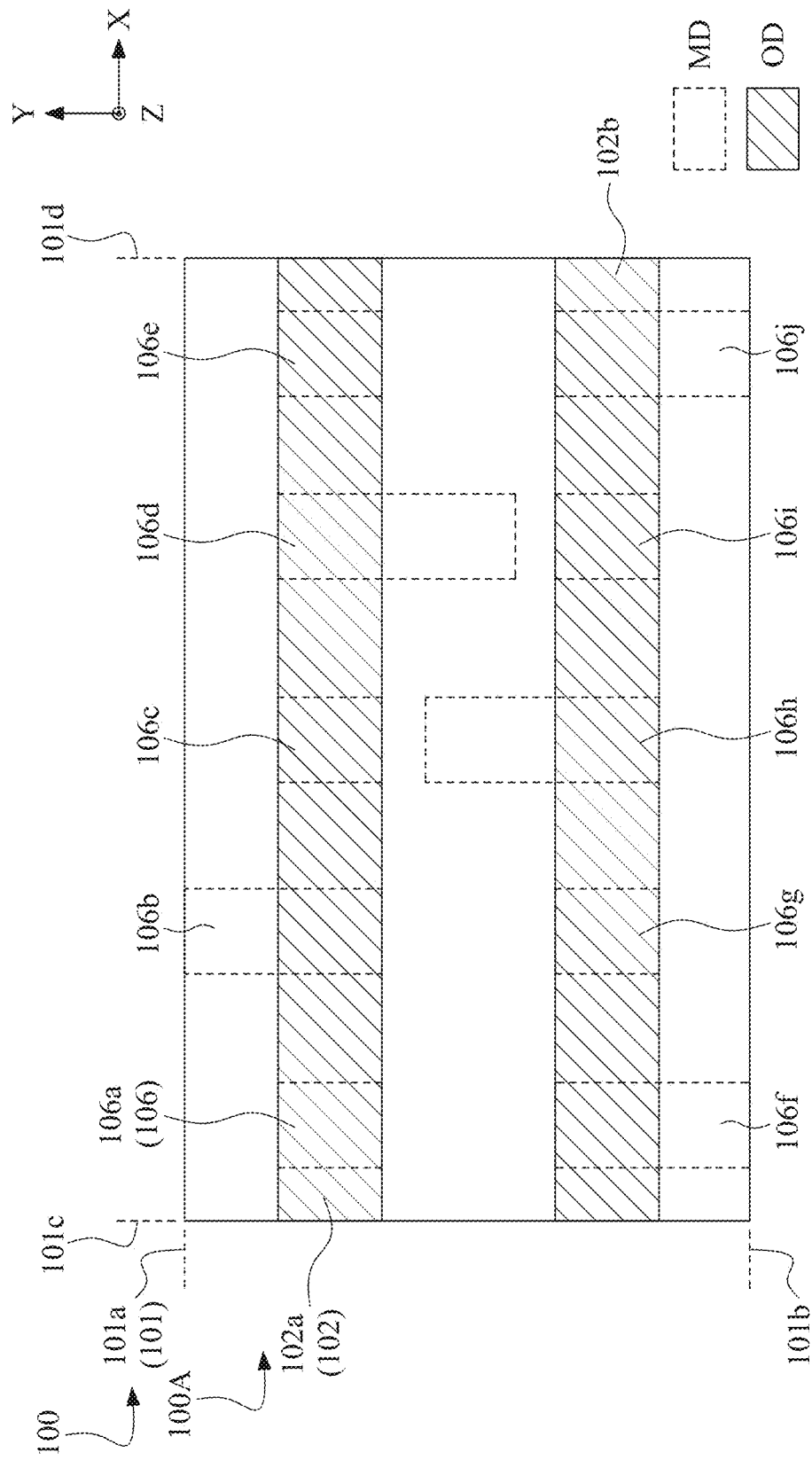
FIGS. 1A-1D are diagrams of a layout design of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a first active region, a first contact, a first gate, a first conductive line, a first conductor and a first via.

In some embodiments, the first active region extends in a first direction, and is on a first level of a substrate.

In some embodiments, the first contact extends in a second direction different from the first direction. In some embodiments, the first contact is on a second level different from the first level. In some embodiments, the first contact overlaps at least the first active region.

In some embodiments, the first gate extends in the second direction, overlaps the first active region, and is on a third level different from the first level.

In some embodiments, the first conductive line extends in the first direction, and overlaps the first gate. In some embodiments, the first conductive line is on a fourth level different from the first level, the second level and the third level.

In some embodiments, the first conductor overlaps the first contact, the first gate and the first conductive line. In some embodiments, the first conductor is on a fifth level different from the first level, the second level, the third level and the fourth level.

In some embodiments, the first via is between the first conductor and the first conductive line. In some embodiments, the first via electrically couples the first conductor and the first conductive line together.

In some embodiments, the first conductor extends in the first direction and the second direction. In some embodiments, by extending the first conductor in the first direction and the second direction (e.g., 2 directions) and by positioning the first conductor to overlap at least the first contact, the first gate and the first conductive line, the first conductor provides additional routing resources in the first direction or the second direction in the integrated circuit, and integrated circuit has at least a smaller area or a smaller standard cell, more routing flexibility, reduced power or improved performance compared to other approaches.

FIGS. 1A-1D are diagrams of a layout design 100 of an integrated circuit, in accordance with some embodiments. Layout design 100 is a layout diagram of integrated circuit 200 of FIGS. 2A-2E.

Figure 1B:
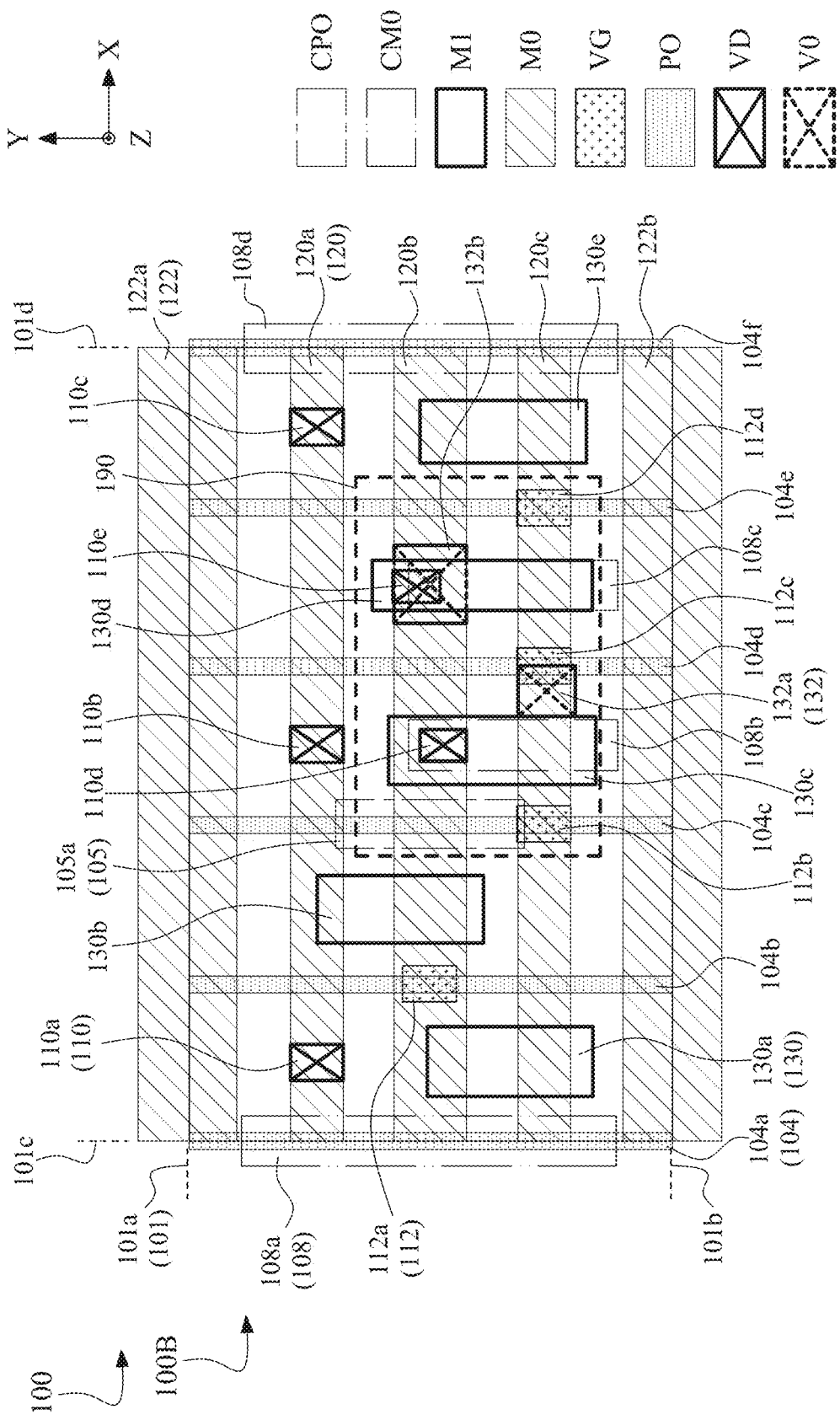
Figure 1C:
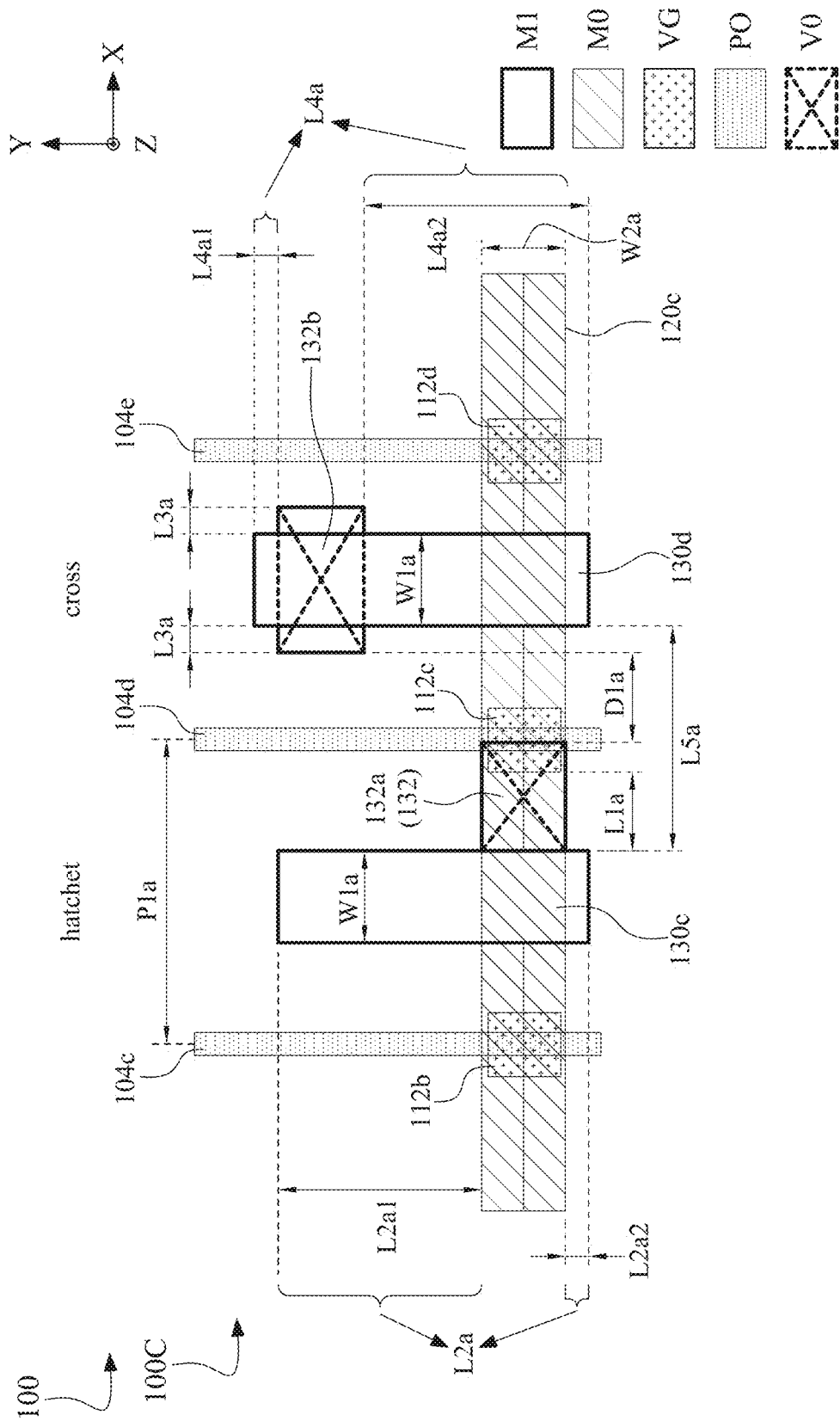
Figure 1D:
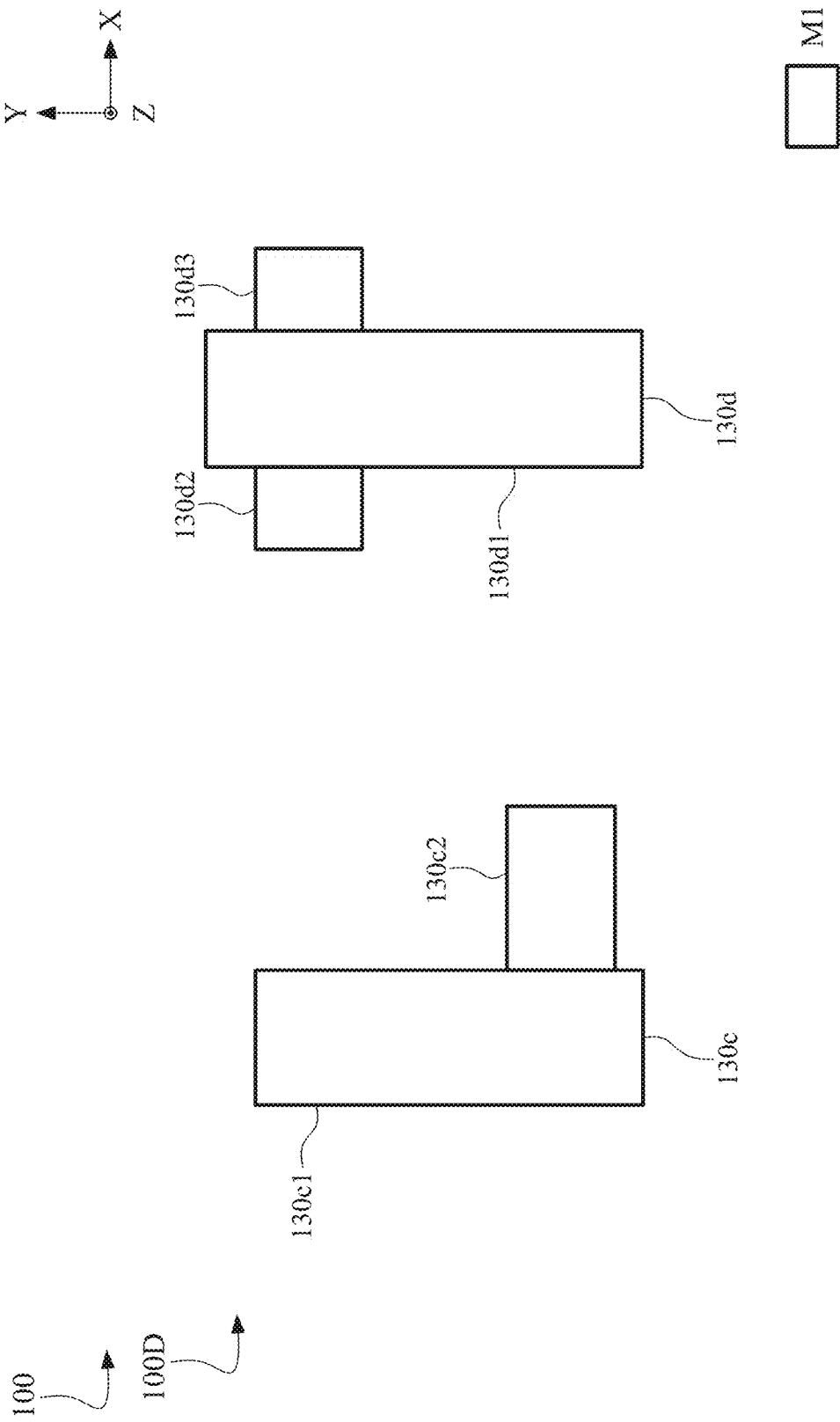

FIG. 1A is a diagram of a corresponding portion 100A of layout design 100, simplified for ease of illustration. FIG. 1B is a diagram of a corresponding portion 100B of layout design 100, simplified for ease of illustration. FIG. 1C is a diagram of a corresponding portion 100C of layout design 100, simplified for ease of illustration. FIG. 1D is a diagram of a corresponding portion 100D of layout design 100, simplified for ease of illustration.

For ease of illustration, some of the labeled elements of one or more of FIGS. 1A-1B, 2A-2D and 3A-7 are not labelled in one or more of FIGS. 1A-1B, 2A-2E and 3A-19F. In some embodiments, layout design 100 includes additional elements not shown in FIGS. 1A-1D.

Portion 100A includes one or more features of an oxide diffusion (OD) level or an active level and a metal over diffusion (MD) level.

Portion 100B includes one or more features of a gate (POLY) level, a via over gate (VG) level, a via over diffusion (VD) level, a metal 0 (M0) level, a metal 1 (M1) level and a via 0 (V0) level.

Portion 100C includes one or more features of the POLY level, the VG level, the M0 level, the M1 level and the V0 level. Portion 100C includes a zoomed-in portion 190 of portion 100B of FIG. 1B.

Portion 100D includes one or more features of the M1 level. Portion 100D includes conductive feature patterns 130c and 130d of portion 100B of FIG. 1B.

Layout design 100 is usable to manufacture integrated circuit 200 of FIGS. 2A-2E.

Layout design 100 includes a cell 101. The cell 101 has cell boundaries 101a and 101b that extend in a first direction X, and cell boundaries 101c and 101d that extend in a second direction Y. In some embodiments, the second direction Y is different from the first direction X. In some embodiments, layout design 100 abuts other cell layout designs (not shown) along cell boundaries 101c and 101d. In some embodiments, layout design 100 abuts other cell layout designs (not shown) along cell boundaries 101a and 101b that extend in the first direction X. In some embodiments, layout design 100 is a single height standard cell.

In some embodiments, cell 101 is a standard cell, and layout design 100 corresponds to a layout of a standard cell defined by cell boundaries 101a, 101b, 101c and 101d. In some embodiments, a cell 101 is a predefined portion of layout design 100 including one or more transistors and electrical connections configured to perform one or more circuit functions. In some embodiments, cell 101 is bounded by cell boundaries 101a, 101b, 101c and 101d, and thus corresponds to a region of functional circuit components or devices that are part of a standard cell.

In some embodiments, e.g., the embodiments depicted in FIGS. 1A-19F discussed below, a given cell has cell boundaries 101c and 101d/201c and 201d that are overlapped by corresponding gate layout patterns 104a and 104f/structures 204a and 204f. For example, in some embodiments, cell boundaries 101c and 101d of cell 101 are identified by gate layout patterns 104a and 104f.

A cell is thereby configured as one or more of a standard cell, a custom cell, an engineering change order (ECO) cell, a logic gate cell, a memory cell, a custom cell, a physical device cell, or another type of cell or combination of cells capable of being defined in an IC layout diagram, e.g., IC layout design 100. In some embodiments, cell 101 is a standard cell of a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells. In some embodiments, layout design 100 is a layout design of a memory cell. In some embodiments, a memory cell includes a static random access memory (SRAM), a dynamic RAM (DRAM), a resistive RAM (RRAM), a magnetoresistive RAM (MRAM) or read only memory (ROM). In some embodiments, layout design 100 includes layout designs of one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like, FinFETs, nanosheet transistors, nanowire transistors, complementary FETs (CFETs) and planar MOS transistors with raised source/drain. Examples of passive elements include, but are not limited to, capacitors, inductors, fuses, and resistors. In some embodiments, layout design 100 is a standard cell layout design. In some embodiments, layout design 100 is a layout design of a logic gate cell.

Layout design 100 further includes one or more active region layout patterns 102a or 102b (collectively referred to as a "set of active region patterns 102") extending in the first direction X.

Embodiments of the present disclosure use the term "layout pattern" which is hereinafter also referred to as "patterns" in the remainder of the present disclosure for brevity.

Active region patterns 102a, 102b of the set of active region patterns 102 are separated from one another in the second direction Y. The set of active region patterns 102 is usable to manufacture a corresponding set of active regions 202 of integrated circuits 200, 300A-300D, 500, 700, 900, 1100, 1300, 1500, 1700 or 1900A-1900F.

In some embodiments, the set of active regions 202 are located on a front-side (not labelled) of at least integrated circuit 200, 300A-300D, 500, 700, 900, 1100, 1300, 1500, 1700 or 1900A-1900F. In some embodiments, active region patterns 102a, 102b of the set of active region patterns 102 are usable to manufacture corresponding active regions 202a, 202b of the set of active regions 202 of integrated circuit 200, 300A-300D, 500, 700, 900, 1100, 1300, 1500, 1700 or 1900A-1900F.

In some embodiments, the set of active region patterns 102 is referred to as an oxide diffusion (OD) region which defines the source or drain diffusion regions of at least integrated circuit 200, 300A-300D, 500, 700, 900, 1100, 1300, 1500, 1700 or 1900A-1900F or layout design 100, 100B.

In some embodiments, active region pattern 102a of the set of active region patterns 102 is usable to manufacture source and drain regions of n-type metal oxide semiconductor (NMOS) transistors of integrated circuits 200, 300A-300D, 500, 700, 900, 1100, 1300, 1500, 1700 and 1900A-1900F, and active region pattern 102b of the set of active region patterns 102 is usable to manufacture source and drain regions of p-type metal oxide semiconductor (PMOS) transistors of integrated circuits 200, 300A-300D, 500, 700, 900, 1100, 1300, 1500, 1700 and 1900A-1900F.

In some embodiments, active region pattern 102a of the set of active region patterns 102 is usable to manufacture source and drain regions of PMOS transistors of integrated circuits 200, 300A-300D, 500, 700, 900, 1100, 1300, 1500, 1700 and 1900A-1900F, and active region pattern 102b of the set of active region patterns 102 is usable to manufacture source and drain regions of NMOS transistors of integrated circuits 200, 300A-300D, 500, 700, 900, 1100, 1300, 1500, 1700 and 1900A-1900F.

In some embodiments, the set of active region patterns 102 is located on a first layout level. In some embodiments, the first layout level corresponds to an active level or an OD level of one or more of layout design 100 or integrated circuits 200, 300A-300D, 500, 700, 900, 1100, 1300, 1500, 1700 and 1900A-1900F.

In some embodiments, active region pattern 102a is usable to manufacture source and drain regions of one or more n-type finFET transistors, n-type nanosheet transistors or n-type nanowire transistors, and active region pattern 102b is usable to manufacture source and drain regions of one or more p-type finFET transistors, p-type nanosheet transistors or p-type nanowire transistors.

In some embodiments, active region pattern 102a is usable to manufacture source and drain regions of one or more p-type finFET transistors, p-type nanosheet transistors or p-type nanowire transistors, and active region pattern 102b is usable to manufacture source and drain regions of one or more n-type finFET transistors, n-type nanosheet transistors or n-type nanowire transistors.

Other numbers of active region patterns in the set of active region patterns 102 are within the scope of the present disclosure.

Other configurations, arrangements on other layout levels or quantities of patterns in the set of active region patterns 102 are within the scope of the present disclosure.

Layout design 100 further includes one or more gate patterns 104a, . . . , 104e or 104f (collectively referred to as a "set of gate patterns 104") extending in the second direction Y. Each of the gate patterns of the set of gate patterns 104 is separated from an adjacent gate pattern of the set of gate patterns 104 in the first direction X by a first pitch (not labelled).

The set of gate patterns 104 is usable to manufacture a corresponding set of gates 204 of integrated circuit 200, 300A-300D, 500, 700, 900, 1100, 1300, 1500, 1700 or 1900A-1900F.

In some embodiments, gate patterns 104a, . . . , 104e or 104f of the set of gate patterns 104 is usable to manufacture corresponding gates 204a, . . . , 204e or 204f of the set of gates 204 of integrated circuit 200, 300A-300D, 500, 700, 900, 1100, 1300, 1500, 1700 or 1900A-1900F.

In some embodiments, at least a portion of gate pattern 104a, . . . , 104e or 104f of the set of gate patterns 104 is usable to manufacture gates of NMOS transistors of integrated circuit 200, 300A-300D, 500, 700, 900, 1100, 1300, 1500, 1700 or 1900A-1900F, and at least a portion of gate pattern 104a, . . . , 104e or 104f of the set of gate patterns 104 is usable to manufacture gates of PMOS transistors of integrated circuit 200, 300A-300D, 500, 700, 900, 1100, 1300, 1500, 1700 or 1900A-1900F.

Each gate pattern in the set of gate patterns 104 is separated from an adjacent gate pattern in the set of gate patterns 104 in the second direction Y by a pitch P1a. In some embodiments, the pitch P1a is measured from a center of a gate pattern in the set of gate patterns 104 to a center of an adjacent gate pattern in the set of gate patterns 104.

The set of gate patterns 104 is above the set of active region patterns 102. The set of gate patterns 104 is positioned on a second layout level different from the first layout level. In some embodiments, the second layout level is different from the first layout level. In some embodiments, the second layout level corresponds to the POLY level of one or more of layout design 100 or integrated circuits 200, 300A-300D, 500, 700, 900, 1100, 1300, 1500, 1700 and 1900A-1900F.

In some embodiments, the POLY level is above the OD level.

Other configurations, arrangements on other layout levels or quantities of patterns in the set of gate patterns 104 are within the scope of the present disclosure.

Layout design 100 further includes a set of poly cut feature patterns 105. The set of cut feature patterns 105 includes at least a poly cut feature pattern 105a. Set of poly cut feature patterns 105 extends in the first direction X. Poly cut feature pattern 105a overlaps set of gate patterns 104. In some embodiments, poly cut feature pattern 105a overlaps set of gate patterns 104 in a middle portion of layout design 100.

Poly cut feature pattern 105a overlaps one or more gate patterns in the set of gate patterns 104. In some embodiments, each cut feature pattern 105a of the set of poly cut feature patterns 105 is separated from another cut feature pattern (not shown) of the set of poly cut feature patterns 105 in the first direction X.

Figure 20:
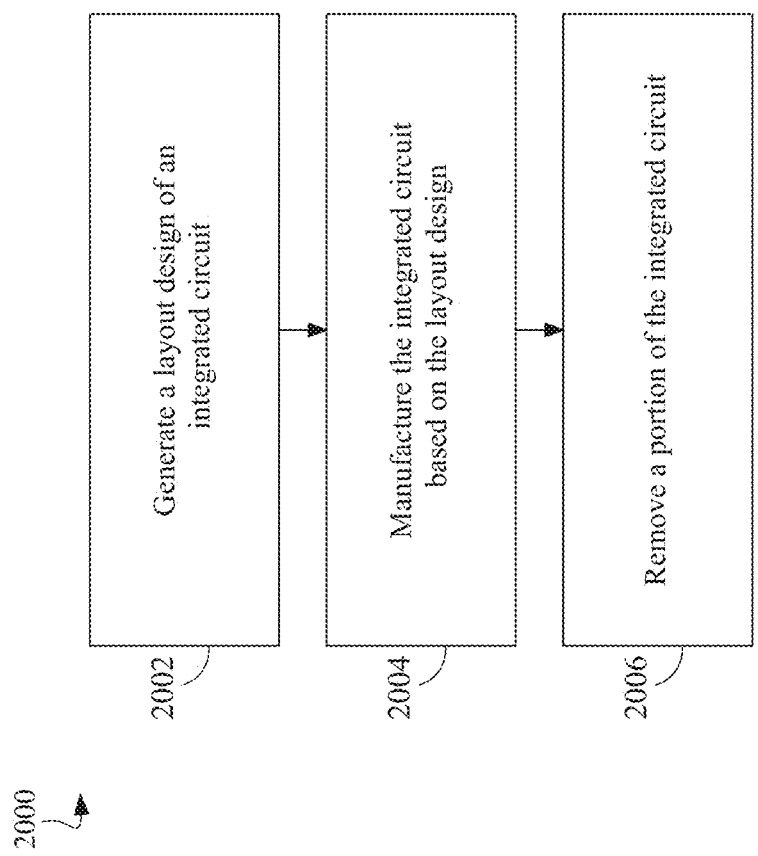
FIG. 20 is a flow chart of a method of manufacturing an IC device, in accordance with some embodiments.

Set of poly cut feature patterns 105 has a gate pattern width (not labelled) in the second direction Y, and a gate pattern length (not labelled) in the first direction X. In some embodiments, poly cut feature pattern 105a are usable to identify a corresponding location of a removed portion 205a of corresponding gate structure 204c of integrated circuit 200 that is removed during operation 2006 of method 2000 (FIG. 20).

In some embodiments, the gate pattern width (not labelled) corresponds to the gate cut width (not labelled) of one or more of gate structures 204c1 and 204c2. In some embodiments, the gate pattern length (not labelled) corresponds to the gate cut length (not labelled) of one or more of gate structures 204c1 and 204c2. In some embodiments, at least one of the set of gate layout patterns 104, or the set of poly cut feature patterns 105 is located on the second layout level or the POLY level. Other configurations or quantities of patterns in the poly cut feature pattern 105 are within the scope of the present disclosure.

Layout design 100 further includes one or more contact patterns 106a, . . . , 106i or 106j (collectively referred to as a "set of contact patterns 106") extending in the second direction Y.

Each of the contact patterns of the set of contact patterns 106 is separated from an adjacent contact pattern of the set of contact patterns 106 in at least the first direction X or the second direction Y.

The set of contact patterns 106 is usable to manufacture a corresponding set of contacts 206 of integrated circuit 200, 300A-300D, 500, 700, 900, 1100, 1300, 1500, 1700 or 1900A-1900F. In some embodiments, contact pattern 106a, . . . , 106i or 106j of the set of contact patterns 106 is usable to manufacture corresponding contact 206a, . . . , 206i or 206j of the set of contacts 206. In some embodiments, the set of contact patterns 106 is also referred to as a set of metal over diffusion (MD) patterns.

In some embodiments, at least one of contact pattern 106a, . . . , 106i or 106j of the set of contact patterns 106 is usable to manufacture source or drain terminals of one of the NMOS or PMOS transistors of integrated circuit 200, 300A-300D, 500, 700, 900, 1100, 1300, 1500, 1700 or 1900A-1900F.

In some embodiments, the set of contact patterns 106 overlap the set of active region patterns 102. The set of contact patterns 106 is located on a third layout level. In some embodiments, the third layout level corresponds to the contact level or an MD level of one or more of layout design 100, or integrated circuit 200, 300A-300D, 500, 700, 900, 1100, 1300, 1500, 1700 or 1900A-1900F. In some embodiments, the third layout level is the same as the second layout level. In some embodiments, the third layout level is different from the first layout level.

Other configurations, arrangements on other layout levels or quantities of patterns in the set of contact patterns 106 are within the scope of the present disclosure.

Layout design 100 further includes one or more conductive feature patterns 120a, 120b or 120c (collectively referred to as a "set of conductive feature patterns 120") extending in at least the first direction X.

Each of conductive feature patterns 120a, 120b or 120c of the set of conductive feature patterns 120 are separated from each other in at least the second direction Y.

In some embodiments, while each of conductive feature patterns 120a, 120b or 120c is shown as continuous patterns, one or more of conductive feature patterns 120a, 120b or 120c is separated to form discontinuous patterns.

The set of conductive feature patterns 120 is usable to manufacture a corresponding set of conductors 220 of integrated circuit 200, 300A-300D, 500, 700, 900, 1100, 1300, 1500, 1700 or 1900A-1900F. In some embodiments, conductive feature pattern 120a, 120b or 120c is usable to manufacture corresponding conductor 220a, 220b or 220c of the set of conductors 220 of integrated circuit 200, 300A-300D, 500, 700, 900, 1100, 1300, 1500, 1700 or 1900A-1900F. In some embodiments, the set of conductors 220 are located on the front-side (not labelled) of integrated circuit 200.

In some embodiments, conductive feature pattern 120a, 120b or 120c are referred to as "signal line patterns." In some embodiments, conductors 220a, 220b or 220c are referred to as "signal lines."

The set of conductive feature patterns 120 overlap the set of gate patterns 104, the set of active region patterns 102 and the set of contact patterns 106. In some embodiments, the set of conductive feature patterns 120 is on a fourth layout level. In some embodiments, the fourth layout level is different from the first layout level, the second layout level and the third layout level. In some embodiments, the fourth layout level corresponds to the M0 level of one or more of layout design 100, or integrated circuit 200, 300A-300D, 500, 700, 900, 1100, 1300, 1500, 1700 or 1900A-1900F. In some embodiments, the M0 level is above the OD level, the POLY level, the MD level, the VG level and the VD level. In some embodiments, the set of conductive feature patterns 120 are located on other metal layers (e.g., metal-1 (M1), metal-2 (M2), etc.).

In some embodiments, the set of conductive feature patterns 120 corresponds to 3 M0 routing tracks in layout design 100. Other numbers of M0 routing tracks are within the scope of the present disclosure.

Other configurations, arrangements on other layout levels or quantities of patterns in the set of conductive feature patterns 120 are within the scope of the present disclosure.

Layout design 100 further includes one or more conductive feature patterns 122a or 122b (collectively referred to as a "set of conductive feature patterns 122") extending in the first direction X, and being located on the fourth layout level.

In some embodiments, the set of conductive feature patterns 122 are referred to as a "set of power rail patterns 122." In some embodiments, conductive feature pattern 122a or 122b are referred to as corresponding power rail pattern 122a or 122b.

The set of conductive feature patterns 122 is usable to manufacture a corresponding set of conductors 220 of integrated circuit 200 (FIGS. 2A-2E). In some embodiments, the set of conductors 220 are located on the front-side of integrated circuit 200. In some embodiments, conductive feature patterns 122a, 122b of the set of conductive feature patterns 122 are usable to manufacture corresponding conductors 222a, 222b of the set of conductors 222 (FIGS. 2A-2E) of integrated circuit 200.

Conductive feature patterns 122a and 122b of the set of conductive feature patterns 122 are separated from each another in the second direction Y.

Other widths for the set of conductive feature patterns 122 or other numbers of conductive feature patterns in the set of conductive feature patterns 122 are within the scope of the present disclosure. In some embodiments, at least conductive feature pattern 122a has a width different from conductive feature pattern 122b.

Other configurations, arrangements on other layout levels or quantities of patterns in the set of conductive feature patterns 122 are within the scope of the present disclosure.

Layout design 100 further includes a set of cut feature patterns 108.

The set of cut feature patterns 108 extends in the second direction Y. The set of cut feature patterns 108 includes at least cut feature layout pattern 108a, 108b, 108c or 108d. In some embodiments, each cut feature layout pattern 108a, 108b, 108c or 108d of the set of cut feature patterns 108 is separated from an adjacent cut feature layout pattern in the first direction X. The set of cut feature patterns 108 is located on the fourth layout level.

In some embodiments, the set of cut feature patterns 108 overlaps at least a portion of a conductive feature pattern of the set of conductive feature patterns 120. In some embodiments, the set of cut feature patterns 108 overlaps other underlying layout patterns of other layout levels (e.g., Active, MD, POLY or the like) of layout design 100.

In some embodiments, cut feature patterns 108a or 108d identify corresponding locations of corresponding portions 208a or 208d of corresponding conductors 220a, 220b or 220c that are removed in operation 2006 of method 2000 (FIG. 20).

In some embodiments, cut feature patterns 108b or 108c identify corresponding locations of corresponding portions 208b or 208c of conductor 206b that are removed in operation 2006 of method 2000 (FIG. 20).

Cut feature pattern 108a overlaps conductive feature patterns 120a, 120b and 120c. Cut feature pattern 108b overlaps conductive feature pattern 120b. Cut feature pattern 108c overlaps conductive feature pattern 120c. Cut feature pattern 108d overlaps conductive feature patterns 120a, 120b and 120c.

Other locations, configurations or quantities of patterns in the set of cut feature patterns 108 are within the scope of the present disclosure.

Layout design 100 further includes one or more via patterns 110a, 110b, ..., 110d or 110e (collectively referred to as a "set of via patterns 110").

The set of via patterns 110 is usable to manufacture a corresponding set of vias 210 of integrated circuit 200, 300A-300D, 500, 700, 900, 1100, 1300, 1500, 1700 or 1900A-1900F. In some embodiments, via patterns 110a, 110b, ..., 110d or 110e of the set of via patterns 110 are usable to manufacture corresponding vias 210a, 210b, ..., 210d or 210e of the set of vias 210 of integrated circuit 200, 300A-300D, 500, 700, 900, 1100, 1300, 1500, 1700 or 1900A-1900F.

The set of via patterns 110 is positioned at a via over diffusion (VD) level of one or more of layout design 100 or integrated circuit 200, 300A-300D, 500, 700, 900, 1100, 1300, 1500, 1700 or 1900A-1900F. In some embodiments, the VD level is above the MD and the OD level. In some embodiments, the VD level is between the MD level and the M0 level. In some embodiments, the VD level is between the third layout level and the fourth layout level. Other layout levels are within the scope of the present disclosure.

In some embodiments, the set of vias 110 is located where the set of contact patterns 106 is overlapped by the set of conductors 120. In some embodiments, the set of via patterns 110 is between the set of contact patterns 106 and the set of conductive feature patterns 120. In some embodiments, the size of one or more via patterns in the set of vias patterns 110 can be increased thereby reducing resistance compared to other approaches.

In some embodiments, via patterns in the set of via patterns 110 that are positioned below adjacent M0 routing tracks are separated from each other by pitch P1a.

Other configurations, arrangements on other layout levels or quantities of patterns in at least set of via patterns 110 are within the scope of the present disclosure.

Layout design 100 further includes one or more via patterns 112a, 112b, 112c or 112d (collectively referred to as a "set of via patterns 112").

The set of via patterns 112 is usable to manufacture a corresponding set of vias 212 of integrated circuit 200, 300A-300D, 500, 700, 900, 1100, 1300, 1500, 1700 or 1900A-1900F. In some embodiments, via patterns 112a, 112b, 112c or 112d of the set of via patterns 112 are usable to manufacture corresponding vias 212a, 212b, 212c or 212d of the set of vias 212 of integrated circuit 200, 300A-300D, 500, 700, 900, 1100, 1300, 1500, 1700 or 1900A-1900F.

The set of via patterns 112 is positioned at a via over gate (VG) level of one or more of layout design 100 or integrated circuit 200, 300A-300D, 500, 700, 900, 1100, 1300, 1500, 1700 or 1900A-1900F. In some embodiments, the VG level is between the POLY level and the M0 level. In some embodiments, the VG level is between the second layout level and the fourth layout level. Other layout levels are within the scope of the present disclosure.

In some embodiments, the set of vias 112 is located where the set of gate patterns 104 is overlapped by the set of conductive feature patterns 120. In some embodiments, the set of via patterns 112 is between the set of gate patterns 104 and the set of conductive feature patterns 120. In some embodiments, the size of one or more via patterns in the set of vias patterns 112 can be increased thereby reducing resistance compared to other approaches.

Other configurations, arrangements on other layout levels or quantities of patterns in at least set of via patterns 112 are within the scope of the present disclosure.

Layout design 100 further includes one or more conductive feature patterns 130a, 130b, 130c, 130d or 130e (collectively referred to as a "set of conductive feature patterns 130") extending in at least the first direction X or the second direction Y.

In some embodiments, one or more conductive feature patterns of the set of conductive feature patterns 130 extends in the first direction X and the second direction Y. In some embodiments, one or more conductive feature patterns of the set of conductive feature patterns 130 is referred to as a two dimensional (2D) layout pattern.

In some embodiments, one or more conductive feature patterns of the set of conductive feature patterns 130 has an L-shape. For example, conductive feature pattern 130c has an L-shape that is also referred to as "a hatchet shape."

In some embodiments, one or more conductive feature patterns of the set of conductive feature patterns 130 has a T-shape. For example, conductive feature pattern 130d has a T-shape or an inverted T-shape that is also referred to as "a cross shape."

Other shapes in the set of conductive feature patterns 130 are within the scope of the present disclosure.

Conductive feature pattern 130c includes a conductive feature pattern 130c1 and a conductive feature pattern 130c2. Conductive feature pattern 130c1 extends in the second direction Y. Conductive feature pattern 130c2 extends in the first direction X. In some embodiments, conductive feature patterns 130c1 and 130c2 are portions of a same continuous pattern (e.g., conductive feature pattern 130c).

Conductive feature layout pattern 130d includes a conductive feature pattern 130d1, a conductive feature pattern 130d2 and a conductive feature pattern 130d3. Conductive feature pattern 130d1 extends in the second direction Y. Conductive feature patterns 130d2 and 130d3 extend in the first direction X. In some embodiments, conductive feature patterns 130d1, 130d2 and 130d3 are portions of a same continuous pattern (e.g., conductive feature pattern 130d).

Other numbers of conductive feature patterns in the set of conductive feature patterns 130 that extend in the first direction X and the second direction Y are within the scope of the present disclosure.

Conductive feature pattern 130c1 has a width W1a in the first direction X.

Conductive feature pattern 130c2 has a length L1a in the first direction X.

Length L1a is an extension length of conductive feature layout pattern 130c2 between a side of conductive feature layout pattern 130c2 to a side of via pattern 112c.

Length L2a1 is a length of a first end of conductive feature pattern 130c1 to a first end of conductive feature pattern 130c2 in the second direction Y. Length L2a2 is a length of a second end of conductive feature pattern 130c1 to a second end of conductive feature pattern 130c2 in the second direction Y.

Conductive feature pattern 130c1 has a stitch length L2a in the second direction Y. In some embodiments, the stitch length L2a is equal to a sum of a length L2a1 and a length L2a2. In some embodiments, the stitch length L2a is equal to a difference between a length (not labelled) of conductive feature pattern 130c1 and a width W2a of conductive feature pattern 120c.

Conductive feature pattern 130d1 has the width W1a in the first direction X.

Conductive feature patterns 130d2 and 130d3 have a length L3a in the first direction X.

Length L3a is an extension length of conductive feature layout patterns 130d2 and 130d3.

Length L4a1 is a length of a first end of conductive feature pattern 130d1 to a first end of conductive feature pattern 130d2 or 130d3 in the second direction Y. Length L4a2 is a length of a second end of conductive feature pattern 130d1 to a second end of conductive feature pattern 130d2 or 130d3 in the second direction Y.

Conductive feature pattern 130d1 has a stitch length L4a in the second direction Y. In some embodiments, the stitch length L4a is equal to a sum of a length L4a1 and a length L4a2. In some embodiments, the stitch length L4a is equal to a difference between a length (not labelled) of conductive feature pattern 130d1 and the width W2a of conductive feature pattern 120c.

In some embodiments, at least one of the stitch length L2a or L4a is greater than or equal to the width W1a. Other ranges or values for the stitch length L2a or L4a are within the scope of the present disclosure.

In some embodiments, at least one of the length L1a or L3a is greater than or equal to a first range. In some embodiments, the first range is one half poly pitch (e.g., 0.5*P1a). Other ranges or values for length L1a or L3a are within the scope of the present disclosure.

In some embodiments, if at least one of the length L1a or L3a is greater than or equal to the first range, then the amount of overlap by one or more conductive feature patterns in the set of conductive feature patterns 130 over one or more via patterns in the set of via patterns 132 or conductive feature patterns in the set of conductive feature patterns 120 is sufficient to thereby increase the via landing spot and reduce resistance from the one or more vias in the set of vias 232 or conductors in the set of conductors 220 that are manufactured by the corresponding set of via patterns 132 or set of conductive feature patterns 120 compared to other approaches.

In some embodiments, if at least one of the length L1a or L3a is less than the first range, then the amount of overlap by one or more conductive feature patterns in the set of conductive feature patterns 130 over one or more via patterns in the set of via patterns 132 or conductive feature patterns in the set of conductive feature patterns 120 is insufficient, and thereby causes a decrease in the via landing spot and an increase in resistance from the one or more vias in the set of vias 232 or conductors in the set of conductors 220 that are manufactured by the corresponding set of via patterns 132 or set of conductive feature patterns 120 compared to other approaches.

Each of conductive feature patterns 130a, 130b, 130c, 130d or 130e of the set of conductive feature patterns 130 are separated from each other in at least the first direction X by at least a distance D1a. For example, as shown in FIG. 1C, conductive feature pattern 130c is separated from conductive feature pattern 130d in at least the first direction X by distance D1a.

In some embodiments, the distance D1a is greater than or equal to a second range. In some embodiments, the second range is one quarter poly pitch (e.g., 0.25*P1a). Other ranges or values for distance D1a are within the scope of the present disclosure.

In some embodiments, if the distance D1a is greater than or equal to the second range, then the distance D1a is sufficient to create enough separation between conductive feature patterns in the set of conductive feature patterns 130 thereby increasing the manufacturing yield of the set of conductors 230 manufactured by the set of conductive feature patterns 130 compared to other approaches. In some embodiments, if the distance D1a is less than the second range, then the distance D1a is not sufficient to create enough separation between conductive feature patterns in the set of conductive feature patterns 130 thereby decreasing the manufacturing yield of the set of conductors 230 manufactured by the set of conductive feature patterns 130 compared to other approaches.

In some embodiments, while each of conductive feature patterns 130a, 130b, 130c, 130d or 130e is shown as continuous patterns, one or more of conductive feature patterns 130a, 130b, 130c, 130d or 130e is separated to form discontinuous patterns.

The set of conductive feature patterns 130 is usable to manufacture a corresponding set of conductors 220 of integrated circuit 200, 300A-300D, 500, 700, 900, 1100, 1300, 1500, 1700 or 1900A-1900F. In some embodiments, conductive feature pattern 130a, 130b, 130c, 130d or 130e is usable to manufacture corresponding conductor 230a, 230b, 230c, 230d or 230e of the set of conductors 220 of integrated circuit 200, 300A-300D, 500, 700, 900, 1100, 1300, 1500, 1700 or 1900A-1900F. In some embodiments, conductive feature pattern 130c1, 130c2, 130d1, 130d2 or 130d3 is usable to manufacture corresponding conductor 230c1, 230c2, 230d1, 230d2 or 230d3 of the set of conductors 220 of integrated circuit 200, 300A-300D, 500, 700, 900, 1100, 1300, 1500, 1700 or 1900A-1900F. In some embodiments, the set of conductors 220 are located on the front-side (not labelled) of integrated circuit 200.

In some embodiments, conductive feature pattern 130a, 130b, 130c, 130d or 130e are referred to as "pin patterns." In some embodiments, conductors 230a, 230b, 230c, 230d or 230e are referred to as "pins."

The set of conductive feature patterns 130 overlap the set of active region patterns 102, the set of contact patterns 106, the set of conductive feature patterns 120 and the set of via patterns 132.

Conductive feature pattern 130c overlaps one or more of the set of active region patterns 102, the set of contact patterns 106, the set of conductive feature patterns 120, the set of via patterns 132 or at least one gate pattern 104d of the set of gate patterns 104.

In some embodiments, conductive feature pattern 130d overlaps one or more of the set of active region patterns 102, the set of contact patterns 106, the set of conductive feature patterns 120, the set of via patterns 132 or at least one gate pattern of the set of gate patterns 104.

In some embodiments, the set of conductive feature patterns 130 is on a fifth layout level. In some embodiments, the fifth layout level is different from the first layout level, the second layout level, the third layout level and the fourth layout level. In some embodiments, the fifth layout level corresponds to the M1 level of one or more of layout design 100, or integrated circuit 200, 300A-300D, 500, 700, 900, 1100, 1300, 1500, 1700 or 1900A-1900F. In some embodiments, the M1 level is above the OD level, the POLY level, the MD level, the VG level, the VD level, the M0 level and the V0 level. In some embodiments, the set of conductive feature patterns 130 are located on other metal layers (e.g., M0, metal-2 (M2), metal-3 (M3), etc.).

In some embodiments, the set of conductive feature patterns 130 corresponds to 5 M1 routing tracks in layout design 100. Other numbers of M1 routing tracks are within the scope of the present disclosure.

Other configurations, arrangements on other layout levels or quantities of patterns in the set of conductive feature patterns 130 are within the scope of the present disclosure.

Layout design 100 further includes one or more via patterns 132a or 132b (collectively referred to as a "set of via patterns 132").

The set of via patterns 132 is usable to manufacture a corresponding set of vias 232 of integrated circuit 200, 300A-300D, 500, 700, 900, 1100, 1300, 1500, 1700 or 1900A-1900F. In some embodiments, via patterns 132a or 132b of the set of via patterns 132 are usable to manufacture corresponding vias 232a or 232b of the set of vias 232 of integrated circuit 200, 300A-300D, 500, 700, 900, 1100, 1300, 1500, 1700 or 1900A-1900F.

The set of via patterns 132 is positioned at a via 0 (V0) level of one or more of layout design 100 or integrated circuit 200, 300A-300D, 500, 700, 900, 1100, 1300, 1500, 1700 or 1900A-1900F. In some embodiments, the V0 level is between the M0 level and the M1 level. In some embodiments, the V0 level is between the fourth layout level and the fifth layout level. Other layout levels are within the scope of the present disclosure.

In some embodiments, the set of vias 132 is located where the set of conductive feature patterns 120 is overlapped by the set of conductive feature patterns 130. In some embodiments, the set of via patterns 132 is between the set of conductive feature patterns 120 and the set of conductive feature patterns 130. In some embodiments, the size of one or more via patterns in the set of via patterns 132 can be increased thereby reducing resistance compared to other approaches.

Other configurations, arrangements on other layout levels or quantities of patterns in at least set of via patterns 132 are within the scope of the present disclosure.

In some embodiments, by extending the set of conductive feature patterns 130 in the first direction X and the second direction Y (e.g., 2 directions) and by positioning the set of conductive feature patterns 130 to overlap at least one of the set of via patterns 132, the set of conductive feature patterns 120, the set of contact patterns 106, the set of gate patterns 104 or the set of active region patterns 102, the set of conductive feature patterns 130 provide additional routing resources in the first direction X or the second direction Y in layout design 100. In some embodiments, by providing additional routing resources in layout design 100 results in layout design 100 having at least a smaller area or a smaller standard cell more routing flexibility, reduced power or improved performance compared to other approaches.

In some embodiments, by extending the set of conductive feature patterns 130 in the first direction X and the second direction Y (e.g., 2 directions) and by positioning the set of conductive feature patterns 130 to overlap at least one of the set of via patterns 132, the set of conductive feature patterns 120, the set of contact patterns 106, the set of gate patterns 104 or the set of active region patterns 102, layout design 100 has a more flexible design where layout design 100 can be flipped in the first direction X or the second direction Y compared to other approaches where the layout design cannot be flipped in the first direction X or the second direction Y since one or more conductive feature patterns in the fourth layout level protrude from the cell boundary 101c or 101d.

Other configurations, arrangements on other layout levels or quantities of elements in layout design 100 are within the scope of the present disclosure.

FIGS. 2A-2E are diagrams of an integrated circuit 200, in accordance with some embodiments.

Figure 2A:
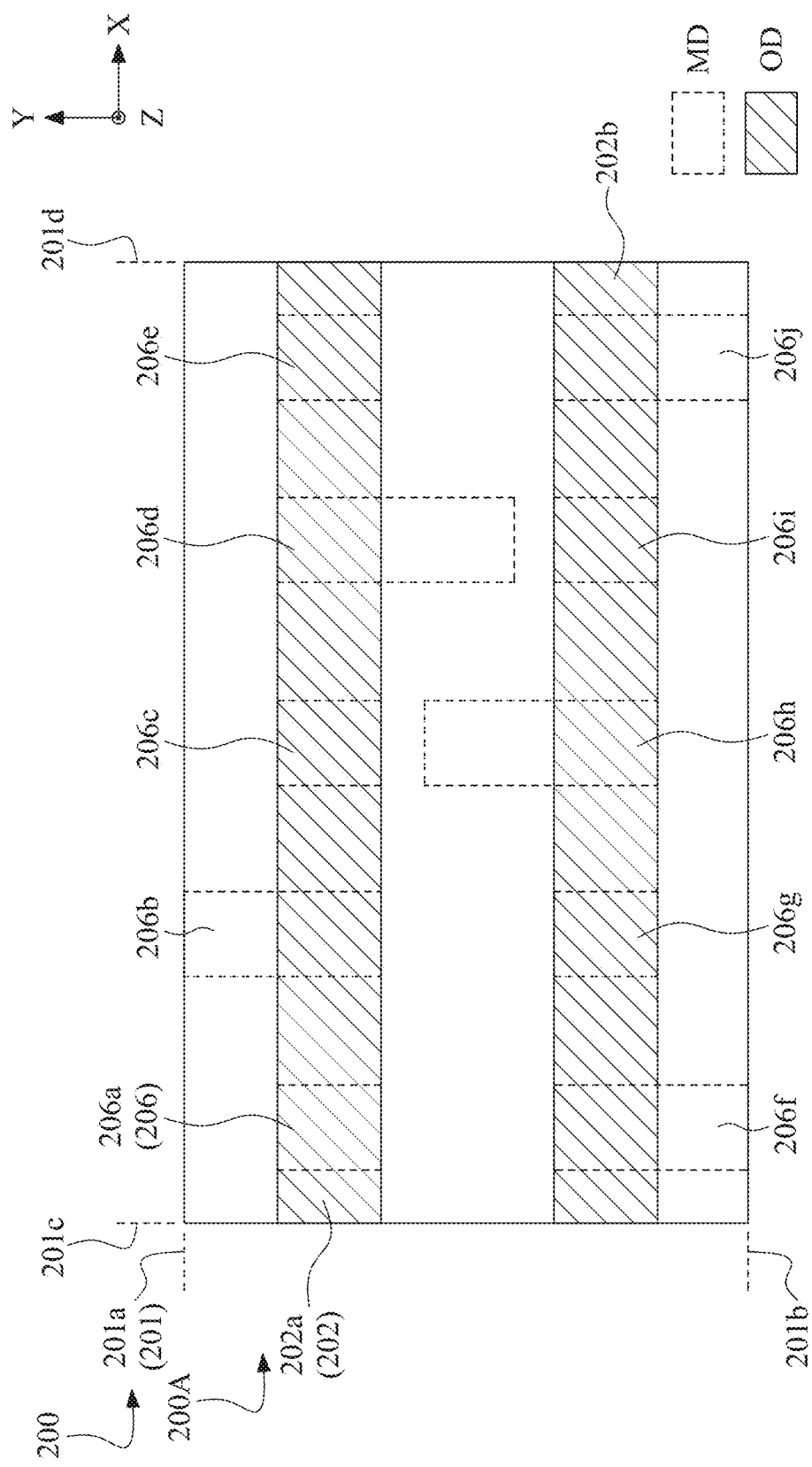
FIGS. 2A-2E are diagrams of an integrated circuit, in accordance with some embodiments.

FIG. 2A is a top view of a corresponding portion 200A of integrated circuit 200, in accordance with some embodiments.

Figure 2B:
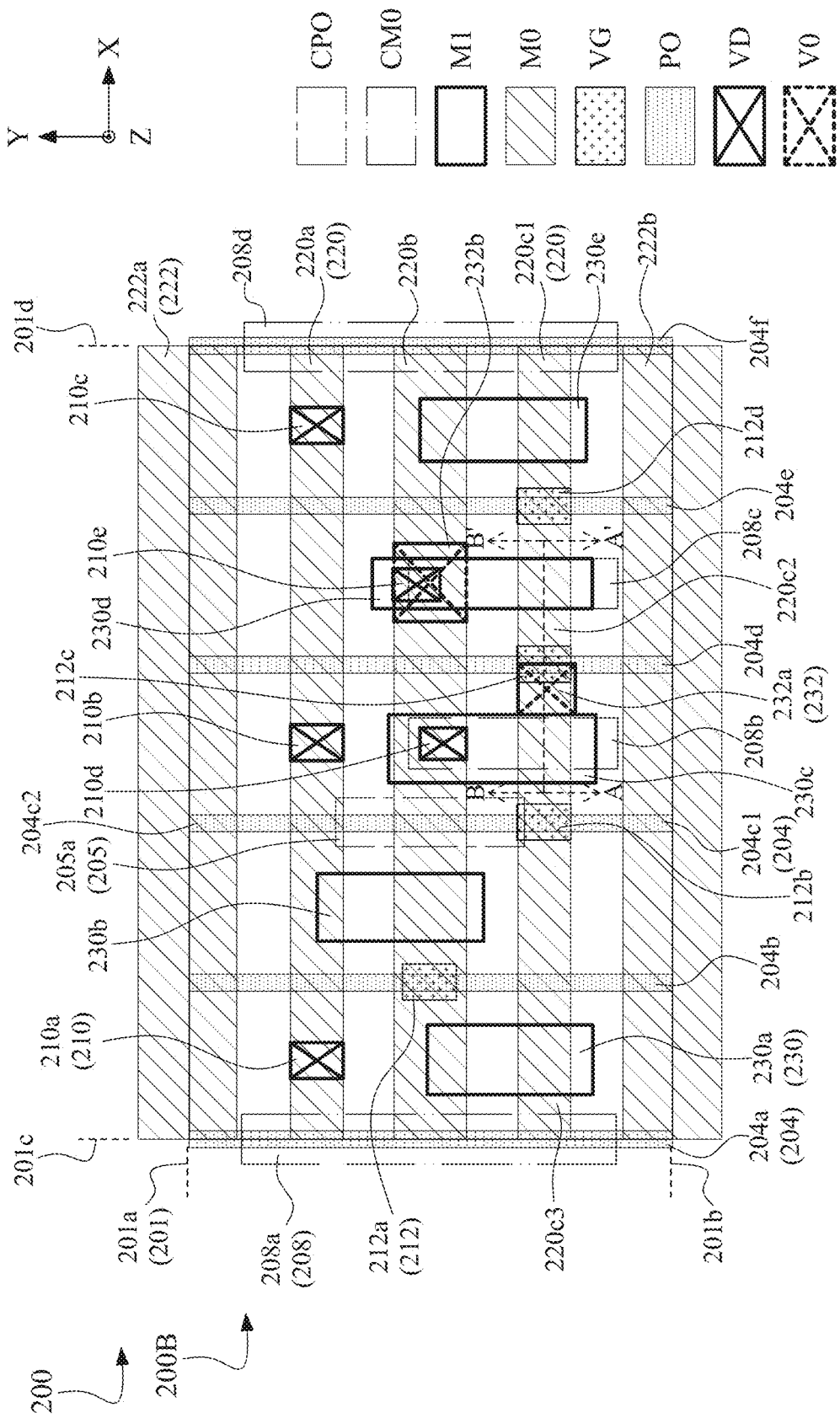

FIG. 2B is a top view of a corresponding portion 200B of integrated circuit 200, in accordance with some embodiments.

Figure 2C:
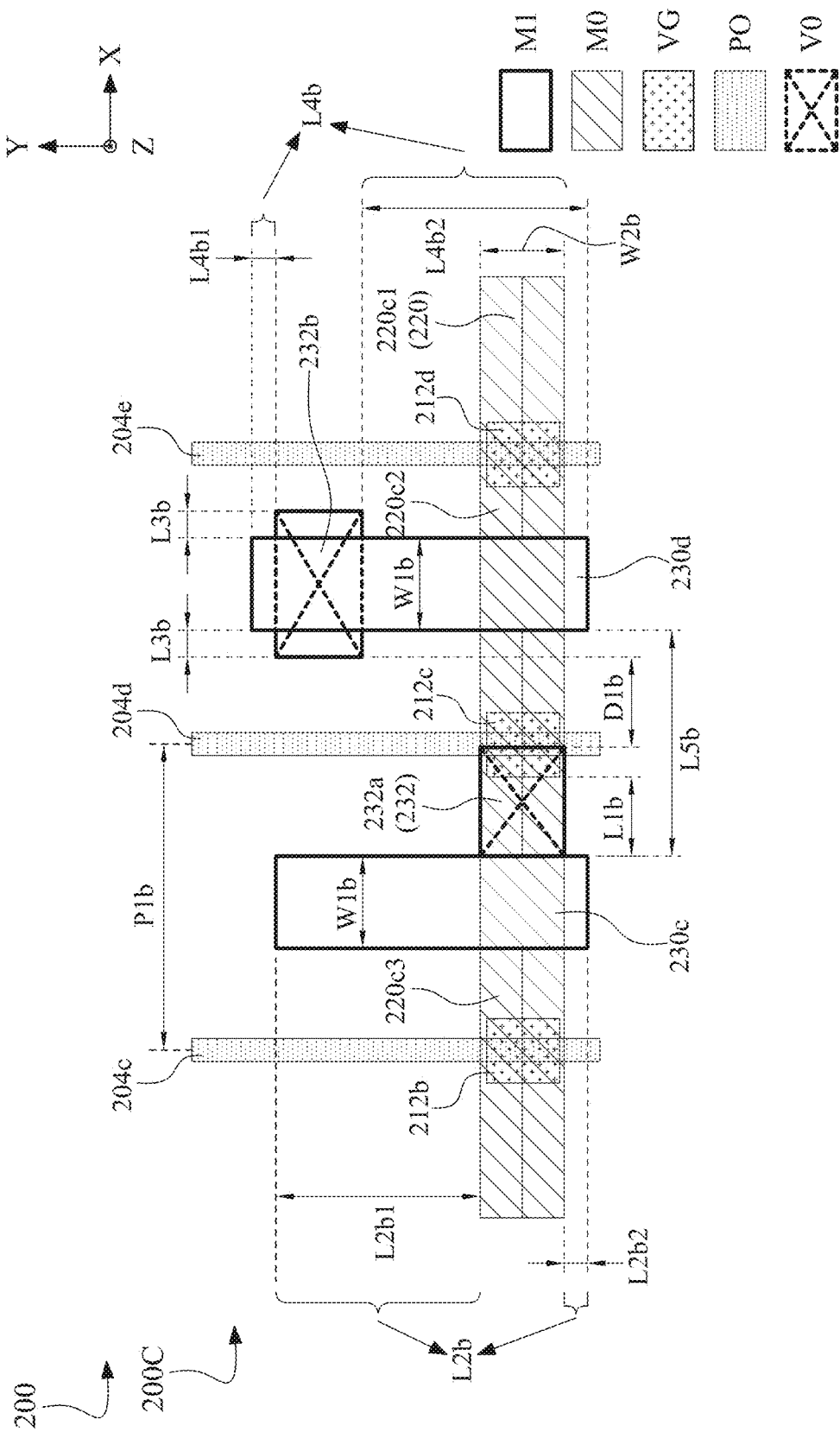

FIG. 2C is a top view of a corresponding portion 200C of integrated circuit 200, simplified for ease of illustration.

Figure 2D:
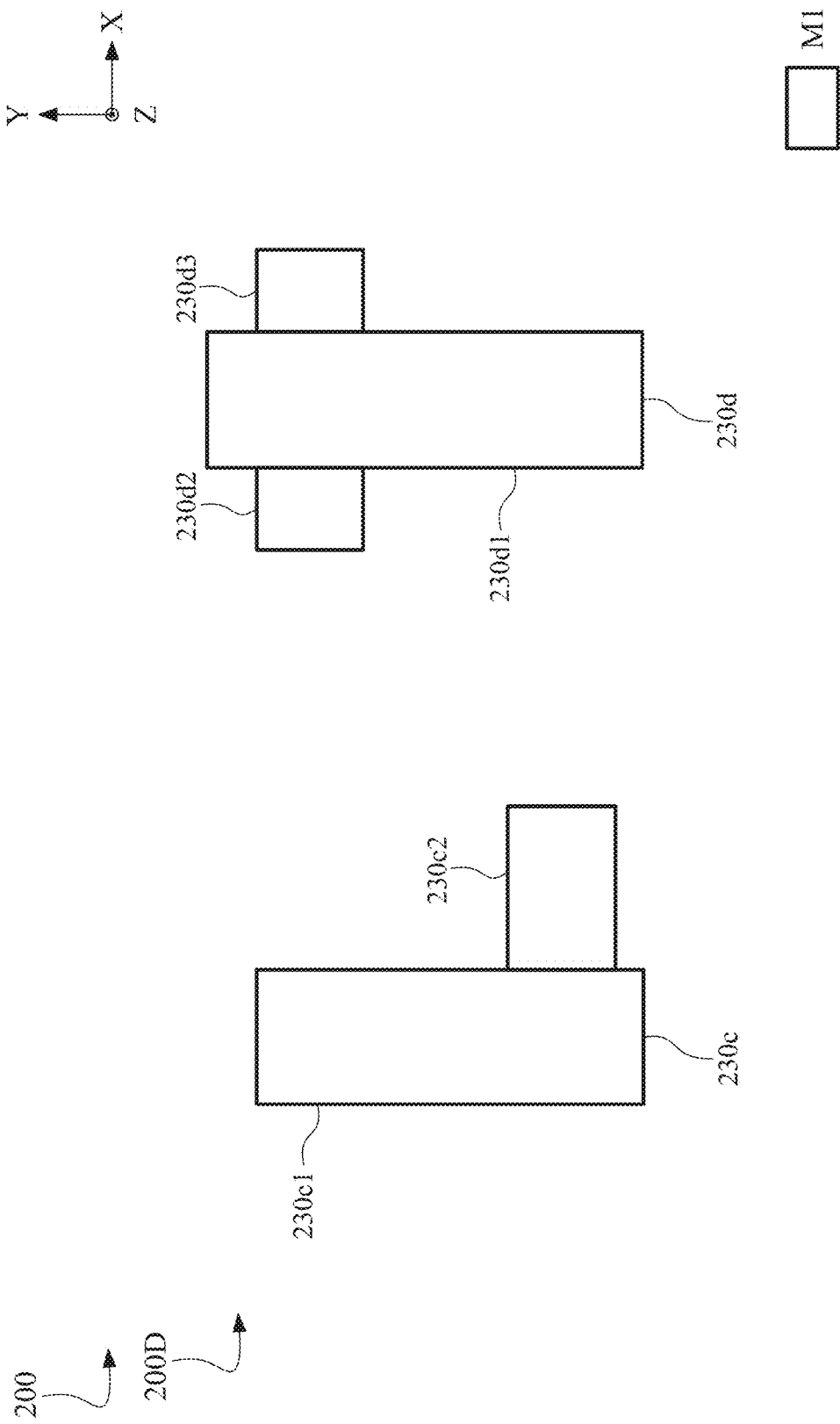

FIG. 2D is a top view of a corresponding portion 200D of integrated circuit 200, simplified for ease of illustration.

Figure 2E:
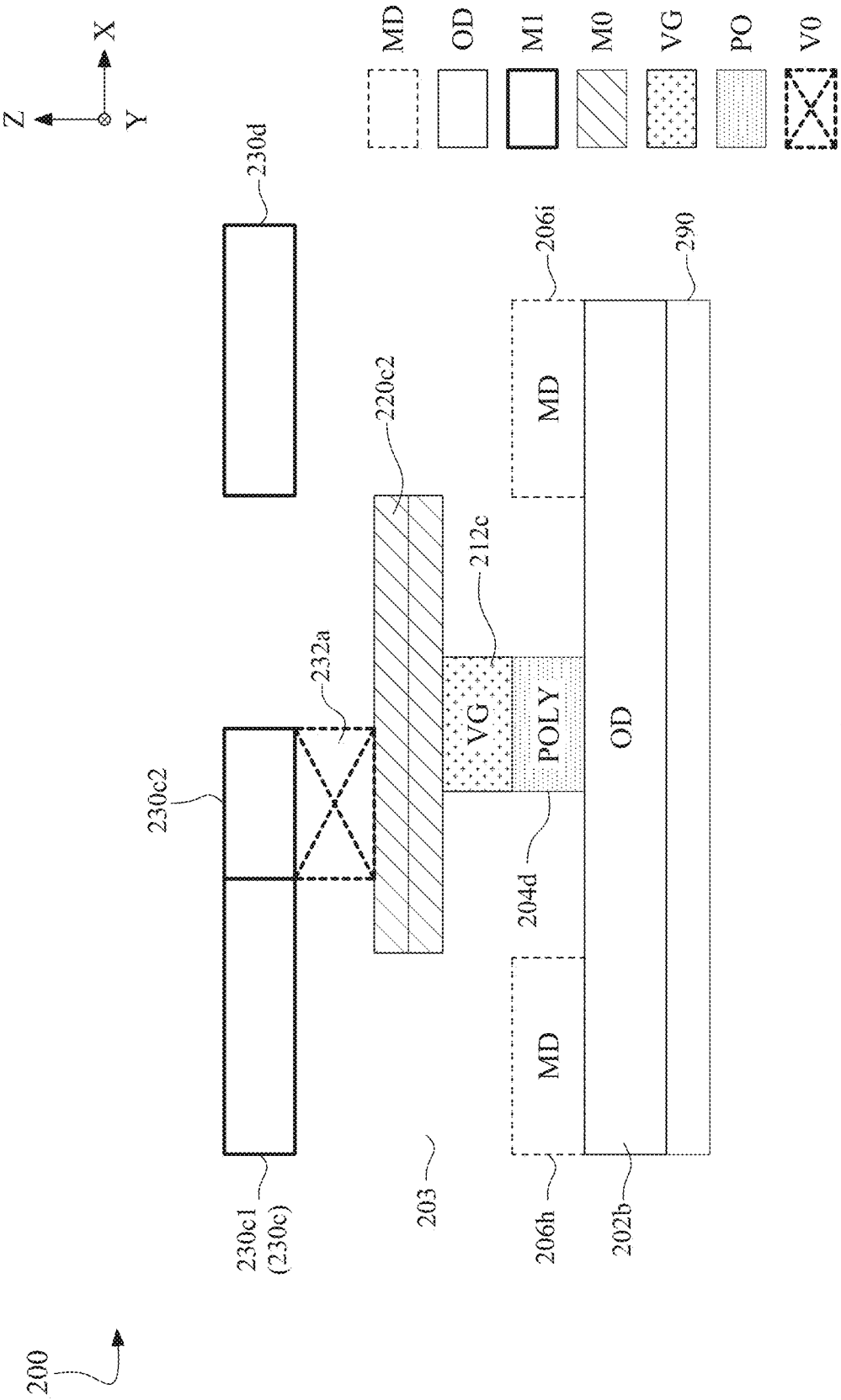

FIG. 2E is a cross-sectional view of integrated circuit 200 as intersected by plane A-A', in accordance with some embodiments.

In some embodiments, portions 200A, 200B, 200C or 200D include the same features or layers of corresponding portion 100A, 100B, 100C, or 100D, and detailed description thereof is thus omitted.

Components that are the same or similar to those in one or more of FIGS. 1A-1B, 2A-2E and 3A-19F (shown below) are given the same reference numbers, and detailed description thereof is thus omitted.

Integrated circuit 200 is manufactured by layout design 100. Structural relationships including alignment, lengths and widths, as well as configurations and layers of integrated circuit 200 are similar to the structural relationships and configurations and layers of layout design 100 of FIGS. 1A-1D, and similar detailed description will not be described in at least FIGS. 2A-2E, for brevity. For example, in some embodiments, at least pitch P1a or distance D1a of layout design 100 are similar to corresponding pitch P1b or distance D1b of corresponding integrated circuit 200, and similar detailed description is omitted for brevity.

For example, in some embodiments, at least one or more widths W1a or W2a or lengths L1a, L2a, L2a1, L2a2, L3a, L4a, L4a1, L4a2 or L5a of layout design 100 are similar to corresponding widths W1b or W2b or lengths L1b, L2b, L2b1, L2b2, L3b, L4b, L4b1, L4b2 or L5b of corresponding integrated circuit 200, and similar detailed description is omitted for brevity.

For example, in some embodiments, at least cell boundaries 101a, 101b, 101c or 101d or a mid-point (not labelled) of layout design 100 is similar to at least corresponding cell boundaries 201a, 201b, 201c or 201d or a mid-point (not labelled) of corresponding integrated circuit 200, and similar detailed description is omitted for brevity.

Integrated circuit 200 includes at least the set of active regions 202, an insulating region 203, the set of gates 204, the set of contacts 206, the set of vias 210, the set of vias 212, the set of conductors 220, the set of conductors 222, the set of conductors 230, the set of vias 232 and a substrate 290.

The set of active regions 202 includes one or more of active regions 202a or 202b embedded in a substrate 290. Substrate has a front-side (not labelled) and a back-side (not labelled) opposite from the front-side. In some embodiments, at least the set of active regions 202, the set of gates 204, the set of contacts 206, the set of vias 210, the set of vias 212, the set of conductors 220, the set of conductors 222, the set of conductors 230 and the set of vias 232 are formed in the front-side of substrate 290.

In some embodiments, the set of active regions 202 corresponds to nanosheet structures (not labelled) of nanosheet transistors. In some embodiments, the set of active regions 202 include drain regions and source regions grown by an epitaxial growth process. In some embodiments, the set of active regions 202 include drain regions and source regions that are grown with an epitaxial material at the corresponding drain regions and source regions.

Other transistor types are within the scope of the present disclosure. For example, in some embodiments, the set of active regions 202 corresponds to nanowire structures (not shown) of nanowire transistors. In some embodiments, the set of active regions 202 corresponds to planar structures (not shown) of planar transistors. In some embodiments, the set of active regions 202 corresponds to fin structures (not shown) of finFETs. In some embodiments, the set of active regions 202 corresponds to structures (not shown) of complementary FETs (CFETs).

In some embodiments, active region 202a corresponds to source and drain regions of NMOS transistors of integrated circuit 200, 300A-300D, 500, 700, 900, 1100, 1300, 1500, 1700 or 1900A-1900F, and active region 202b corresponds to source and drain regions of PMOS transistors of integrated circuit 200, 300A-300D, 500, 700, 900, 1100, 1300, 1500, 1700 or 1900A-1900F.

In some embodiments, active region 202a corresponds to source and drain regions of PMOS transistors of integrated circuit 200, 300A-300D, 500, 700, 900, 1100, 1300, 1500, 1700 or 1900A-1900F, and active region 202b corresponds to source and drain regions of NMOS transistors of integrated circuit 200, 300A-300D, 500, 700, 900, 1100, 1300, 1500, 1700 or 1900A-1900F.

In some embodiments, at least active region 202a is an N-type doped S/D region, and active region 202b is a P-type doped S/D region embedded in a dielectric material of substrate 290. In some embodiments, at least active region 202a is a P-type doped S/D region, and active region 202b is an N-type doped S/D region embedded in a dielectric material of substrate 290.

Other configurations, arrangements on other layout levels or quantities of structures in the set of active regions 202 are within the scope of the present disclosure.

Figure 18A:
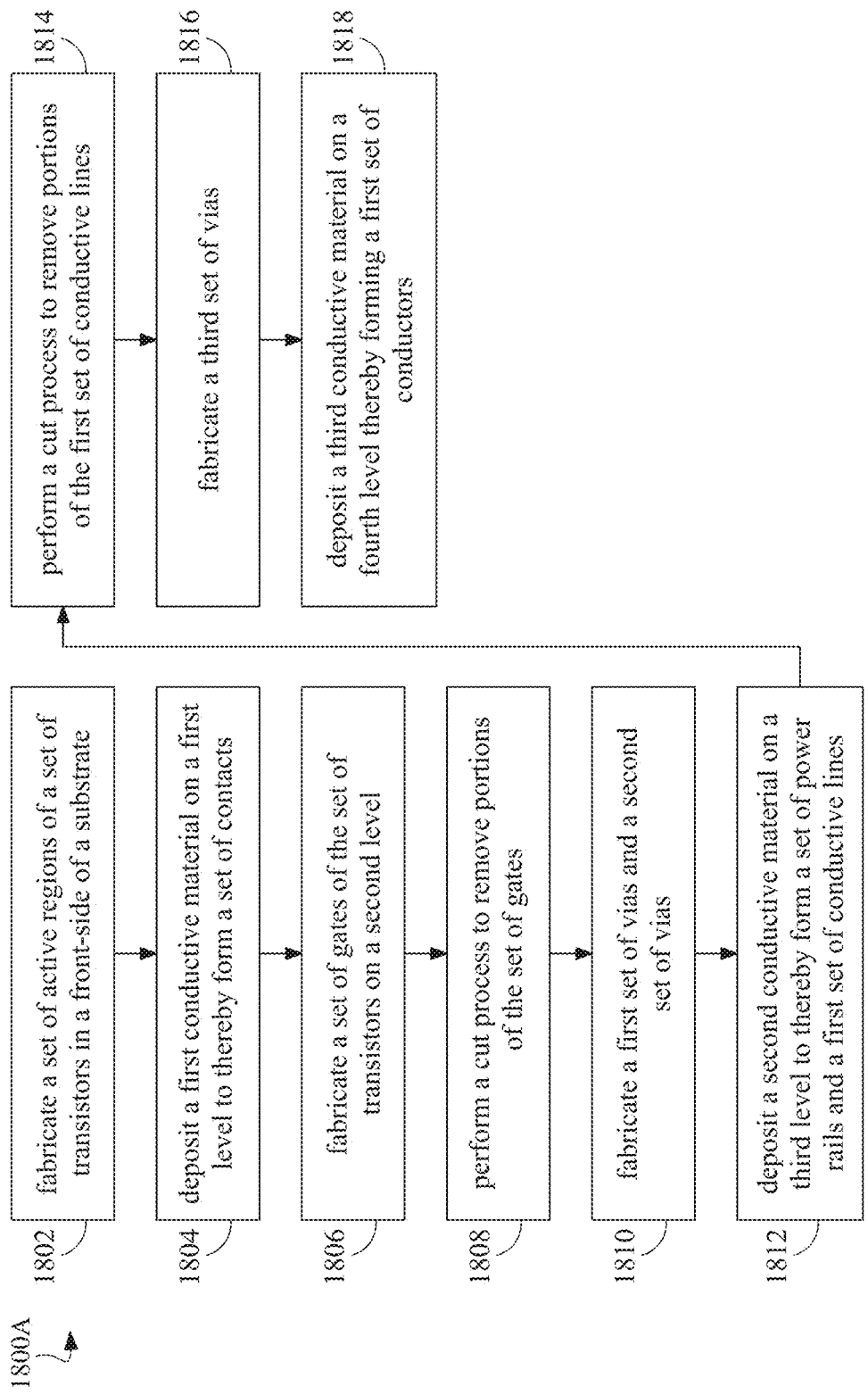
FIG. 18A is a flow chart of a method of forming or manufacturing an integrated circuit in accordance with some embodiments.

Insulating region 203 is configured to electrically isolate one or more elements of the set of active regions 202, the set of gates 204, the set of contacts 206, the set of vias 210, the set of vias 212, the set of conductors 220, the set of conductors 222, the set of conductors 230 and the set of vias 232 from one another. In some embodiments, insulating region 203 includes multiple insulating regions deposited at different times from each other during method 1800A (FIG. 18A). In some embodiments, insulating region is a dielectric material. In some embodiments, the dielectric material includes silicon dioxide, silicon oxy-nitride, or the like.

Other configurations, arrangements on other layout levels or other numbers of portions in insulating region 203 are within the scope of the present disclosure.

The set of gates 204 includes one or more of gates 204a, . . . , 204e or 204f.

In some embodiments, one or more gates of the set of gates 204 are divided into two or more discontinuous gate portions, and includes a removed gate portion. In some embodiments, the removed gate portion is removed during operation 2006 of FIG. 20 (described below).

In some embodiments, at least a portion of gate 204a, . . . , 204e or 204f is a gate of NMOS transistors of integrated circuits 200, 300A-300D, 500, 700, 900, 1100, 1300, 1500, 1700 and 1900A-1900F, and at least a portion of gate 204a, . . . , 204e or 204f is a gate of PMOS transistors of integrated circuits 200, 300A-300D, 500, 700, 900, 1100, 1300, 1500, 1700 and 1900A-1900F.

In some embodiments, at least gate 204a, . . . , 204e or 204f corresponds to a dummy gate. In some embodiments, a dummy gate is a gate of a non-functional transistor.

Other configurations, arrangements on other layout levels or quantities of gates in the set of gates 204 are within the scope of the present disclosure.

The set of contacts 206 includes one or more of contact 206a, . . . , 206i or 206j. The set of contacts 206 are located on the front-side of integrated circuit 200. The set of contacts 206 overlap the set of active regions 202.

Each contact of the set of contacts 206 corresponds to one or more drain or source terminals of PMOS or NMOS transistors of integrated circuit 200.

In some embodiments, one or more of contact 206a, . . . , 206e is a source/drain terminal of NMOS transistors of integrated circuits 200, 300A-300D, 500, 700, 900, 1100, 1300, 1500, 1700 and 1900A-1900F, and one or more of contact 206f, . . . , 206j is a source/drain terminal of PMOS transistors of integrated circuits 200, 300A-300D, 500, 700, 900, 1100, 1300, 1500, 1700 and 1900A-1900F.

In some embodiments, one or more of contact 206a, . . . , 206e is a source/drain terminal of PMOS transistors of integrated circuits 200, 300A-300D, 500, 700, 900, 1100, 1300, 1500, 1700 and 1900A-1900F, and one or more of contact 206f, . . . , 206j is a source/drain terminal of NMOS transistors of integrated circuits 200, 300A-300D, 500, 700, 900, 1100, 1300, 1500, 1700 and 1900A-1900F.

In some embodiments, one or more contacts of the set of contacts 206 overlaps a pair of active regions of the set of active regions 202, thereby electrically coupling the pair of active regions of the set of active regions 202 and the source or drain of the corresponding transistors.

Other lengths or widths for the set of contacts 206 are within the scope of the present disclosure. Other configurations, arrangements on other layout levels or quantities of conductors in the set of contacts 206 are within the scope of the present disclosure.

The set of vias 210 includes one or more of vias 210a, 210b, . . . , 210d or 210e. In some embodiments, the set of vias 210 are between the set of contacts 206 and a set of conductors 220. The set of vias 210 is embedded in insulating region 203.

The set of vias 210 is located where the set of contacts 206 are overlapped by the set of conductors 220. The set of vias 210 is configured to electrically couple the set of contacts 206 and the set of conductors 220 together.

In some embodiments, vias in the set of vias 210 that are positioned below adjacent M0 routing tracks are separated from each other by pitch P1b.

The set of vias 210 is configured to electrically couple the set of active regions 202 and the set of conductors 220 together by the set of contacts 206. In some embodiments, the set of vias 210 are configured to electrically couple a corresponding source or drain region of the set of active regions 202 to the set of conductors 220.

Other configurations, arrangements on other layout levels or quantities of vias in the set of vias 210 are within the scope of the present disclosure.

The set of vias 212 includes one or more of vias 212a, 212b, 212c or 212d. In some embodiments, the set of vias 212 are between the set of gates 204 and the set of conductors 220. The set of vias 212 is embedded in insulating region 203.

The set of vias 212 is located where the set of gates 204 are overlapped by the set of conductors 220. Via 212a is located where gate 204b is overlapped by conductor 220b. Via 212b, 212c or 212d is located where corresponding gate 204c, 204d or 204e is overlapped by conductor 220c.

The set of vias 212 is configured to electrically couple the set of gates 204 and the set of conductors 220 together. Via 212a is configured to electrically couple gate 204b and conductor 220b together. At least via 212b, 212c or 212d is configured to electrically couple corresponding gate 204c, 204d or 204e and conductor 220c together.

Other configurations, arrangements on other layout levels or quantities of vias in the set of vias 212 are within the scope of the present disclosure.

The set of conductors 220 includes one or more of conductors 220a, 220b or 220c. In some embodiments, the set of conductors 220 corresponds to a set of conductive structures. The set of conductors 220 is embedded in insulating region 203.

The set of conductors 220 overlap the set of contacts 206 and the set of gates 204. Conductor 220a overlaps active region 202a. Conductor 220c overlaps active region 202b.

Conductor 220c includes conductors 220c1, 220c2 and 220c3. Conductor 220c1 is separated from conductor 220c2 by a removed conductor portion 208c. Conductor 220c3 is separated from conductor 220c2 by a removed conductor portion 208b. In some embodiments, conductor 220c2 has a width in the first direction X equal to pitch P1b minus the cut width of cut feature pattern 108b or 108c (e.g., P1b–Wcut). In some embodiments, the removed conductor portion 208c or 208d is removed during operation 2006 of FIG. 20 (described below).

In some embodiments, the set of conductors 220 corresponds to 3 M0 routing tracks in integrated circuit 200. Other numbers of M0 routing tracks are within the scope of the present disclosure.

In some embodiments, the set of conductors 220 is configured to electrically couple the set of gates 204 and the set of contacts 206 together. In some embodiments, the set of conductors 220 is configured to provide the routing of signals, and are referred to as "signal lines."

Other configurations, arrangements on other layout levels or quantities of conductors in the set of conductors 220 are within the scope of the present disclosure.

The set of conductors 222 includes one or more of conductors 222a or 222b. In some embodiments, the set of conductors 222 corresponds to a set of conductive structures. The set of conductors 222 is embedded in insulating region 203.

The set of conductors 222 overlap the cell boundaries 201a and 201b.

In some embodiments, at least conductor 222a or 222b of the set of conductors 222 is configured to provide power to the set of active regions 202 or the set of gates 204, and thus conductors 222a or 222b are referred to as "power rails."

In some embodiments, the set of conductors 222 is configured to provide a first supply voltage of a voltage supply VDD or a second supply voltage of a reference voltage supply VSS to the integrated circuit, such as integrated circuit 200. In some embodiments, the first supply voltage is different from the second supply voltage.

In some embodiments, conductor 222a is configured to provide the first supply voltage of voltage supply VDD to the sources/drains of active region 202a, and conductor 222b is configured to provide the second supply voltage of reference voltage supply VSS to the sources/drains of active region 202b.

In some embodiments, conductor 222b is configured to provide the first supply voltage of voltage supply VDD to the sources/drains of active region 202b, and conductor 222a is configured to provide the second supply voltage of reference voltage supply VSS to the sources/drains of active region 202a.

Other configurations, arrangements on other layout levels or quantities of conductors in the set of conductors 222 are within the scope of the present disclosure.

Integrated circuit 200 further includes one or more of conductors 230a, 230b, 230c, 230d or 230e.

In some embodiments, one or more conductors of the set of conductors 230 extends in the first direction X and the second direction Y. In some embodiments, one or more conductors of the set of conductors 230 is referred to as a 2D structures.

In some embodiments, one or more conductors of the set of conductors 230 has an L-shape. For example, conductor 230c has an L-shape that is also referred to as "a hatchet shape."

In some embodiments, one or more conductors of the set of conductors 230 has a T-shape. For example, conductor 230d has a T-shape or an inverted T-shape that is also referred to as "a cross shape."

Other shapes in the set of conductors 230 are within the scope of the present disclosure.

Conductor 230c includes a conductor 230c1 and a conductor 230c2. Conductor 230c1 extends in the second direction Y. Conductor 230c2 extends in the first direction X. In some embodiments, conductors 230c1 and 230c2 are portions of a same continuous structure (e.g., conductor 230c).

Conductor 230d includes a conductor 230d1, a conductor 230d2 and a conductor 230d3. Conductor 230d1 extends in the second direction Y. Conductors 230d2 and 230d3 extend in the first direction X. In some embodiments, conductors 230d1, 230d2 and 230d3 are portions of a same continuous structure (e.g., conductor 230d).

Other numbers of conductors in the set of conductors 230 that extend in the first direction X and the second direction Y are within the scope of the present disclosure.

Conductor 230c is electrically coupled to conductor 220c2 by via 232a. Conductor 220c is electrically coupled to gate 204d by via 212c. Thus, conductor 230c is electrically coupled to gate 204d.

Conductor 230d is electrically coupled to conductor 220b by via 232b. Conductor 220b is electrically coupled to gate 204b by via 212a, to contact 206h by via 210d and to contact 206d by via 210e. Thus, conductor 230d is electrically coupled to gate 204b, contact 206h and contact 206d.

Conductor 230c1 has a width W1b in the first direction X.
Conductor 230c2 has a length L1b in the first direction X.
Length L1b is an extension length of conductor 230c2 between a side of conductor 230c2 to a side of via pattern 112c.

Length L2b1 is a length of a first end of conductor 230c1 to a first end of conductor 230c2 in the second direction Y.
Length L2b2 is a length of a second end of conductor 230c1 to a second end of conductor 230c2 in the second direction Y.

Conductor 230c1 has a stitch length L2b in the second direction Y. In some embodiments, the stitch length L2b is equal to a sum of a length L2b1 and a length L2b2. In some embodiments, the stitch length L2b is equal to a difference between a length (not labelled) of conductor 230c1 and a width W2b of conductor 220c.

Conductor 230d1 has the width W1b in the first direction X.

Conductors 230d2 and 230d3 have a length L3b in the first direction X.

Length L3b is an extension length of conductors 230d2 and 230d3.

Length L4b1 is a length of a first end of conductor 230d1 to a first end of conductor 230d2 or 230d3 in the second direction Y. Length L4b2 is a length of a second end of conductor 230d1 to a second end of conductor 230d2 or 230d3 in the second direction Y.

Conductor 230d1 has a stitch length L4b in the second direction Y. In some embodiments, the stitch length L4b is equal to a sum of a length L4b1 and a length L4b2. In some embodiments, the stitch length L4b is equal to a difference between a length (not labelled) of conductor 230d1 and the width W2b of conductor 220c.

In some embodiments, at least one of the stitch length L2b or L4b is greater than or equal to the width W1b. Other ranges or values for the stitch length L2b or L4b are within the scope of the present disclosure.

In some embodiments, at least one of the length L1b or L3b is greater than or equal to a third range. In some embodiments, the third range is one half poly pitch (e.g., 0.5*P1b). Other ranges or values for length L1b or L3b are within the scope of the present disclosure.

In some embodiments, if at least one of the length L1b or L3b is greater than or equal to the third range, then the amount of overlap by one or more conductors in the set of conductors 230 over one or more vias in the set of vias 232 or conductors in the set of conductors 220 is sufficient to thereby increase the via landing spot and reduce resistance from the one or more vias in the set of vias 232 or conductors in the set of conductors 220 compared to other approaches.

In some embodiments, if at least one of the length L1b or L3b is less than the third range, then the amount of overlap by one or more conductors in the set of conductors 230 over one or more vias in the set of vias 232 or conductors in the set of conductors 220 is insufficient, and thereby causes a decrease in the via landing spot and an increase in resistance from the one or more vias in the set of vias 232 or conductors in the set of conductors 220 compared to other approaches.

Each of conductors 230a, 230b, 230c, 230d or 230e of the set of conductors 230 are separated from each other in at least the first direction X by at least a distance D1b. For example, as shown in FIG. 2C, conductor 230c is separated from conductor 230d in at least the first direction X by distance D1b.

In some embodiments, the distance D1b is greater than or equal to a fourth range. In some embodiments, the fourth range is one quarter poly pitch (e.g., 0.25*P1a). Other ranges or values for distance D1b are within the scope of the present disclosure.

In some embodiments, if the distance D1b is greater than or equal to the fourth range, then the distance D1b is sufficient to create enough separation between conductors in the set of conductors 230 thereby increasing the manufacturing yield of the set of conductors 230 compared to other approaches. In some embodiments, if the distance D1b is less than the fourth range, then the distance D1b is not sufficient to create enough separation between conductors in the set of conductors 230 thereby decreasing the manufacturing yield of the set of conductors 230 compared to other approaches.

In some embodiments, while each of conductors 230a, 230b, 230c, 230d or 230e is shown as continuous structures, one or more of conductors 230a, 230b, 230c, 230d or 230e is separated to form discontinuous structures.

In some embodiments, the set of conductors 230 corresponds to 5 M1 routing tracks in integrated circuit 200. Other numbers of M1 routing tracks are within the scope of the present disclosure.

Other configurations, arrangements on other layout levels or quantities of patterns in the set of conductors 230 are within the scope of the present disclosure.

The set of vias 232 includes one or more of vias 232a or 232b.

The set of vias 232 is between the set of conductors 220 and the set of conductors 230. The set of vias 232 is embedded in insulating region 203.

The set of vias 232 is located where the set of conductors 220 is overlapped by the set of conductors 230. Via 232a is located where conductor 220c is overlapped by conductor 230c. Via 232b is located where conductor 220b is overlapped by conductor 230d. Via 232a is located where conductor 220c2 is overlapped by conductor 230c2.

The set of vias 232 is configured to electrically couple the set of conductors 220 and the set of conductors 230 together. Via 232a is configured to electrically couple conductor 220c and conductor 230c together. Via 232b is configured to electrically couple conductor 220b and conductor 230d together.

Other configurations, arrangements on other layout levels or quantities of vias in the set of vias 232 are within the scope of the present disclosure.

In some embodiments, at least one gate region of the set of gates 204 are formed using a doped or non-doped polycrystalline silicon (or polysilicon). In some embodiments, at least one gate region of the set of gates 204 include a metal, such as Al, Cu, W, Ti, Ta, TiN, TaN, NiSi, CoSi, other suitable conductive materials, or combinations thereof.

In some embodiments, at least one conductor of the set of contacts 206, at least one conductor of the set of conductors 220, at least one conductor of the set of conductors 222, at least one conductor of the set of conductors 230, at least one via of the set of vias 210, at least one via of the set of vias 212 or at least one via of the set of vias 232 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

In some embodiments, by extending the set of conductors 230 in the first direction X and the second direction Y (e.g., 2 directions) and by positioning the set of conductors 230 to overlap at least one of the set of vias 232, the set of conductors 220, the set of contacts 206, the set of gates 204 or the set of active regions 202, the set of conductors 230 provide additional routing resources in the first direction X or the second direction Y in integrated circuit 200. In some embodiments, by providing additional routing resources in integrated circuit 200 results in integrated circuit 200 having at least a smaller area or a smaller standard cell, more routing flexibility, reduced power or improved performance compared to other approaches.

In some embodiments, by extending the set of conductors 230 in the first direction X and the second direction Y (e.g., 2 directions) and by positioning the set of conductors 230 to overlap at least one of the set of vias 232, the set of conductors 220, the set of contacts 206, the set of gates 204 or the set of active regions 202, integrated circuit 200 has a more flexible design compared to other approaches.

Other materials, configurations, arrangements on other layout levels or quantities of elements in integrated circuit 200 are within the scope of the present disclosure.

FIGS. 3A-3D are corresponding top views of a corresponding integrated circuit 300A-300D, in accordance with some embodiments.

Integrated circuit 300A-300D is manufactured by a corresponding layout design similar to integrated circuit 300A-300D.

Integrated circuits 300A-300D are variations of integrated circuit 200 (FIG. 2A), and similar detailed description is therefore omitted. In comparison with integrated circuit 200, integrated circuits 300A-300D include a corresponding conductor 306a, 306b, 306c or 306d that extends across two cells, and similar detailed description is therefore omitted.

Integrated circuit 300A includes a cell 302a directly next to or adjacent to a cell 304a.

In comparison with integrated circuit 200, cell 302a and cell 304a are variations of the cell of integrated circuit 200, and similar detailed description is therefore omitted.

Cell 302a and cell 304a includes conductor 306a.

Conductor 306a is a variation of conductor 230c of integrated circuit 200, and similar detailed description is therefore omitted. In comparison with conductor 230c, conductor 306a extends across a cell boundary (not labelled) between cells 302a and 304a.

Conductor 306a includes cross-shaped portions 306a2 and 306a3 positioned on opposite ends of conductor 306a1.

Other materials, configurations, arrangements on other layout levels or quantities of elements in integrated circuit 300A are within the scope of the present disclosure.

Integrated circuit 300B includes a cell 302b directly next to or adjacent to a cell 304b.

In comparison with integrated circuit 200, cell 302b and cell 304b are variations of the cell of integrated circuit 200, and similar detailed description is therefore omitted.

Cell 302b and cell 304b includes conductor 306b.

Conductor 306b is a variation of conductors 230c and 230d of integrated circuit 200, and similar detailed description is therefore omitted. In comparison with conductors 230c and 230d, conductor 306b extends across a cell boundary (not labelled) between cells 302b and 304b.

Conductor 306b includes cross-shaped portion 306a3 and a L-shaped portion 306b2 positioned on opposite ends of conductor 306b1.

Other materials, configurations, arrangements on other layout levels or quantities of elements in integrated circuit 300B are within the scope of the present disclosure.

Integrated circuit 300C includes a cell 302c directly next to or adjacent to a cell 304c.

In comparison with integrated circuit 200, cell 302c and cell 304c are variations of the cell of integrated circuit 200, and similar detailed description is therefore omitted.

Cell 302c and cell 304c includes conductor 306c.

Conductor 306c is a variation of conductor 230d of integrated circuit 200, and similar detailed description is therefore omitted. In comparison with conductor 230d, conductor 306c extends across a cell boundary (not labelled) between cells 302c and 304c.

Conductor 306c includes L-shaped portions 306c2 and 306c3 positioned on opposite ends of conductor 306c1. Portions 306c2 and 306c3 are positioned on opposite sides of conductor 306d1.

Other materials, configurations, arrangements on other layout levels or quantities of elements in integrated circuit 300C are within the scope of the present disclosure.

Integrated circuit 300D includes a cell 302d directly next to or adjacent to a cell 304d.

In comparison with integrated circuit 200, cell 302d and cell 304d are variations of the cell of integrated circuit 200, and similar detailed description is therefore omitted.

Cell 302d and cell 304d includes conductor 306d.

Conductor 306d is a variation of conductor 230d of integrated circuit 200, and similar detailed description is therefore omitted. In comparison with conductor 230d, conductor 306d extends across a cell boundary (not labelled) between cells 302d and 304d.

Conductor 306d includes L-shaped portions 306d2 and 306d3 positioned on opposite ends of conductor 306d1. Portions 306d2 and 306d3 are positioned on the same side of conductor 306d1.

In some embodiments, by conductor 306a-306d extending across corresponding cell boundaries causes corresponding integrated circuit 300A-300D to have more routing resources than other approaches.

Other materials, configurations, arrangements on other layout levels or quantities of elements in integrated circuit 300D are within the scope of the present disclosure.

Figure 4:
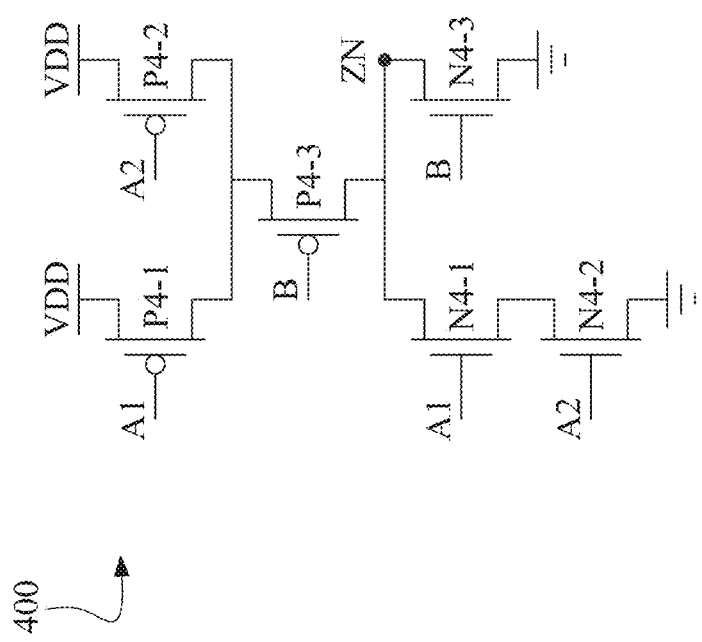
FIG. 4 is a circuit diagram of an integrated circuit, in accordance with some embodiments.

FIG. 4 is a circuit diagram of an integrated circuit 400, in accordance with some embodiments. In some embodiments, integrated circuit 400 is a 2-1 AND OR INVERT (AOI) circuit. A 2-1 AOI circuit is used for illustration, other types of circuits including other types of AOI circuits are within the scope of the present disclosure.

Integrated circuit 400 includes PMOS transistors P4-1, P4-2 and P4-3 coupled to NMOS transistors N4-1, N4-2 and N4-3.

A gate terminal of PMOS transistor P4-1 and NMOS transistor N4-1 are coupled together, and are configured as an input node A1. A gate terminal of PMOS transistor P4-2 and NMOS transistor N4-2 are coupled together, and are configured as an input node A2. A gate terminal of PMOS transistor P4-3 and NMOS transistor N4-3 are coupled together, and are configured as an input node B.

A source terminal of PMOS transistor P4-1 and a source terminal of PMOS transistor P4-2 are coupled to the voltage supply VDD. A source terminal of NMOS transistor N4-2 and a source terminal of NMOS transistor N4-3 are each coupled to the reference voltage supply VSS.

A source terminal of PMOS transistor P4-3, a drain terminal of PMOS transistor P4-2 and a drain terminal of PMOS transistor P4-1 are coupled to each other.

A source terminal of NMOS transistor N4-1 and a drain terminal of NMOS transistor N4-2 are coupled to each other.

A drain terminal of PMOS transistor P4-3, a drain terminal of NMOS transistor N4-1 and a drain terminal of NMOS transistor N4-3 are coupled to each other, and are configured as an output node ZN.

Figure 5:
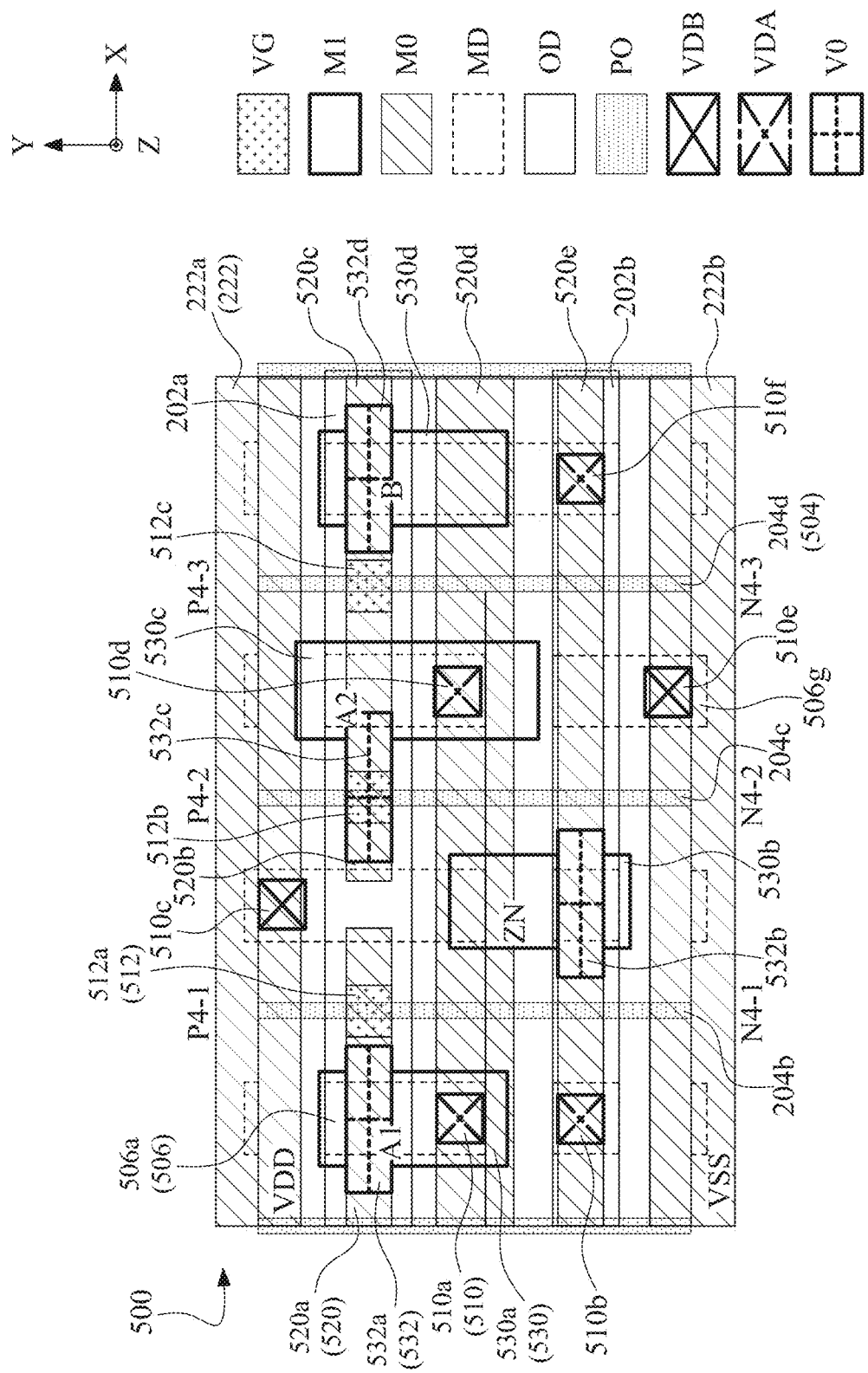
FIG. 5 is a top view of an integrated circuit, in accordance with some embodiments.

As shown in FIG. 5, the drain terminals of PMOS transistor P4-3, and the drain terminals of NMOS transistors N4-1 and N4-3 are electrically coupled together by at least a conductor 520e (described in FIG. 5). In some embodiments, one or more of the drains or sources are flipped with the other.

Other configurations, arrangements or other circuits in integrated circuit 400 are within the scope of the present disclosure.

FIG. 5 is a top view of an integrated circuit 500, in accordance with some embodiments.

Integrated circuit 500 is manufactured by a corresponding layout design similar to integrated circuit 500. Integrated circuit 500 is an embodiment of integrated circuit 400.

For brevity FIG. 5, 7, 9, 11, 13, 15 or 17 are described as a corresponding integrated circuit 500, 700, 900, 1100, 1300, 1500 or 1700, but in some embodiments, FIG. 5, 7, 9, 11, 13, 15 or 17 also correspond to layout designs similar to layout design 100, structural elements of integrated circuit 500, 700, 900, 1100, 1300, 1500 or 1700 also correspond to layout patterns, and structural relationships including alignment, lengths and widths, as well as configurations and layers of a corresponding layout design of integrated circuit 500, 700, 900, 1100, 1300, 1500 or 1700 are similar to the structural relationships and configurations and layers of integrated circuit 500, 700, 900, 1100, 1300, 1500 or 1700, and similar detailed description will not be described for brevity.

In some embodiments, at least integrated circuit 500, 700, 900, 1100, 1300, 1500 or 1700 is manufactured by a layout design similar to at least one of layout design 100, and similar detailed description is therefore omitted. Structural relationships including alignment, lengths and widths, as well as configurations and layers of at least integrated circuit 500, 700, 900, 1100, 1300, 1500 or 1700 are similar to the structural relationships and configurations and layers of integrated circuit 200 of FIGS. 2A-2E, and similar detailed description will not be described in at least FIG. 5, 7, 9, 11, 13, 15 or 17, for brevity.

Integrated circuit 500 is a variation of integrated circuit 200 (FIGS. 2A-2E), and similar detailed description is therefore omitted.

Integrated circuit 500 includes at least the set of active regions 202, the insulating region 203, a set of gates 504, a set of contacts 506, a set of vias 510, a set of vias 512, a set of conductors 520, a set of conductors 222, a set of conductors 530, a set of vias 532 and the substrate 290.

In comparison with integrated circuit 200 of FIGS. 2A-2B, the set of gates 504 replaces the set of gates 204 of FIGS. 2A-2C, the set of contacts 506 replaces the set of contacts 206 of FIG. 2A, the set of vias 510 replaces the set of vias 210 of FIGS. 2B, the set of vias 512 replaces the set of vias 212 of FIG. 2B, the set of conductors 520 replaces the set of conductors 220 of FIG. 2B, the set of conductors 530 replaces the set of conductors 230 of FIG. 2B, the set of vias 532 replaces the set of vias 232 of FIG. 2B, and similar detailed description is therefore omitted.

The set of gates 504 includes one or more of gates 204a, 204b, 204c, 204d or 204e.

Gate 204b corresponds to the gates of PMOS transistor P4-1 and NMOS transistor N4-1. Gate 204c corresponds to the gates of PMOS transistor P4-2 and NMOS transistor N4-2. Gate 204d corresponds to the gates of PMOS transistor P4-3 and NMOS transistor N4-3. In some embodiments, gates 204a and 204e are dummy gates.

Other configurations, arrangements on other layout levels or quantities of gates in the set of gates 504 are within the scope of the present disclosure.

The set of contacts 506 includes at least contact 506a, 506b, 506c, 506d, 506e, 506f or 506g.

In comparison with integrated circuit 200, at least contact 506a, 506b, 506c, 506d, 506e, 506f or 506g replaces at least corresponding contact 206a, 206b, 206c, 206d, 206e, 206f or 206g, and similar detailed description is therefore omitted.

Contact 506a is electrically coupled to a drain of PMOS transistor P4-1. Contact 506b is electrically coupled to a source of PMOS transistor P4-1 and a source of PMOS transistor P4-2. Contact 506c is electrically coupled to a drain of PMOS transistor P4-2 and a source of PMOS transistor P4-3. Contact 506d is electrically coupled to a drain of PMOS transistor P4-3 and a drain of NMOS transistor N4-3.

Contact 506e is electrically coupled to a drain of NMOS transistor N4-1. Contact 506f is electrically coupled to a source of NMOS transistor N4-1 and a drain of NMOS transistor N4-2. Contact 506g is electrically coupled to a source of NMOS transistor N4-2 and a source of NMOS transistor N4-3.

Other configurations, arrangements on other layout levels or quantities of conductors in the set of contacts 506 are within the scope of the present disclosure.

The set of vias 510 includes at least via 510a, 510b, . . . , 510e or 510f.

In comparison with integrated circuit 200, at least via 510a, 510b, . . . , 510e or 510f replaces one or more of via 210a, 210b, . . . , 210d or 210e, and similar detailed description is therefore omitted.

Via 510a is between conductor 520d and contact 506a, and electrically couples conductor 520d and contact 506a together. Via 510b is between conductor 520e and contact 506e, and electrically couples conductor 520e and contact 506e together. Via 510c is between conductor 222a and contact 506b, and electrically couples conductor 222a and contact 506b together. Via 510d is between conductor 520d and contact 506c, and electrically couples conductor 520d and contact 506c together. Via 510e is between conductor 222b and contact 506g, and electrically couples conductor 222b and contact 506g together. Via 510f is between conductor 520e and contact 506d, and electrically couples conductor 520e and contact 506d together.

As shown in FIG. 5, in some embodiments, the set of vias 510 have a color A or B. For example, vias 510a, 510b, 510d and 510f have color A (e.g., VDA), and vias 510c and 510e have color B (e.g., VDB). The color A or B indicates that vias 510 with a same color are to be formed on a same mask of a multiple mask set, and vias 510 with a different corresponding color are to be formed on a different mask of the multiple mask set. Two colors A and B (VDA and VDB) are depicted in FIG. 5 as an example. In some embodiments, there are more or less than two colors in integrated circuit 500.

Other configurations, arrangements on other layout levels or quantities of vias in the set of vias 510 are within the scope of the present disclosure.

The set of vias 512 includes at least via 512a, 512b or 512c.

In comparison with integrated circuit 200, via 512a, 512b, 512c replaces corresponding via 212a, 212b, 212c, and similar detailed description is therefore omitted.

Via 512a is between conductor 520a and gate 204b, and electrically couples conductor 520a and gate 204b together. Via 512b is between conductor 520b and gate 204c, and electrically couples conductor 520b and gate 204c together. Via 512c is between conductor 520c and gate 204d, and electrically couples conductor 520c and gate 204d together.

Other configurations, arrangements on other layout levels or quantities of vias in the set of vias 512 are within the scope of the present disclosure.

The set of conductors 520 includes at least conductor 520a, 520b, 520c, 520d or 520e.

In comparison with integrated circuit 200, conductors 520a, 520b and 520c replace conductor 220a, conductor 520d replaces conductor 220b, and conductor 520e replaces conductor 220c, and similar detailed description is therefore omitted.

Other configurations, arrangements on other layout levels or quantities of conductors in the set of conductors 520 are within the scope of the present disclosure.

The set of conductors 530 includes at least conductor 530a, 530b, 530c or 530d.

In comparison with integrated circuit 200, conductor 530a, 530b, 530c or 530d replaces corresponding conductor 230a, 230b, 230c or 230d, and similar detailed description is therefore omitted.

Each of conductors 530a, 530c and 530d are similar to conductor 230d, and conductor 530b is similar to conductor 230c, and similar detailed description is therefore omitted.

Other configurations, arrangements on other layout levels or quantities of conductors in the set of conductors 530 are within the scope of the present disclosure.

The set of vias 532 includes at least via 532a, 532b, 532c or 532d.

In comparison with integrated circuit 200, at least via 532a, 532b or 532d replaces at least via 232b, and at least via 532c replaces at least via 232a, and similar detailed description is therefore omitted.

Via 532a is between conductor 520a and conductor 530a, and electrically couples conductor 520a and conductor 530a together. Via 532b is between conductor 520e and conductor 530b, and electrically couples conductor 520e and conductor 530b together. Via 532c is between conductor 520b and conductor 530c, and electrically couples conductor 520b and conductor 530c together. Via 532d is between conductor 520c and conductor 530d, and electrically couples conductor 520c and conductor 530d together.

Other configurations, arrangements on other layout levels or quantities of vias in the set of vias 532 are within the scope of the present disclosure.

Conductor 530a corresponds to the input pin (e.g., input node A1) of the gates of PMOS transistor P4-1 and NMOS transistor N4-1. For example, conductor 530a is electrically coupled to conductor 520a by via 532a, and conductor 520a is electrically coupled to gate 204b by via 512a.

Conductor 530b corresponds to the output pin (e.g., output node ZN) of the drains of PMOS transistor P4-3 and NMOS transistors N4-1 and N4-3. For example, conductor 530b is electrically coupled to conductor 520e by via 532b, conductor 520e is electrically coupled to contact 506e by via 510b, and to contact 506d by via 510f. Furthermore, contact 506e is electrically coupled to the drain of NMOS transistor N4-1, and contact 506d is electrically coupled to the drain of NMOS transistor N4-3 and the drain of PMOS transistor P4-3.

Conductor 530c corresponds to the input pin (e.g., input node A2) of the gates of PMOS transistor P4-2 and NMOS transistor N4-2. For example, conductor 530c is electrically coupled to conductor 520b by via 532c, and conductor 520b is electrically coupled to gate 204c by via 512b.

Conductor 530d corresponds to the input pin (e.g., input node B) of the gates of PMOS transistor P4-3 and NMOS transistor N4-3. For example, conductor 530d is electrically coupled to conductor 520c by via 532d, and conductor 520c is electrically coupled to gate 204d by via 512c.

Other materials, configurations, arrangements on other layout levels or quantities of elements in integrated circuit 500 are within the scope of the present disclosure.

In some embodiments, integrated circuit 500 achieves one or more of the benefits discussed above in at least FIG. 1A-1D, 2A-2E or 3A-3D, or discussed hereinafter.

Figure 6:
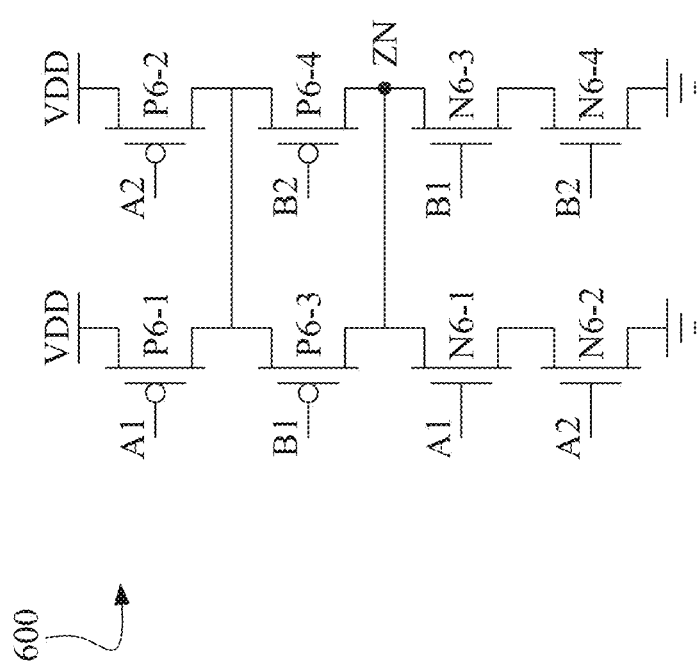
FIG. 6 is a circuit diagram of an integrated circuit, in accordance with some embodiments.

FIG. 6 is a circuit diagram of an integrated circuit 600, in accordance with some embodiments. In some embodiments, integrated circuit 600 is a 2-2 AOI circuit. A 2-2 AOI circuit is used for illustration, other types of circuits including other types of AOI circuits are within the scope of the present disclosure.

Integrated circuit 600 includes PMOS transistors P6-1, P6-2, P6-3 and P6-4 coupled to NMOS transistors N6-1, N6-2, N6-3 and N6-4.

A gate terminal of PMOS transistor P6-1 and NMOS transistor N6-1 are coupled together, and are configured as an input node A1. A gate terminal of PMOS transistor P6-2 and NMOS transistor N6-2 are coupled together, and are configured as an input node A2. A gate terminal of PMOS transistor P6-3 and NMOS transistor N6-3 are coupled together, and are configured as an input node B1. A gate terminal of PMOS transistor P6-4 and NMOS transistor N6-4 are coupled together, and are configured as an input node B2.

A source terminal of PMOS transistor P6-1 and a source terminal of PMOS transistor P6-2 are coupled to the voltage supply VDD. A source terminal of NMOS transistor N6-2 and a source terminal of NMOS transistor N6-4 are each coupled to the reference voltage supply VSS.

A source terminal of PMOS transistor P6-3, a source terminal of PMOS transistor P6-4, a drain terminal of PMOS transistor P6-2 and a drain terminal of PMOS transistor P6-1 are coupled to each other.

A source terminal of NMOS transistor N6-1 and a drain terminal of NMOS transistor N6-2 are coupled to each other. A source terminal of NMOS transistor N6-3 and a drain terminal of NMOS transistor N6-4 are coupled to each other.

A drain terminal of PMOS transistor P6-3, a drain terminal of PMOS transistor P6-4, a drain terminal of NMOS transistor N6-1 and a drain terminal of NMOS transistor N6-3 are coupled to each other, and are configured as an output node ZN.

In some embodiments, one or more of the drains or sources are flipped with the other.

Other configurations, arrangements or other circuits in integrated circuit 600 are within the scope of the present disclosure.

Figure 7:
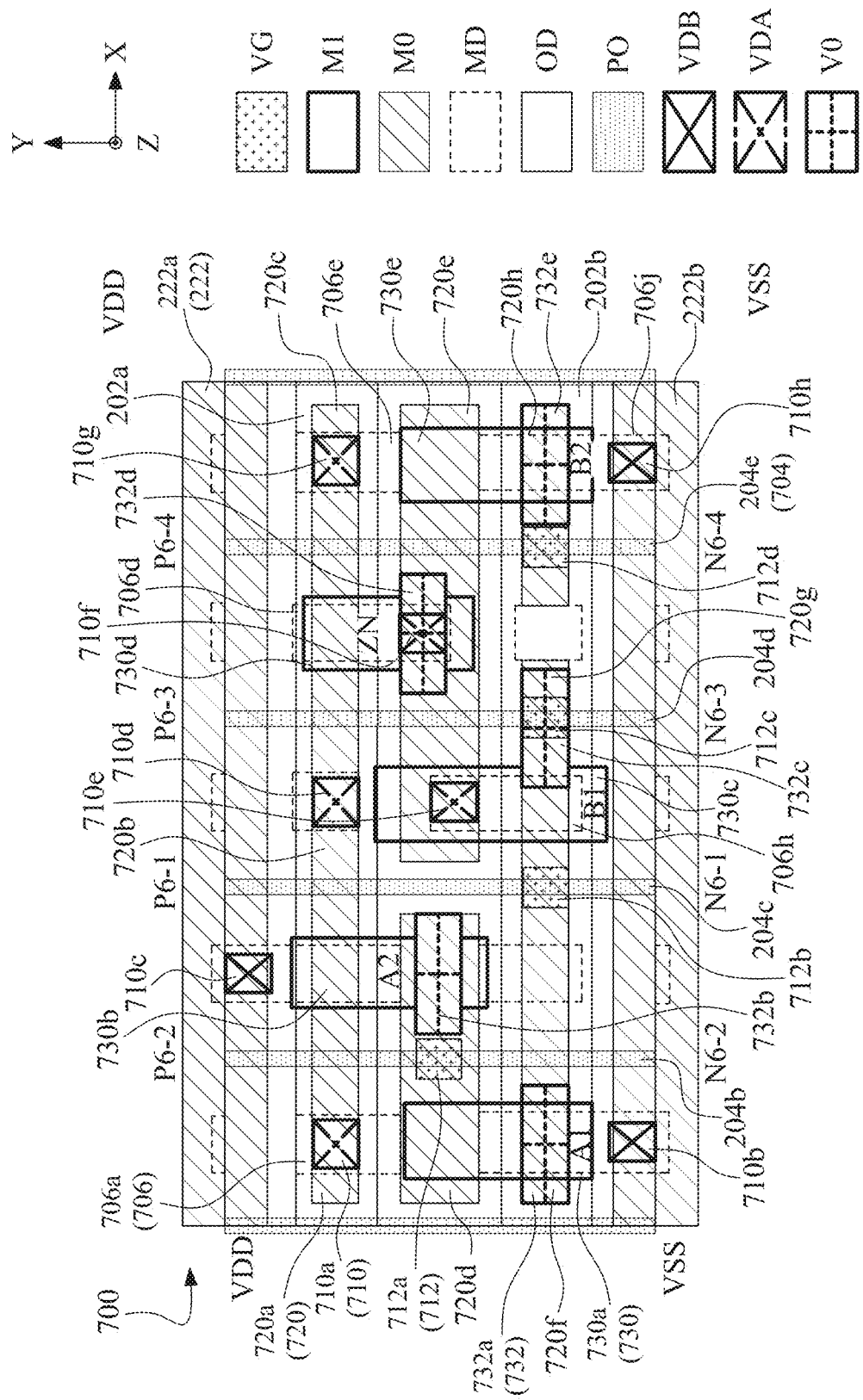
FIG. 7 is a top view of an integrated circuit, in accordance with some embodiments.

FIG. 7 is a top view of an integrated circuit 700, in accordance with some embodiments.

Integrated circuit 700 is manufactured by a corresponding layout design similar to integrated circuit 700. Integrated circuit 700 is an embodiment of integrated circuit 600.

Integrated circuit 700 is a variation of integrated circuit 200 (FIGS. 2A-2E) or 500 (FIG. 5), and similar detailed description is therefore omitted.

Integrated circuit 700 includes at least the set of active regions 202, the insulating region 203, a set of gates 704, a set of contacts 706, a set of vias 710, a set of vias 712, a set of conductors 720, a set of conductors 222, a set of conductors 730, a set of vias 732 and the substrate 290.

In comparison with integrated circuit 200 of FIGS. 2A-2B, the set of gates 704 replaces the set of gates 204 of FIGS. 2A-2C, the set of contacts 706 replaces the set of contacts 206 of FIG. 2A, the set of vias 710 replaces the set of vias 210 of FIGS. 2B, the set of vias 712 replaces the set of vias 212 of FIG. 2B, the set of conductors 720 replaces the set of conductors 220 of FIG. 2B, the set of conductors 730 replaces the set of conductors 230 of FIG. 2B, the set of vias 732 replaces the set of vias 232 of FIG. 2B, and similar detailed description is therefore omitted.

The set of gates 704 includes one or more of gates 204*a*, 204*b*, 204*c*, 204*d*, 204*e* or 204*f*.

Gate 204*b* corresponds to the gates of PMOS transistor P6-2 and NMOS transistor N6-2. Gate 204*c* corresponds to the gates of PMOS transistor P6-1 and NMOS transistor N6-1. Gate 204*d* corresponds to the gates of PMOS transistor P6-3 and NMOS transistor N6-3. Gate 204*e* corresponds to the gates of PMOS transistor P6-4 and NMOS transistor N6-4. In some embodiments, gates 204*a* and 204*f* are dummy gates.

Other configurations, arrangements on other layout levels or quantities of gates in the set of gates 704 are within the scope of the present disclosure.

The set of contacts 706 includes at least contact 706*a*, 706*b*, 706*c*, 706*d*, 706*e*, 706*f*, 706*g*, 706*h*, 706*i* or 706*j*.

In comparison with integrated circuit 200, at least contact 706*a*, 706*b*, 706*c*, 706*d*, 706*e*, 706*f*, 706*g*, 706*h*, 706*i* or 706*j* replaces at least corresponding contact 206*a*, 206*b*, 206*c*, 206*d*, 206*e*, 206*f*, 206*g*, 206*h*, 206*i* or 206*j*, and similar detailed description is therefore omitted.

Contact 706*a* is electrically coupled to a drain of PMOS transistor P6-2. Contact 706*b* is electrically coupled to a source of PMOS transistor P6-2 and a source of PMOS transistor P6-1. Contact 706*c* is electrically coupled to a drain of PMOS transistor P6-1 and a source of PMOS transistor P6-3. Contact 706*d* is electrically coupled to a drain of PMOS transistor P6-3 and a drain of PMOS transistor P6-4. Contact 706*e* is electrically coupled to a source of PMOS transistor P6-4.

Contact 706*f* is electrically coupled to a source of NMOS transistor N6-2. Contact 706*g* is electrically coupled to a source of NMOS transistor N6-1 and a drain of NMOS transistor N6-2. Contact 706*h* is electrically coupled to a drain of NMOS transistor N6-3 and a drain of NMOS transistor N6-1. Contact 706*i* is electrically coupled to a source of NMOS transistor N6-3 and a drain of NMOS transistor N6-4. Contact 706*j* is electrically coupled to a source of NMOS transistor N6-4.

Other configurations, arrangements on other layout levels or quantities of conductors in the set of contacts 706 are within the scope of the present disclosure.

The set of vias 710 includes at least via 710*a*, 710*b*, . . . , 710*g* or 710*h*.

In comparison with integrated circuit 200, at least via 710*a*, 710*b*, . . . , 710*g* or 710*h* replaces one or more of via 210*a*, 210*b*, . . . , 210*d* or 210*e*, and similar detailed description is therefore omitted.

Via 710*a* is between conductor 720*a* and contact 706*a*, and electrically couples conductor 720*a* and contact 706*a* together. Via 710*b* is between conductor 222*b* and contact 706*f*, and electrically couples conductor 222*b* and contact 706*f* together. Via 710*c* is between conductor 222*a* and contact 706*b*, and electrically couples conductor 222*a* and contact 706*b* together. Via 710*d* is between conductor 720*b* and contact 706*c*, and electrically couples conductor 720*b* and contact 706*c* together. Via 710*e* is between conductor 720*e* and contact 706*h*, and electrically couples conductor 720*e* and contact 706*h* together. Via 710*f* is between conductor 720*e* and contact 706*d*, and electrically couples conductor 720*e* and contact 706*d* together. Via 710*g* is between conductor 720*c* and contact 706*e*, and electrically couples conductor 720*c* and contact 706*e* together. Via 710*h* is between conductor 222*b* and contact 706*j*, and electrically couples conductor 222*b* and contact 706*j* together.

Other configurations, arrangements on other layout levels or quantities of vias in the set of vias 710 are within the scope of the present disclosure.

The set of vias 712 includes at least via 712*a*, 712*b*, 712*c* or 712*d*.

In comparison with integrated circuit 200, via 712*a*, 712*b*, 712*c*, 712*d* replaces corresponding via 212*a*, 212*b*, 212*c*, 212*d*, and similar detailed description is therefore omitted.

Via 712*a* is between conductor 720*d* and gate 204*b*, and electrically couples conductor 720*d* and gate 204*b* together. Via 712*b* is between conductor 720*f* and gate 204*c*, and electrically couples conductor 720*f* and gate 204*c* together. Via 712*c* is between conductor 720*g* and gate 204*d*, and electrically couples conductor 720*g* and gate 204*d* together. Via 712*d* is between conductor 720*h* and gate 204*e*, and electrically couples conductor 720*h* and gate 204*e* together.

Other configurations, arrangements on other layout levels or quantities of vias in the set of vias 712 are within the scope of the present disclosure.

The set of conductors 720 includes at least conductor 720*a*, 720*b*, 720*c*, 720*d*, 720*e*, 720*f*, 720*g* or 720*h*.

In comparison with integrated circuit 200, conductors 720*a*, 720*b* and 720*c* replace conductor 220*a*, conductors 720*d* and 720*e* replace conductor 220*b*, and conductors 720*f*, 720*g* and 720*h* replace conductor 220*c*, and similar detailed description is therefore omitted.

Other configurations, arrangements on other layout levels or quantities of conductors in the set of conductors 720 are within the scope of the present disclosure.

The set of conductors 730 includes at least conductor 730*a*, 730*b*, 730*c*, 730*d* or 730*e*.

In comparison with integrated circuit 200, conductor 730*a*, 730*b*, 730*c*, 730*d* or 730*e* replaces corresponding conductor 230*a*, 230*b*, 230*c*, 230*d* or 230*e*, and similar detailed description is therefore omitted.

Each of conductors 730*a*, 730*b*, 730*d* and 730*e* are similar to conductor 230*d*, and conductor 730*c* is similar to conductor 230*c*, and similar detailed description is therefore omitted.

Other configurations, arrangements on other layout levels or quantities of conductors in the set of conductors 730 are within the scope of the present disclosure.

The set of vias 732 includes at least via 732*a*, 732*b*, 732*c*, 732*d* or 732*e*.

In comparison with integrated circuit 200, at least via 732*a*, 732*b*, 732*d* or 732*e* replaces at least via 232*b*, and at least via 732*c* replaces at least via 232*a*, and similar detailed description is therefore omitted.

Via 732*a* is between conductor 720*f* and conductor 730*a*, and electrically couples conductor 720*f* and conductor 730*a* together. Via 732*b* is between conductor 720*d* and conductor 730*b*, and electrically couples conductor 720*d* and conductor 730*b* together. Via 732*c* is between conductor 720*g* and conductor 730*c*, and electrically couples conductor 720*g* and conductor 730*c* together. Via 732*d* is between conductor 720*e* and conductor 730*d*, and electrically couples conductor 720*e* and conductor 730*d* together. Via 732*e* is between conductor 720*h* and conductor 730*e*, and electrically couples conductor 720*h* and conductor 730*e* together.

Other configurations, arrangements on other layout levels or quantities of vias in the set of vias 732 are within the scope of the present disclosure.

Conductor 730*a* corresponds to the input pin (e.g., input node A1) of the gates of PMOS transistor P6-2 and NMOS transistor N6-2. For example, conductor 730*a* is electrically coupled to conductor 720*f* by via 732*a*, and conductor 720*f* is electrically coupled to gate 204*c* by via 712*b*.

Conductor 730*b* corresponds to the input pin (e.g., input node A2) of the gates of PMOS transistor P6-1 and NMOS transistor N6-1. For example, conductor 730*b* is electrically coupled to conductor 720*d* by via 732*b*, and conductor 720*d* is electrically coupled to gate 204*b* by via 712*a*.

Conductor 730*c* corresponds to the input pin (e.g., input node B1) of the gates of PMOS transistor P6-3 and NMOS transistor N6-3. For example, conductor 730*c* is electrically coupled to conductor 720*g* by via 732*c*, and conductor 720*g* is electrically coupled to gate 204*d* by via 712*c*.

Conductor 730*d* corresponds to the output pin (e.g., output node ZN) of the drains of PMOS transistors P6-3 and P6-4, and the drains of NMOS transistors N6-1 and N6-3. For example, conductor 730*d* is electrically coupled to conductor 720*e* by via 732*d*, conductor 720*e* is electrically coupled to contact 706*d* by via 710*f*, and to contact 706*h* by via 710*e*. Furthermore, contact 706*d* is electrically coupled to the drain of PMOS transistor P6-3 and the drain of PMOS transistor P6-4, and contact 706*h* is electrically coupled to the drain of NMOS transistor N6-1 and the drain of NMOS transistor N6-3.

Conductor 730*e* corresponds to the input pin (e.g., input node B2) of the gates of PMOS transistor P6-4 and NMOS transistor N6-4. For example, conductor 730*e* is electrically coupled to conductor 720*h* by via 732*e*, and conductor 720*h* is electrically coupled to gate 204*e* by via 712*d*.

Other materials, configurations, arrangements on other layout levels or quantities of elements in integrated circuit 700 are within the scope of the present disclosure.

In some embodiments, integrated circuit 700 achieves one or more of the benefits discussed above in at least FIG. 1A-1D, 2A-2E, 3A-3D or 5, or discussed hereinafter.

Figure 8:
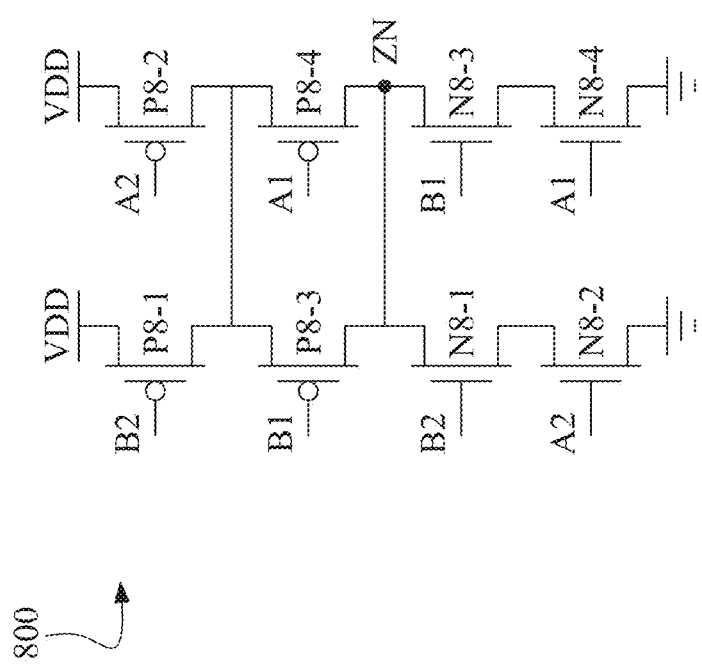
FIG. 8 is a circuit diagram of an integrated circuit, in accordance with some embodiments.

FIG. 8 is a circuit diagram of an integrated circuit 800, in accordance with some embodiments. In some embodiments, integrated circuit 800 is a 2-2 OR AND INVERT (OAI) circuit. A 2-2 OAI circuit is used for illustration, other types of circuits including other types of OAI circuits are within the scope of the present disclosure.

Integrated circuit 800 includes PMOS transistors P8-1, P8-2, P8-3 and P8-4 coupled to NMOS transistors N8-1, N8-2, N8-3 and N8-4.

A gate terminal of PMOS transistor P8-1 and NMOS transistor N8-1 are coupled together, and are configured as an input node B2. A gate terminal of PMOS transistor P8-2 and NMOS transistor N8-2 are coupled together, and are configured as an input node A2. A gate terminal of PMOS transistor P8-3 and NMOS transistor N8-3 are coupled together, and are configured as an input node B1. A gate terminal of PMOS transistor P8-4 and NMOS transistor N8-4 are coupled together, and are configured as an input node A1.

A source terminal of PMOS transistor P8-1 and a source terminal of PMOS transistor P8-2 are coupled to the voltage supply VDD. A source terminal of NMOS transistor N8-2 and a source terminal of NMOS transistor N8-4 are each coupled to the reference voltage supply VSS.

A source terminal of PMOS transistor P8-3 and a drain terminal of PMOS transistor P8-1 are coupled to each other. A source terminal of PMOS transistor P8-4 and a drain terminal of PMOS transistor P8-2 are coupled to each other.

A source terminal of NMOS transistor N8-1, a drain terminal of NMOS transistor N8-2, a source terminal of NMOS transistor N8-3 and a drain terminal of NMOS transistor N8-4 are coupled to each other.

A drain terminal of PMOS transistor P8-3, a drain terminal of PMOS transistor P8-4, a drain terminal of NMOS transistor N8-1 and a drain terminal of NMOS transistor N8-3 are coupled to each other, and are configured as an output node ZN.

In some embodiments, one or more of the drains or sources are flipped with the other.

Other configurations, arrangements or other circuits in integrated circuit 800 are within the scope of the present disclosure.

Figure 9:
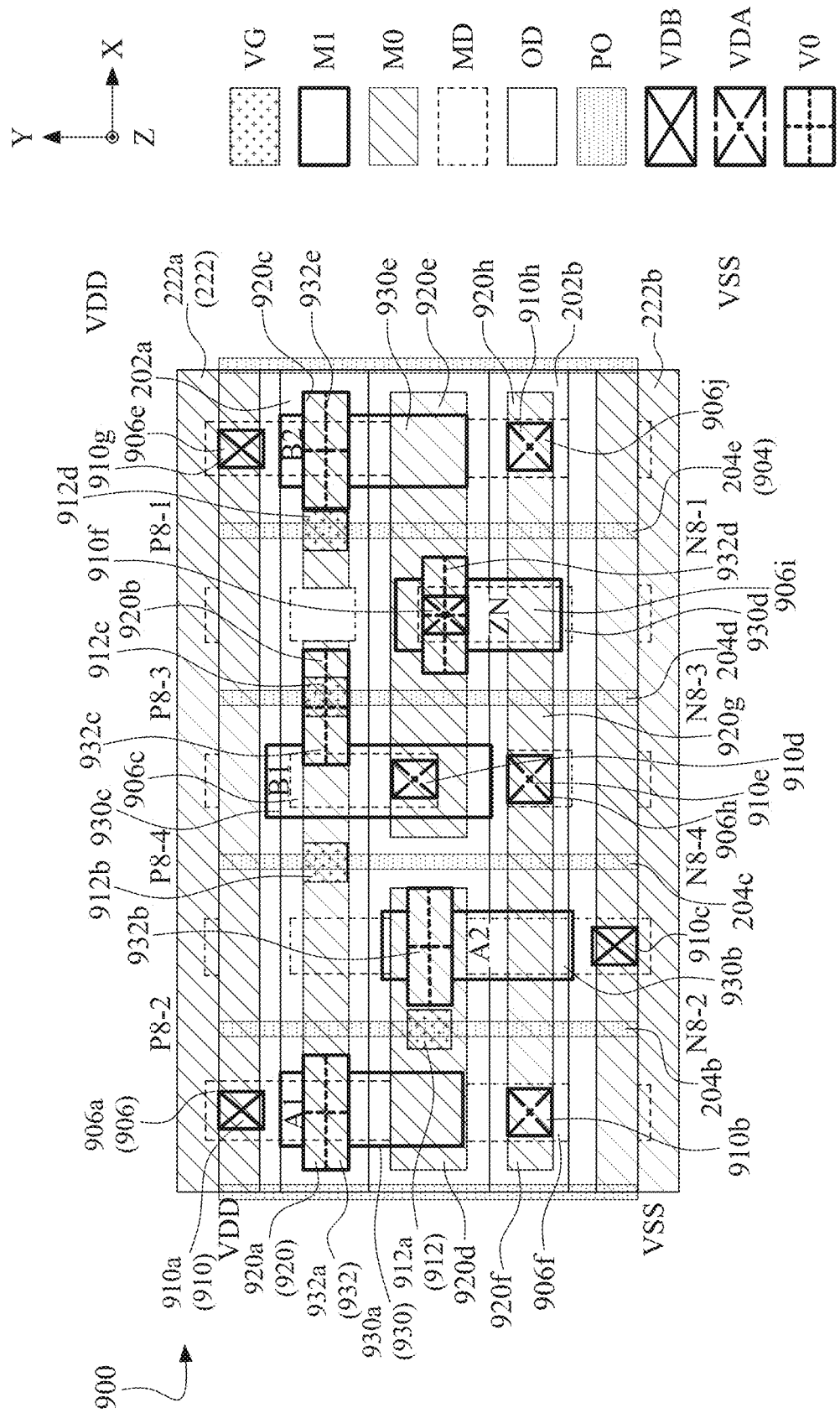
FIG. 9 is a top view of an integrated circuit, in accordance with some embodiments.

FIG. 9 is a top view of an integrated circuit 900, in accordance with some embodiments.

Integrated circuit 900 is manufactured by a corresponding layout design similar to integrated circuit 900. Integrated circuit 900 is an embodiment of integrated circuit 800.

Integrated circuit 900 is a variation of integrated circuit 200 (FIGS. 2A-2E), 500 (FIG. 5) or 700 (FIG. 7), and similar detailed description is therefore omitted.

Integrated circuit 900 includes at least the set of active regions 202, the insulating region 203, a set of gates 904, a set of contacts 906, a set of vias 910, a set of vias 912, a set of conductors 920, the set of conductors 222, a set of conductors 930, a set of vias 932 and the substrate 290.

In comparison with integrated circuit 200 of FIGS. 2A-2B, the set of gates 904 replaces the set of gates 204 of FIGS. 2A-2C, the set of contacts 906 replaces the set of contacts 206 of FIG. 2A, the set of vias 910 replaces the set of vias 210 of FIGS. 2B, the set of vias 912 replaces the set of vias 212 of FIG. 2B, the set of conductors 920 replaces the set of conductors 220 of FIG. 2B, the set of conductors 930 replaces the set of conductors 230 of FIG. 2B, the set of vias 932 replaces the set of vias 232 of FIG. 2B, and similar detailed description is therefore omitted.

The set of gates 904 includes one or more of gates 204*a*, 204*b*, 204*c*, 204*d*, 204*e* or 204*f*.

Gate 204*b* corresponds to the gates of PMOS transistor P8-2 and NMOS transistor N8-2. Gate 204*c* corresponds to the gates of PMOS transistor P8-4 and NMOS transistor N8-4. Gate 204*d* corresponds to the gates of PMOS transistor P8-3 and NMOS transistor N8-3. Gate 204*e* corresponds to the gates of PMOS transistor P8-1 and NMOS transistor N8-1. In some embodiments, gates 204*a* and 204*f* are dummy gates.

Other configurations, arrangements on other layout levels or quantities of gates in the set of gates 904 are within the scope of the present disclosure.

The set of contacts 906 includes at least contact 906*a*, 906*b*, 906*c*, 906*d*, 906*e*, 906*f*, 906*g*, 906*h*, 906*i* or 906*j*.

In comparison with integrated circuit 200, at least contact 906*a*, 906*b*, 906*c*, 906*d*, 906*e*, 906*f*, 906*g*, 906*h*, 906*i* or 906*j* replaces at least corresponding contact 206*a*, 206*b*, 206*c*, 206*d*, 206*e*, 206*f*, 206*g*, 206*h*, 206*i* or 206*j*, and similar detailed description is therefore omitted.

Contact 906*a* is electrically coupled to a source of PMOS transistor P8-2. Contact 906*b* is electrically coupled to a drain of PMOS transistor P8-2 and a source of PMOS transistor P8-4. Contact 906*c* is electrically coupled to a drain of PMOS transistor P8-4 and a drain of PMOS transistor P8-3. Contact 906*d* is electrically coupled to a source of PMOS transistor P8-3 and a drain of PMOS transistor P8-1. Contact 906*e* is electrically coupled to a source of PMOS transistor P8-1.

Contact 906*f* is electrically coupled to a drain of NMOS transistor N8-2. Contact 906*g* is electrically coupled to a source of NMOS transistor N8-2 and a source of NMOS transistor N8-4.

Contact 906h is electrically coupled to a drain of NMOS transistor N8-4 and a source of NMOS transistor N8-3. Contact 906i is electrically coupled to a drain of NMOS transistor N8-3 and a drain of NMOS transistor N8-1. Contact 906j is electrically coupled to a source of NMOS transistor N8-1.

Other configurations, arrangements on other layout levels or quantities of conductors in the set of contacts 906 are within the scope of the present disclosure.

The set of vias 910 includes at least via 910a, 910b, . . . , 910g or 910h.

In comparison with integrated circuit 200, at least via 910a, 910b, . . . , 910g or 910h replaces one or more of via 210a, 210b, . . . , 210d or 210e, and similar detailed description is therefore omitted.

Via 910a is between conductor 222a and contact 906a, and electrically couples conductor 222a and contact 906a together. Via 910b is between conductor 920f and contact 906f, and electrically couples conductor 920f and contact 906f together. Via 910c is between conductor 222b and contact 906g, and electrically couples conductor 222b and contact 906g together. Via 910d is between conductor 920e and contact 906c, and electrically couples conductor 920e and contact 906c together. Via 910e is between conductor 920g and contact 906h, and electrically couples conductor 920g and contact 906h together. Via 910f is between conductor 920e and contact 906i, and electrically couples conductor 920e and contact 906i together. Via 910g is between conductor 222a and contact 906e, and electrically couples conductor 222a and contact 906e together. Via 910h is between conductor 920h and contact 906j, and electrically couples conductor 920h and contact 906j together.

Other configurations, arrangements on other layout levels or quantities of vias in the set of vias 910 are within the scope of the present disclosure.

The set of vias 912 includes at least via 912a, 912b, 912c or 912d.

In comparison with integrated circuit 200, via 912a, 912b, 912c, 912d replaces corresponding via 212a, 212b, 212c, 212d, and similar detailed description is therefore omitted.

Via 912a is between conductor 920d and gate 204b, and electrically couples conductor 920d and gate 204b together. Via 912b is between conductor 920a and gate 204c, and electrically couples conductor 920a and gate 204c together. Via 912c is between conductor 920b and gate 204d, and electrically couples conductor 920b and gate 204d together. Via 912d is between conductor 920c and gate 204e, and electrically couples conductor 920c and gate 204e together.

Other configurations, arrangements on other layout levels or quantities of vias in the set of vias 912 are within the scope of the present disclosure.

The set of conductors 920 includes at least conductor 920a, 920b, 920c, 920d, 920e, 920f, 920g or 920h.

In comparison with integrated circuit 200, conductors 920a, 920b and 920c replace conductor 220a, conductors 920d and 920e replace conductor 220b, and conductor 920f, 920g and 920h replace conductor 220c, and similar detailed description is therefore omitted.

Other configurations, arrangements on other layout levels or quantities of conductors in the set of conductors 920 are within the scope of the present disclosure.

The set of conductors 930 includes at least conductor 930a, 930b, 930c, 930d or 930e.

In comparison with integrated circuit 200, conductor 930a, 930b, 930c, 930d or 930e replaces corresponding conductor 230a, 230b, 230c, 230d or 230e, and similar detailed description is therefore omitted.

Each of conductors 930a, 930b, 930d and 930e are similar to conductor 230d, and conductor 930c is similar to conductor 230c, and similar detailed description is therefore omitted.

Other configurations, arrangements on other layout levels or quantities of conductors in the set of conductors 930 are within the scope of the present disclosure.

The set of vias 932 includes at least via 932a, 932b, 932c, 932d or 932e.

In comparison with integrated circuit 200, at least via 932a, 932b, 932d or 932e replaces at least via 232b, and at least via 932c replaces at least via 232a, and similar detailed description is therefore omitted.

Via 932a is between conductor 920a and conductor 930a, and electrically couples conductor 920a and conductor 930a together. Via 932b is between conductor 920d and conductor 930b, and electrically couples conductor 920d and conductor 930b together. Via 932c is between conductor 920b and conductor 930c, and electrically couples conductor 920b and conductor 930c together. Via 932d is between conductor 920e and conductor 930d, and electrically couples conductor 920e and conductor 930d together. Via 932e is between conductor 920c and conductor 930e, and electrically couples conductor 920c and conductor 930e together.

Other configurations, arrangements on other layout levels or quantities of vias in the set of vias 932 are within the scope of the present disclosure.

Conductor 930a corresponds to the input pin (e.g., input node A1) of the gates of PMOS transistor P8-4 and NMOS transistor N8-4. For example, conductor 930a is electrically coupled to conductor 920a by via 932a, and conductor 920a is electrically coupled to gate 204c by via 912b.

Conductor 930b corresponds to the input pin (e.g., input node A2) of the gates of PMOS transistor P8-2 and NMOS transistor N8-2. For example, conductor 930b is electrically coupled to conductor 920d by via 932b, and conductor 920d is electrically coupled to gate 204b by via 912a.

Conductor 930c corresponds to the input pin (e.g., input node B1) of the gates of PMOS transistor P8-3 and NMOS transistor N8-3. For example, conductor 930c is electrically coupled to conductor 920b by via 932c, and conductor 920b is electrically coupled to gate 204d by via 912c.

Conductor 930d corresponds to the output pin (e.g., output node ZN) of the drains of PMOS transistors P8-3 and P8-4, and the drains of NMOS transistors N8-1 and N8-3. For example, conductor 930d is electrically coupled to conductor 920e by via 932d, conductor 920e is electrically coupled to contact 906c by via 910d, and to contact 906i by via 910f. Furthermore, contact 906c is electrically coupled to the drain of PMOS transistor P8-3 and the drain of PMOS transistor P8-4, and contact 906i is electrically coupled to the drain of NMOS transistor N8-1 and the drain of PMOS transistor P8-3.

Conductor 930e corresponds to the input pin (e.g., input node B2) of the gates of PMOS transistor P8-1 and NMOS transistor N8-1. For example, conductor 930e is electrically coupled to conductor 920c by via 932e, and conductor 920c is electrically coupled to gate 204e by via 912d.

Other materials, configurations, arrangements on other layout levels or quantities of elements in integrated circuit 900 are within the scope of the present disclosure.

In some embodiments, integrated circuit 900 achieves one or more of the benefits discussed above in at least FIG. 1A-1D, 2A-2E, 3A-3D, 5 or 7, or discussed hereinafter.

Figure 10:
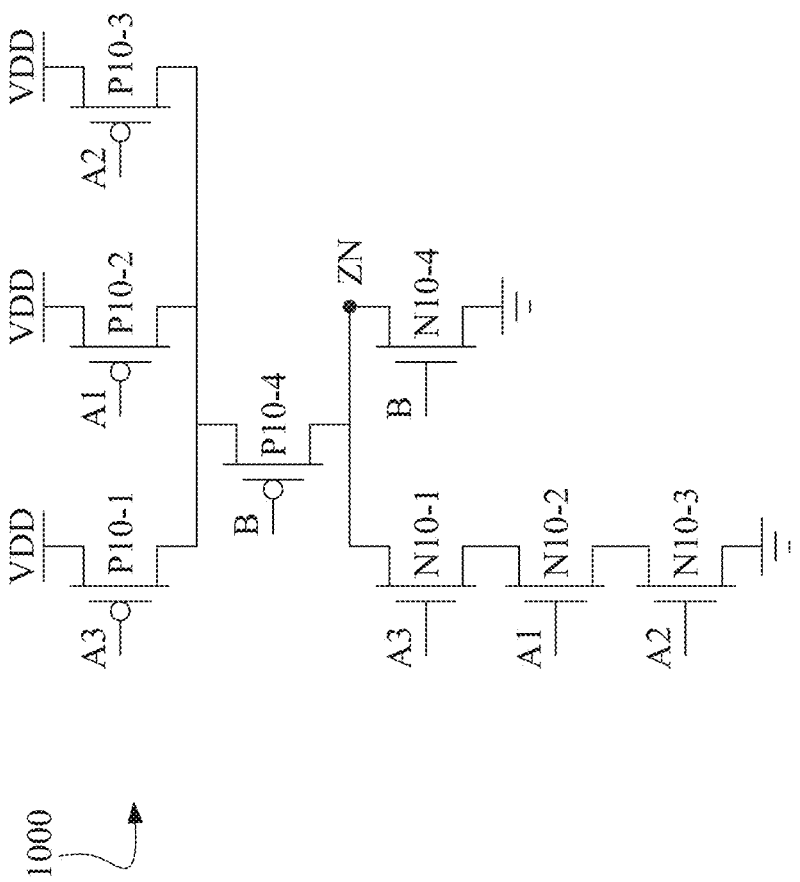
FIG. 10 is a circuit diagram of an integrated circuit, in accordance with some embodiments.

FIG. 10 is a circuit diagram of an integrated circuit 1000, in accordance with some embodiments. In some embodiments, integrated circuit 1000 is a 3-1 AOI circuit. A 3-1

AOI circuit is used for illustration, other types of circuits including other types of AOI circuits are within the scope of the present disclosure.

Integrated circuit 1000 includes PMOS transistors P10-1, P10-2, P10-3 and P10-4 coupled to NMOS transistors N10-1, N10-2, N10-3 and N10-4.

A gate terminal of PMOS transistor P10-1 and NMOS transistor N10-1 are coupled together, and are configured as an input node A3. A gate terminal of PMOS transistor P10-2 and NMOS transistor N10-2 are coupled together, and are configured as an input node A1. A gate terminal of PMOS transistor P10-3 and NMOS transistor N10-3 are coupled together, and are configured as an input node A2. A gate terminal of PMOS transistor P10-4 and NMOS transistor N10-4 are coupled together, and are configured as an input node B.

A source terminal of PMOS transistor P10-1, a source terminal of PMOS transistor P10-2 and a source terminal of PMOS transistor P10-3 are coupled to the voltage supply VDD. A source terminal of NMOS transistor N10-3 and a source terminal of NMOS transistor N10-4 are each coupled to the reference voltage supply VSS.

A source terminal of PMOS transistor P10-4, a drain terminal of PMOS transistor P10-3, a drain terminal of PMOS transistor P10-2 and a drain terminal of PMOS transistor P10-1 are coupled to each other.

A source terminal of NMOS transistor N10-1 and a drain terminal of NMOS transistor N10-2 are coupled to each other. A source terminal of NMOS transistor N10-2 and a drain terminal of NMOS transistor N10-3 are coupled to each other.

A drain terminal of PMOS transistor P10-4, a drain terminal of NMOS transistor N10-1 and a drain terminal of NMOS transistor N10-4 are coupled to each other, and are configured as an output node ZN.

In some embodiments, one or more of the drains or sources are flipped with the other.

Other configurations, arrangements or other circuits in integrated circuit 1000 are within the scope of the present disclosure.

Figure 11:
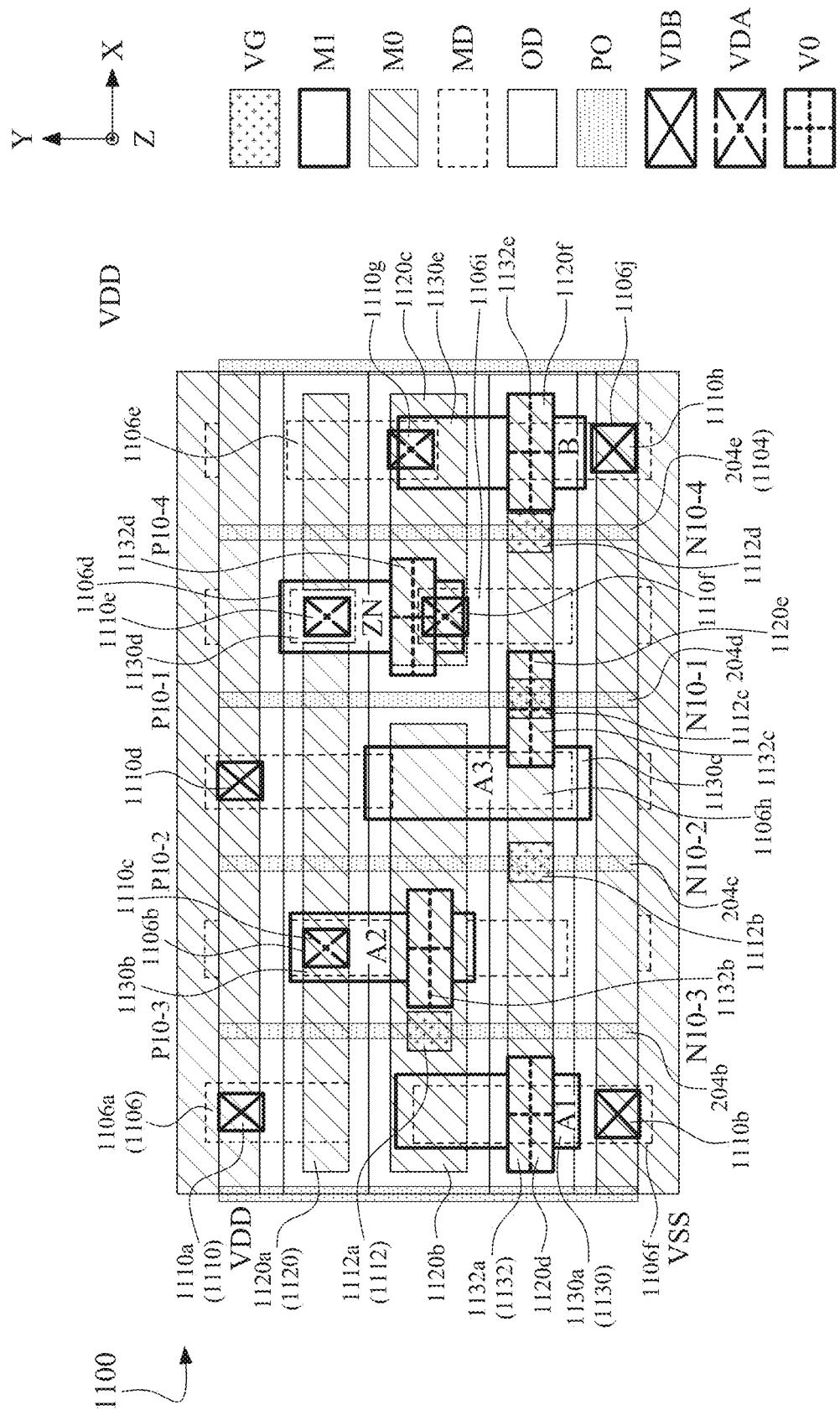
FIG. 11 is a top view of an integrated circuit, in accordance with some embodiments.

FIG. 11 is a top view of an integrated circuit 1100, in accordance with some embodiments.

Integrated circuit 1100 is manufactured by a corresponding layout design similar to integrated circuit 1100. Integrated circuit 1100 is an embodiment of integrated circuit 1000.

Integrated circuit 1100 is a variation of integrated circuit 200 (FIGS. 2A-2E), 500 (FIG. 5), 700 (FIG. 7) or 900 (FIG. 9), and similar detailed description is therefore omitted.

Integrated circuit 1100 includes at least the set of active regions 202, the insulating region 203, a set of gates 1104, a set of contacts 1106, a set of vias 1110, a set of vias 1112, a set of conductors 1120, the set of conductors 222, a set of conductors 1130, a set of vias 1132 and the substrate 290.

In comparison with integrated circuit 200 of FIGS. 2A-2B, the set of gates 1104 replaces the set of gates 204 of FIGS. 2A-2C, the set of contacts 1106 replaces the set of contacts 206 of FIG. 2A, the set of vias 1110 replaces the set of vias 210 of FIGS. 2B, the set of vias 1112 replaces the set of vias 212 of FIG. 2B, the set of conductors 1120 replaces the set of conductors 220 of FIG. 2B, the set of conductors 1130 replaces the set of conductors 230 of FIG. 2B, the set of vias 1132 replaces the set of vias 232 of FIG. 2B, and similar detailed description is therefore omitted.

The set of gates 1104 includes one or more of gates 204a, 204b, 204c, 204d, 204e or 204f.

Gate 204b corresponds to the gates of PMOS transistor P10-3 and NMOS transistor N10-3. Gate 204c corresponds to the gates of PMOS transistor P10-2 and NMOS transistor N10-2. Gate 204d corresponds to the gates of PMOS transistor P10-1 and NMOS transistor N10-1. Gate 204e corresponds to the gates of PMOS transistor P10-4 and NMOS transistor N10-4. In some embodiments, gates 204a and 204f are dummy gates.

Other configurations, arrangements on other layout levels or quantities of gates in the set of gates 1104 are within the scope of the present disclosure.

The set of contacts 1106 includes at least contact 1106a, 1106b, 1106c, 1106d, 1106e, 1106f, 1106g, 1106h, 1106i or 1106j.

In comparison with integrated circuit 200, at least contact 1106a, 1106b, 1106c, 1106d, 1106e, 1106f, 1106g, 1106h, 1106i or 1106j replaces at least corresponding contact 206a, 206b, 206c, 206d, 206e, 206f, 206g, 206h, 206i or 206j, and similar detailed description is therefore omitted.

Contact 1106a is electrically coupled to a source of PMOS transistor P10-3. Contact 1106b is electrically coupled to a drain of PMOS transistor P10-3 and a drain of PMOS transistor P10-2. Contact 1106c is electrically coupled to a source of PMOS transistor P10-2 and a source of PMOS transistor P10-1. Contact 1106d is electrically coupled to a drain of PMOS transistor P10-1 and a source of PMOS transistor P10-4. Contact 1106e is electrically coupled to a drain of PMOS transistor P10-4.

Contact 1106f is electrically coupled to a source of NMOS transistor N10-3. Contact 1106g is electrically coupled to a drain of NMOS transistor N10-3 and a source of NMOS transistor N10-2. Contact 1106h is electrically coupled to a drain of NMOS transistor N10-2 and a source of NMOS transistor N10-1. Contact 1106i is electrically coupled to a drain of NMOS transistor N10-1 and a drain of NMOS transistor N10-4. Contact 1106j is electrically coupled to a source of NMOS transistor N10-4.

Other configurations, arrangements on other layout levels or quantities of conductors in the set of contacts 1106 are within the scope of the present disclosure.

The set of vias 1110 includes at least via 1110a, 1110b, . . . , 1110g or 1110h.

In comparison with integrated circuit 200, at least via 1110a, 1110b, . . . , 1110g or 1110h replaces one or more of via 210a, 210b, . . . , 210d or 210e, and similar detailed description is therefore omitted.

Via 1110a is between conductor 222a and contact 1106a, and electrically couples conductor 222a and contact 1106a together. Via 1110b is between conductor 222b and contact 1106f, and electrically couples conductor 222b and contact 1106f together. Via 1110c is between conductor 1120a and contact 1106b, and electrically couples conductor 1120a and contact 1106b together. Via 1110d is between conductor 222a and contact 1106c, and electrically couples conductor 222a and contact 1106c together. Via 1110e is between conductor 1120a and contact 1106d, and electrically couples conductor 1120a and contact 1106d together. Via 1110f is between conductor 1120c and contact 1106i, and electrically couples conductor 1120c and contact 1106i together. Via 1110g is between conductor 1120c and contact 1106e, and electrically couples conductor 1120c and contact 1106e together. Via 1110h is between conductor 222b and contact 1106j, and electrically couples conductor 222b and contact 1106j together.

Other configurations, arrangements on other layout levels or quantities of vias in the set of vias 1110 are within the scope of the present disclosure.

The set of vias 1112 includes at least via 1112a, 1112b, 1112c or 1112d.

In comparison with integrated circuit 200, via 1112a, 1112b, 1112c, 1112d replaces corresponding via 212a, 212b, 212c, 212d, and similar detailed description is therefore omitted.

Via 1112a is between conductor 1120b and gate 204b, and electrically couples conductor 1120b and gate 204b together. Via 1112b is between conductor 1120d and gate 204c, and electrically couples conductor 1120d and gate 204c together. Via 1112c is between conductor 1120e and gate 204d, and electrically couples conductor 1120e and gate 204d together. Via 1112d is between conductor 1120f and gate 204e, and electrically couples conductor 1120f and gate 204e together.

Other configurations, arrangements on other layout levels or quantities of vias in the set of vias 1112 are within the scope of the present disclosure.

The set of conductors 1120 includes at least conductor 1120a, 1120b, 1120c, 1120d, 1120e or 1120f.

In comparison with integrated circuit 200, conductor 1120a replaces conductor 220a, conductors 1120b and 1120c replace conductor 220b, and conductors 1120d, 1120e and 1120f replace conductor 220c, and similar detailed description is therefore omitted.

Other configurations, arrangements on other layout levels or quantities of conductors in the set of conductors 1120 are within the scope of the present disclosure.

The set of conductors 1130 includes at least conductor 1130a, 1130b, 1130c, 1130d or 1130e.

In comparison with integrated circuit 200, conductor 1130a, 1130b, 1130c, 1130d or 1130e replaces corresponding conductor 230a, 230b, 230c, 230d or 230e, and similar detailed description is therefore omitted.

Each of conductors 1130a, 1130b, 1130d and 1130e are similar to conductor 230d, and conductor 1130c is similar to conductor 230c, and similar detailed description is therefore omitted.

Other configurations, arrangements on other layout levels or quantities of conductors in the set of conductors 1130 are within the scope of the present disclosure.

The set of vias 1132 includes at least via 1132a, 1132b, 1132c, 1132d or 1132e.

In comparison with integrated circuit 200, at least via 1132a, 1132b, 1132d or 1132e replaces at least via 232b, and at least via 1132c replaces at least via 232a, and similar detailed description is therefore omitted.

Via 1132a is between conductor 1120d and conductor 1130a, and electrically couples conductor 1120d and conductor 1130a together. Via 1132b is between conductor 1120b and conductor 1130b, and electrically couples conductor 1120b and conductor 1130b together. Via 1132c is between conductor 1120e and conductor 1130c, and electrically couples conductor 1120e and conductor 1130c together. Via 1132d is between conductor 1120c and conductor 1130d, and electrically couples conductor 1120c and conductor 1130d together. Via 1132e is between conductor 1120f and conductor 1130e, and electrically couples conductor 1120f and conductor 1130e together.

Other configurations, arrangements on other layout levels or quantities of vias in the set of vias 1132 are within the scope of the present disclosure.

Conductor 1130a corresponds to the input pin (e.g., input node A1) of the gates of PMOS transistor P10-2 and NMOS transistor N10-2. For example, conductor 1130a is electrically coupled to conductor 1120d by via 1132a, and conductor 1120d is electrically coupled to gate 204c by via 1112b.

Conductor 1130b corresponds to the input pin (e.g., input node A2) of the gates of PMOS transistor P10-3 and NMOS transistor N10-3. For example, conductor 1130b is electrically coupled to conductor 1120b by via 1132b, and conductor 1120b is electrically coupled to gate 204b by via 1112a.

Conductor 1130c corresponds to the input pin (e.g., input node A3) of the gates of PMOS transistor P10-1 and NMOS transistor N10-1. For example, conductor 1130c is electrically coupled to conductor 1120e by via 1132c, and conductor 1120e is electrically coupled to gate 204d by via 1112c.

Conductor 1130d corresponds to the output pin (e.g., output node ZN) of the drain of PMOS transistor P10-4, and the drains of NMOS transistors N10-1 and N10-4. For example, conductor 1130d is electrically coupled to conductor 1120c by via 1132d, conductor 1120c is electrically coupled to contact 1106e by via 1110g, and to contact 1106i by via 1110f. Furthermore, contact 1106e is electrically coupled to the drain of PMOS transistor P10-4, and contact 1106i is electrically coupled to the drain of NMOS transistor N10-1 and the drain of NMOS transistor N10-4.

Conductor 1130e corresponds to the input pin (e.g., input node B) of the gates of PMOS transistor P10-4 and NMOS transistor N10-4. For example, conductor 1130e is electrically coupled to conductor 1120f by via 1132e, and conductor 1120f is electrically coupled to gate 204e by via 1112d.

Other materials, configurations, arrangements on other layout levels or quantities of elements in integrated circuit 1100 are within the scope of the present disclosure.

In some embodiments, integrated circuit 1100 achieves one or more of the benefits discussed above in at least FIG. 1A-1D, 2A-2E, 3A-3D, 5, 7 or 9, or discussed hereinafter.

Figure 12:
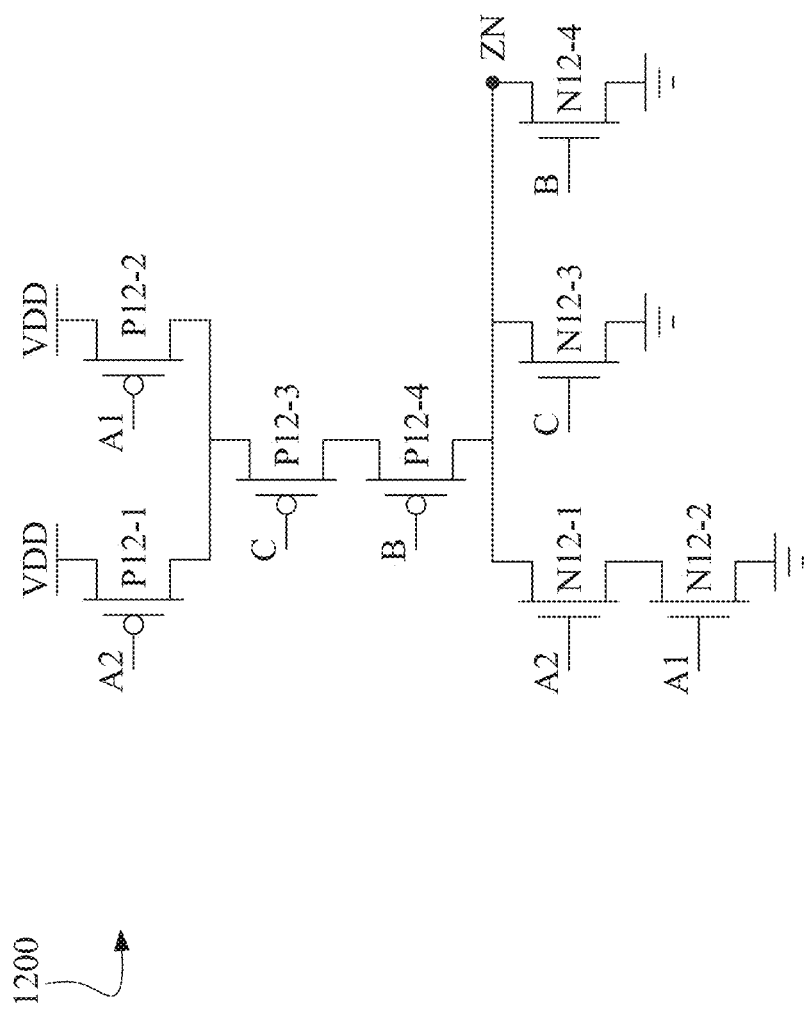
FIG. 12 is a circuit diagram of an integrated circuit, in accordance with some embodiments.

FIG. 12 is a circuit diagram of an integrated circuit 1200, in accordance with some embodiments. In some embodiments, integrated circuit 1200 is a 2-1-1 AOI circuit. A 2-1-1 AOI circuit is used for illustration, other types of circuits including other types of AOI circuits are within the scope of the present disclosure.

Integrated circuit 1200 includes PMOS transistors P12-1, P12-2, P12-3 and P12-4 coupled to NMOS transistors N12-1, N12-2, N12-3 and N12-4.

A gate terminal of PMOS transistor P12-1 and NMOS transistor N12-1 are coupled together, and are configured as an input node A2. A gate terminal of PMOS transistor P12-2 and NMOS transistor N12-2 are coupled together, and are configured as an input node A1. A gate terminal of PMOS transistor P12-3 and NMOS transistor N12-3 are coupled together, and are configured as an input node C. A gate terminal of PMOS transistor P12-4 and NMOS transistor N12-4 are coupled together, and are configured as an input node B.

A source terminal of PMOS transistor P12-1 and a source terminal of PMOS transistor P12-2 are coupled to the voltage supply VDD. A source terminal of NMOS transistor N12-2, a source terminal of NMOS transistor N12-3 and a source terminal of NMOS transistor N12-4 are each coupled to the reference voltage supply VSS.

A source terminal of PMOS transistor P12-3, a drain terminal of PMOS transistor P12-1 and a drain terminal of PMOS transistor P12-2 are coupled to each other. A source terminal of PMOS transistor P12-4 and a drain terminal of PMOS transistor P12-3 are coupled to each other.

A source terminal of NMOS transistor N12-1 and a drain terminal of NMOS transistor N12-2 are coupled to each other.

A drain terminal of PMOS transistor P12-4, a drain terminal of NMOS transistor N12-1, a drain terminal of NMOS transistor N12-3 and a drain terminal of NMOS transistor N12-4 are coupled to each other, and are configured as an output node ZN.

In some embodiments, one or more of the drains or sources are flipped with the other.

Other configurations, arrangements or other circuits in integrated circuit 1200 are within the scope of the present disclosure.

Figure 13:
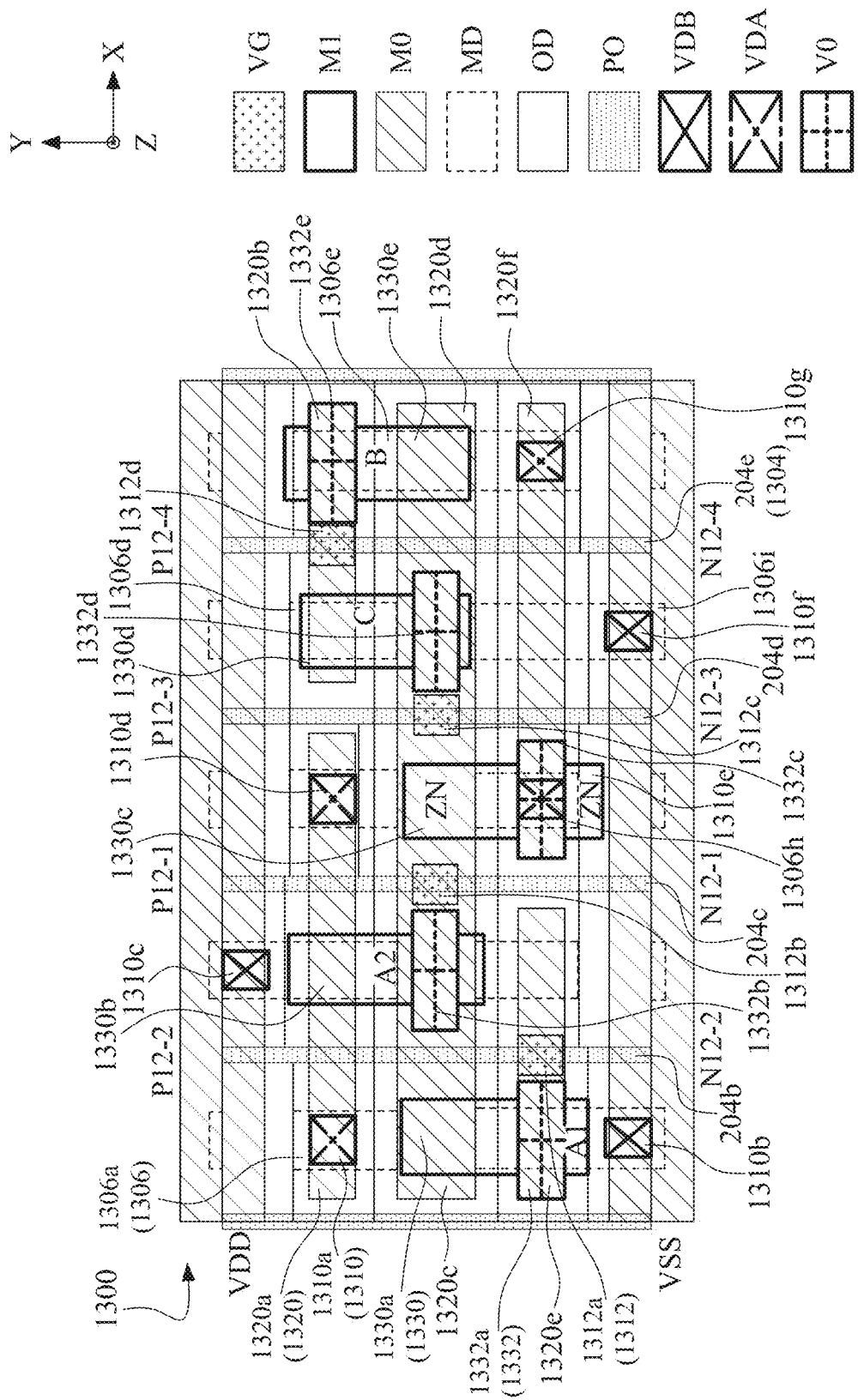
FIG. 13 is a top view of an integrated circuit, in accordance with some embodiments.

FIG. 13 is a top view of an integrated circuit 1300, in accordance with some embodiments.

Integrated circuit 1300 is manufactured by a corresponding layout design similar to integrated circuit 1300. Integrated circuit 1300 is an embodiment of integrated circuit 1200.

Integrated circuit 1300 is a variation of integrated circuit 200 (FIGS. 2A-2E), 500 (FIG. 5), 700 (FIG. 7), 900 (FIG. 9) or 1100 (FIG. 11), and similar detailed description is therefore omitted.

Integrated circuit 1300 includes at least the set of active regions 202, the insulating region 203, a set of gates 1304, a set of contacts 1306, a set of vias 1310, a set of vias 1312, a set of conductors 1320, a set of conductors 222, a set of conductors 1330, a set of vias 1332 and the substrate 290.

In comparison with integrated circuit 200 of FIGS. 2A-2B, the set of gates 1304 replaces the set of gates 204 of FIGS. 2A-2C, the set of contacts 1306 replaces the set of contacts 206 of FIG. 2A, the set of vias 1310 replaces the set of vias 210 of FIGS. 2B, the set of vias 1312 replaces the set of vias 212 of FIG. 2B, the set of conductors 1320 replaces the set of conductors 220 of FIG. 2B, the set of conductors 1330 replaces the set of conductors 230 of FIG. 2B, the set of vias 1332 replaces the set of vias 232 of FIG. 2B, and similar detailed description is therefore omitted.

The set of gates 1304 includes one or more of gates 204a, 204b, 204c, 204d, 204e or 204f.

Gate 204b corresponds to the gates of PMOS transistor P12-2 and NMOS transistor N12-2. Gate 204c corresponds to the gates of PMOS transistor P12-1 and NMOS transistor N12-1. Gate 204d corresponds to the gates of PMOS transistor P12-3 and NMOS transistor N12-3. Gate 204e corresponds to the gates of PMOS transistor P12-4 and NMOS transistor N12-4. In some embodiments, gates 204a and 204f are dummy gates.

Other configurations, arrangements on other layout levels or quantities of gates in the set of gates 1304 are within the scope of the present disclosure.

The set of contacts 1306 includes at least contact 1306a, 1306b, 1306c, 1306d, 1306e, 1306f, 1306g, 1306h or 1306i.

In comparison with integrated circuit 200, at least contact 1306a, 1306b, 1306c, 1306d, 1306e, 1306f, 1306g, 1306h or 1306i replaces at least corresponding contact 206a, 206b, 206c, 206d, 206e, 206f, 206g, 206h or 206i, and similar detailed description is therefore omitted.

Contact 1306a is electrically coupled to a drain of PMOS transistor P12-2. Contact 1306b is electrically coupled to a source of PMOS transistor P12-2 and a source of PMOS transistor P12-1. Contact 1306c is electrically coupled to a drain of PMOS transistor P12-1 and a source of PMOS transistor P12-3. Contact 1306d is electrically coupled to a drain of PMOS transistor P12-3 and a source of PMOS transistor P12-4. Contact 1306e is electrically coupled to a drain of PMOS transistor P12-4.

Contact 1306f is electrically coupled to a source of NMOS transistor N12-2. Contact 1306g is electrically coupled to a drain of NMOS transistor N12-2 and a source of NMOS transistor N12-1. Contact 1306h is electrically coupled to a drain of NMOS transistor N12-1 and a drain of NMOS transistor N12-3. Contact 1306i is electrically coupled to a source of NMOS transistor N12-3 and a source of NMOS transistor N12-4. Contact 1306j is electrically coupled to a drain of NMOS transistor N12-4.

Other configurations, arrangements on other layout levels or quantities of conductors in the set of contacts 1306 are within the scope of the present disclosure.

The set of vias 1310 includes at least via 1310a, 1310b, ..., 1310f or 1310g.

In comparison with integrated circuit 200, at least via 1310a, 1310b, ..., 1310f or 1310g replaces one or more of via 210a, 210b, ..., 210d or 210e, and similar detailed description is therefore omitted.

Via 1310a is between conductor 1320a and contact 1306a, and electrically couples conductor 1320a and contact 1306a together. Via 1310b is between conductor 222b and contact 1306f, and electrically couples conductor 222b and contact 1306f together. Via 1310c is between conductor 222a and contact 1306b, and electrically couples conductor 222a and contact 1306b together. Via 1310d is between conductor 1320a and contact 1306c, and electrically couples conductor 1320a and contact 1306c together. Via 1310e is between conductor 1320f and contact 1306h, and electrically couples conductor 1320f and contact 1306h together. Via 1310f is between conductor 222b and contact 1306i, and electrically couples conductor 222b and contact 1306i together. Via 1310g is between conductor 1320f and contact 1306e, and electrically couples conductor 1320f and contact 1306e together.

Other configurations, arrangements on other layout levels or quantities of vias in the set of vias 1310 are within the scope of the present disclosure.

The set of vias 1312 includes at least via 1312a, 1312b, 1312c or 1312d.

In comparison with integrated circuit 200, via 1312a, 1312b, 1312c, 1312d replaces corresponding via 212a, 212b, 212c, 212d, and similar detailed description is therefore omitted.

Via 1312a is between conductor 1320e and gate 204b, and electrically couples conductor 1320e and gate 204b together. Via 1312b is between conductor 1320c and gate 204c, and electrically couples conductor 1320c and gate 204c together. Via 1312c is between conductor 1320d and gate 204d, and electrically couples conductor 1320d and gate 204d together. Via 1312d is between conductor 1320b and gate 204e, and electrically couples conductor 1320b and gate 204e together.

Other configurations, arrangements on other layout levels or quantities of vias in the set of vias 1312 are within the scope of the present disclosure.

The set of conductors 1320 includes at least conductor 1320a, 1320b, 1320c, 1320d, 1320e or 1320f.

In comparison with integrated circuit 200, conductors 1320a and 1320b replace conductor 220a, conductors 1320c and 1320d replace conductor 220b, and conductors 1320e and 1320f replace conductor 220c, and similar detailed description is therefore omitted.

Other configurations, arrangements on other layout levels or quantities of conductors in the set of conductors 1320 are within the scope of the present disclosure.

The set of conductors 1330 includes at least conductor 1330a, 1330b, 1330c, 1330d or 1330e.

In comparison with integrated circuit 200, conductor 1330a, 1330b, 1330c, 1330d or 1330e replaces corresponding conductor 230a, 230b, 230c, 230d or 230e, and similar detailed description is therefore omitted.

Each of conductors 1330*a*, 1330*b*, 1330*c*, 1330*d* and 1330*e* are similar to conductor 230*d*, and similar detailed description is therefore omitted.

Other configurations, arrangements on other layout levels or quantities of conductors in the set of conductors 1330 are within the scope of the present disclosure.

The set of vias 1332 includes at least via 1332*a*, 1332*b*, 1332*c*, 1332*d* or 1332*e*.

In comparison with integrated circuit 200, at least via 1332*a*, 1332*b*, 1332*c*, 1332*d* or 1332*e* replaces at least via 232*b*, and similar detailed description is therefore omitted.

Via 1332*a* is between conductor 1320*e* and conductor 1330*a*, and electrically couples conductor 1320*e* and conductor 1330*a* together. Via 1332*b* is between conductor 1320*c* and conductor 1330*b*, and electrically couples conductor 1320*c* and conductor 1330*b* together. Via 1332*c* is between conductor 1320*f* and conductor 1330*c*, and electrically couples conductor 1320*f* and conductor 1330*c* together. Via 1332*d* is between conductor 1320*d* and conductor 1330*d*, and electrically couples conductor 1320*d* and conductor 1330*d* together. Via 1332*e* is between conductor 1320*b* and conductor 1330*e*, and electrically couples conductor 1320*b* and conductor 1330*e* together.

Other configurations, arrangements on other layout levels or quantities of vias in the set of vias 1332 are within the scope of the present disclosure.

Conductor 1330*a* corresponds to the input pin (e.g., input node A1) of the gates of PMOS transistor P12-2 and NMOS transistor N12-2. For example, conductor 1330*a* is electrically coupled to conductor 1320*e* by via 1332*a*, and conductor 1320*e* is electrically coupled to gate 204*b* by via 1312*a*.

Conductor 1330*b* corresponds to the input pin (e.g., input node A2) of the gates of PMOS transistor P12-1 and NMOS transistor N12-1. For example, conductor 1330*b* is electrically coupled to conductor 1320*c* by via 1332*b*, and conductor 1320*c* is electrically coupled to gate 204*c* by via 1312*b*.

Conductor 1330*c* corresponds to the output pin (e.g., output node ZN) of the drain of PMOS transistor P12-4, and the drains of NMOS transistors N12-1, N12-3 and N12-4. For example, conductor 1330*c* is electrically coupled to conductor 1320*f* by via 1332*c*, conductor 1320*f* is electrically coupled to contact 1306*e* by via 1310*g*, and to contact 1306*h* by via 1310*e*. Furthermore, contact 1306*e* is electrically coupled to the drain of PMOS transistor P12-4 and the drain of NMOS transistor N12-4, and contact 1306*h* is electrically coupled to the drain of NMOS transistor N12-1 and the drain of NMOS transistor N12-3.

Conductor 1330*d* corresponds to the input pin (e.g., input node C) of the gates of PMOS transistor P12-3 and NMOS transistor N12-3. For example, conductor 1330*d* is electrically coupled to conductor 1320*d* by via 1332*d*, and conductor 1320*d* is electrically coupled to gate 204*d* by via 1312*c*.

Conductor 1330*e* corresponds to the input pin (e.g., input node B) of the gates of PMOS transistor P12-4 and NMOS transistor N12-4. For example, conductor 1330*e* is electrically coupled to conductor 1320*b* by via 1332*e*, and conductor 1320*b* is electrically coupled to gate 204*e* by via 1312*d*.

Other materials, configurations, arrangements on other layout levels or quantities of elements in integrated circuit 1300 are within the scope of the present disclosure.

In some embodiments, integrated circuit 1300 achieves one or more of the benefits discussed above in at least FIG. 1A-1D, 2A-2E, 3A-3D, 5, 7, 9 or 11, or discussed hereinafter.

Figure 14:
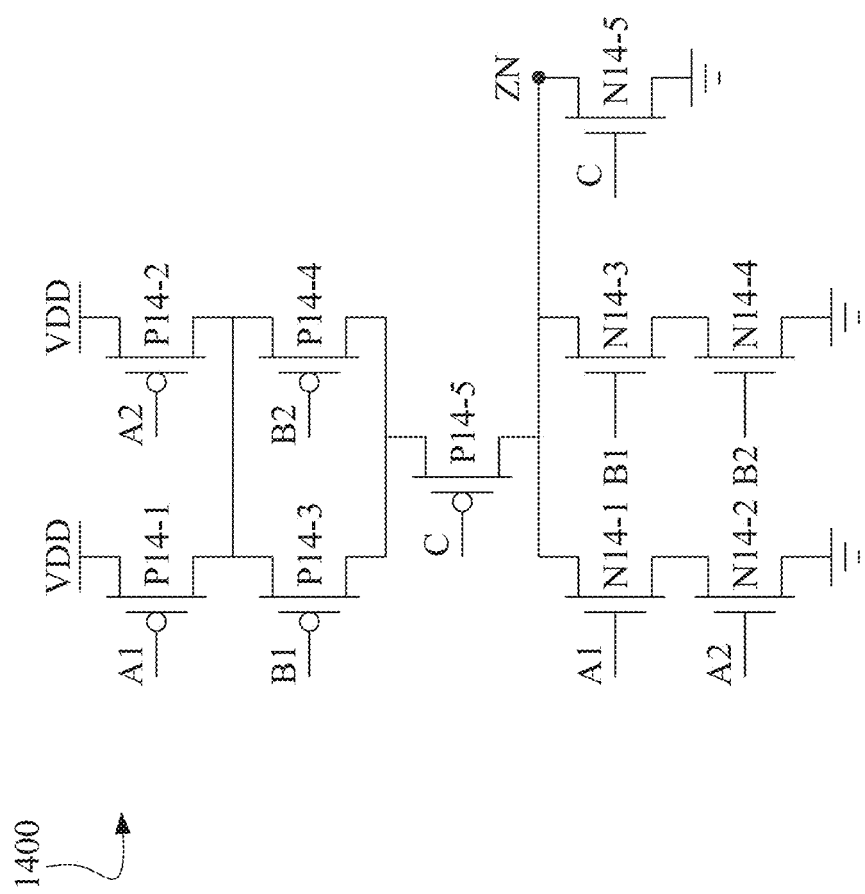
FIG. 14 is a circuit diagram of an integrated circuit, in accordance with some embodiments.

FIG. 14 is a circuit diagram of an integrated circuit 1400, in accordance with some embodiments. In some embodiments, integrated circuit 1400 is a 2-2-1 AOI circuit. A 2-2-1 AOI circuit is used for illustration, other types of circuits including other types of AOI circuits are within the scope of the present disclosure.

Integrated circuit 1400 includes PMOS transistors P14-1, P14-2, P14-3, P14-4 and P14-5 coupled to NMOS transistors N14-1, N14-2, N14-3, N14-4 and N14-5.

A gate terminal of PMOS transistor P14-1 and NMOS transistor N14-1 are coupled together, and are configured as an input node A1. A gate terminal of PMOS transistor P14-2 and NMOS transistor N14-2 are coupled together, and are configured as an input node A2. A gate terminal of PMOS transistor P14-3 and NMOS transistor N14-3 are coupled together, and are configured as an input node B1. A gate terminal of PMOS transistor P14-4 and NMOS transistor N14-4 are coupled together, and are configured as an input node B2. A gate terminal of PMOS transistor P14-5 and NMOS transistor N14-5 are coupled together, and are configured as an input node C.

A source terminal of PMOS transistor P14-1 and a source terminal of PMOS transistor P14-2 are coupled to the voltage supply VDD. A source terminal of NMOS transistor N14-2, a source terminal of NMOS transistor N14-4 and a source terminal of NMOS transistor N14-5 are each coupled to the reference voltage supply VSS.

A source terminal of PMOS transistor P14-3, a source terminal of PMOS transistor P14-4, a drain terminal of PMOS transistor P14-1 and a drain terminal of PMOS transistor P14-2 are coupled to each other. A source terminal of PMOS transistor P14-5, a drain terminal of PMOS transistor P14-3 and a drain terminal of PMOS transistor P14-4 are coupled to each other.

A source terminal of NMOS transistor N14-1 and a drain terminal of NMOS transistor N14-2 are coupled to each other. A source terminal of NMOS transistor N14-3 and a drain terminal of NMOS transistor N14-4 are coupled to each other.

A drain terminal of PMOS transistor P14-5, a drain terminal of NMOS transistor N14-1, a drain terminal of NMOS transistor N14-3 and a drain terminal of NMOS transistor N14-5 are coupled to each other, and are configured as an output node ZN.

In some embodiments, one or more of the drains or sources are flipped with the other.

Other configurations, arrangements or other circuits in integrated circuit 1400 are within the scope of the present disclosure.

Figure 15:
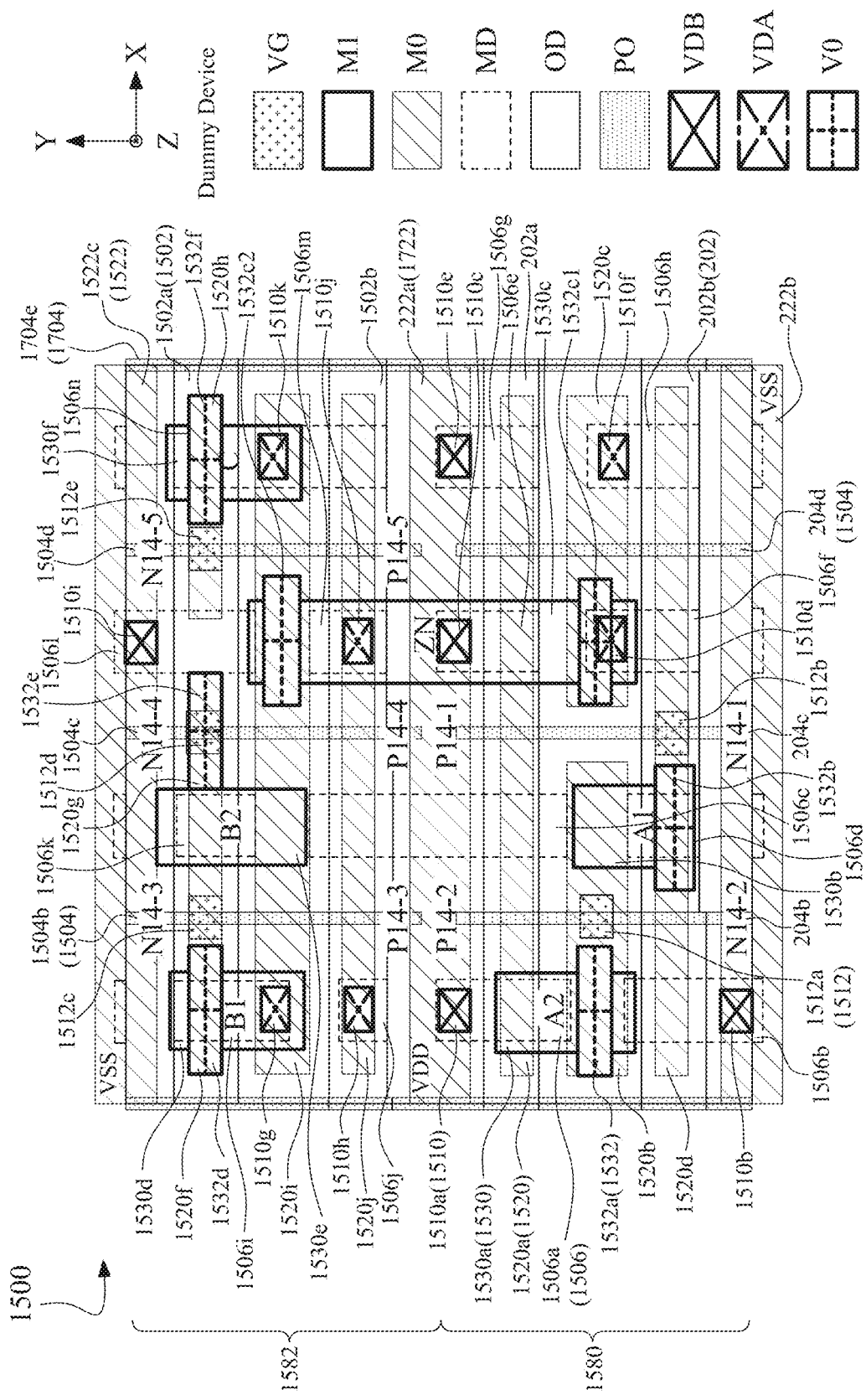
FIG. 15 is a top view of an integrated circuit, in accordance with some embodiments.

FIG. 15 is a top view of an integrated circuit 1500, in accordance with some embodiments.

Integrated circuit 1500 is manufactured by a corresponding layout design similar to integrated circuit 1500. Integrated circuit 1500 is an embodiment of integrated circuit 1400.

Integrated circuit 1500 is a double height cell. Integrated circuit 1500 includes a cell region 1580 and a cell region 1582 that are directly next to or adjacent to each other.

Integrated circuit 1500 is a variation of integrated circuit 200 (FIGS. 2A-2E), 500 (FIG. 5), 700 (FIG. 7), 900 (FIG. 9) or 1100 (FIG. 11) or 1300 (FIG. 13), and similar detailed description is therefore omitted.

Integrated circuit 1500 includes at least the set of active regions 202 and 1502, the insulating region 203, a set of gates 1504, a set of contacts 1506, a set of vias 1510, a set of vias 1512, a set of conductors 1520, a set of conductors 1522, a set of conductors 1530, a set of vias 1532 and the substrate 290.

In comparison with integrated circuit 200 of FIGS. 2A-2B, the set of gates 1504 replaces the set of gates 204 of FIGS. 2A-2C, the set of contacts 1506 replaces the set of contacts 206 of FIG. 2A, the set of vias 1510 replaces the set of vias 210 of FIGS. 2B, the set of vias 1512 replaces the set of vias 212 of FIG. 2B, the set of conductors 1520 replaces the set of conductors 220 of FIG. 2B, the set of conductors 1530 replaces the set of conductors 230 of FIG. 2B, the set of vias 1532 replaces the set of vias 232 of FIG. 2B, and similar detailed description is therefore omitted.

The set of active regions 1502 includes one or more of active regions 1502a or 1502b embedded in the substrate 290.

In comparison with integrated circuit 200, at least active region 1502a or 1502b is similar to corresponding active region 202b or 202a, and similar detailed description is therefore omitted.

The set of gates 1504 includes one or more of gates 204a, 204b, 204c, 204d, 204e, 1504b, 1504c or 1504d.

Gate 204b corresponds to the gates of PMOS transistor P14-2 and NMOS transistor N14-2. Gate 204c corresponds to the gates of PMOS transistor P14-1 and NMOS transistor N14-1. Gate 1504b corresponds to the gates of PMOS transistor P14-3 and NMOS transistor N14-3. Gate 1504c corresponds to the gates of PMOS transistor P14-4 and NMOS transistor N14-4. Gate 1504d corresponds to the gates of PMOS transistor P14-5 and NMOS transistor N14-5.

In some embodiments, gates 204a, 204d and 204e are dummy gates.

Other configurations, arrangements on other layout levels or quantities of gates in the set of gates 1504 are within the scope of the present disclosure.

The set of contacts 1506 includes at least contact 1506a, 1506b, 1506c, 1506d, 1506e, 1506f, 1506g, 1506h, 1506i, 1506j, 1506k, 1506l, 1506m or 1506n.

In comparison with integrated circuit 200, at least contact 1506a, 1506b, 1506c, 1506d, 1506e, 1506f, 1506g, 1506h or 1506i replaces at least corresponding contact 206a, 206b, 206c, 206d, 206e, 206f, 206g, 206h or 206i, and similar detailed description is therefore omitted.

In comparison with integrated circuit 200, at least contact 1506j, 1506k, 1506l, 1506m or 1506n is similar to at least corresponding contact 206a, 206b, 206c, 206d or 206e, and similar detailed description is therefore omitted.

Contact 1506a is electrically coupled to a source of PMOS transistor P14-2. Contact 1506b is electrically coupled to a source of NMOS transistor N14-2. Contact 1506c is electrically coupled to a drain of PMOS transistor P14-2, a drain of PMOS transistor P14-1, a source of PMOS transistor P14-3 and a source of PMOS transistor P14-4. Contact 1506d is electrically coupled to a drain of NMOS transistor N14-2 and a source of NMOS transistor N14-1. Contact 1506e is electrically coupled to a source of PMOS transistor P14-2. Contact 1506f is electrically coupled to a drain of NMOS transistor N14-1.

Contact 1506g is electrically coupled to a drain/source of a first dummy transistor. Contact 1506h is electrically coupled to a drain/source of a second dummy transistor.

Contact 1506i is electrically coupled to a drain of NMOS transistor N14-3. Contact 1506j is electrically coupled to a drain of PMOS transistor P14-3. Contact 1506k is electrically coupled to a source of NMOS transistor N14-3 and a drain of NMOS transistor N14-4. Contact 1506l is electrically coupled to a source of NMOS transistor N14-4 and a source of NMOS transistor N14-5. Contact 1506m is electrically coupled to a drain of PMOS transistor P14-4 and a source of PMOS transistor P14-5. Contact 1506n is electrically coupled to a drain of NMOS transistor N14-5 and a drain of PMOS transistor P14-5.

Other configurations, arrangements on other layout levels or quantities of conductors in the set of contacts 1506 are within the scope of the present disclosure.

The set of vias 1510 includes at least via 1510a, 1510b, . . . , 1510f or 1510g.

In comparison with integrated circuit 200, at least via 1510a, 1510b, . . . , 1510j or 1510k replaces one or more of via 210a, 210b, . . . , 210d or 210e, and similar detailed description is therefore omitted.

Via 1510a is between conductor 222a and contact 1506a, and electrically couples conductor 222a and contact 1506a together. Via 1510b is between conductor 222b and contact 1506b, and electrically couples conductor 222b and contact 1506b together. Via 1510c is between conductor 222a and contact 1506e, and electrically couples conductor 222a and contact 1506e together. Via 1510d is between conductor 1520c and contact 1506f, and electrically couples conductor 1520c and contact 1506f together. Via 1510e is between conductor 222a and contact 1506g, and electrically couples conductor 222a and contact 1506g together. Via 1510f is between conductor 1520c and contact 1506h, and electrically couples conductor 1520c and contact 1506h together.

Via 1510g is between conductor 1520i and contact 1506i, and electrically couples conductor 1520i and contact 1506i together. Via 1510h is between conductor 1520j and contact 1506j, and electrically couples conductor 1520j and contact 1506j together. Via 1510i is between conductor 1522c and contact 1506l, and electrically couples conductor 1522c and contact 1506l together. Via 1510j is between conductor 1520j and contact 1506m, and electrically couples conductor 1520j and contact 1506m together. Via 1510k is between conductor 1520i and contact 1506n, and electrically couples conductor 1520i and contact 1506n together.

Other configurations, arrangements on other layout levels or quantities of vias in the set of vias 1510 are within the scope of the present disclosure.

The set of vias 1512 includes at least via 1512a, 1512b, 1512c, 1512d or 1512e.

In comparison with integrated circuit 200, via 1512a, 1512b, 1512c, 1512d, 1512e replaces one or more of via 212a, 212b, 212c, 212d, and similar detailed description is therefore omitted.

Via 1512a is between conductor 1520b and gate 204b, and electrically couples conductor 1520b and gate 204b together. Via 1512b is between conductor 1520d and gate 204c, and electrically couples conductor 1520d and gate 204c together. Via 1512c is between conductor 1520f and gate 1504b, and electrically couples conductor 1520f and gate 1504b together. Via 1512d is between conductor 1520g and gate 1504c, and electrically couples conductor 1520g and gate 1504c together. Via 1512e is between conductor 1520h and gate 1504d, and electrically couples conductor 1520h and gate 1504d together.

Other configurations, arrangements on other layout levels or quantities of vias in the set of vias 1512 are within the scope of the present disclosure.

The set of conductors 1520 includes at least conductor 1520a, 1520b, 1520c, 1520d, 1520e or 1520f.

In comparison with integrated circuit 200, conductor 1520a replaces conductor 220a, conductors 1520b and 1520c replace conductor 220b, conductors 1520d and 1520e replace conductor 220c, and similar detailed description is therefore omitted.

In comparison with integrated circuit 200, conductors 1520f, 1520g and 1520h are similar to conductor 220a, conductor 1520i is similar to conductor 220b, and conductor 1520j is similar to conductor 220c, and similar detailed description is therefore omitted.

Other configurations, arrangements on other layout levels or quantities of conductors in the set of conductors 1520 are within the scope of the present disclosure.

The set of conductors 1522 includes at least conductor 222a, 222b and 1522c.

In comparison with integrated circuit 200, conductor 1522c is similar to conductor 222b, and similar detailed description is therefore omitted.

Other configurations, arrangements on other layout levels or quantities of conductors in the set of conductors 1522 are within the scope of the present disclosure.

The set of conductors 1530 includes at least conductor 1530a, 1530b, 1530c, 1530d, 1530e or 1530f.

In comparison with integrated circuit 200, each of conductors 1530a, 1530b, 1530c, 1530d, 1530e and 1530f are similar to conductor 230d, and similar detailed description is therefore omitted.

In some embodiments, conductor 1530c is similar to conductor 306a, and similar detailed description is therefore omitted.

Other configurations, arrangements on other layout levels or quantities of conductors in the set of conductors 1530 are within the scope of the present disclosure.

The set of vias 1532 includes at least via 1532a, 1532b, 1532c1, 1532c2, 1532d, 1532e or 1532f.

In comparison with integrated circuit 200, at least via 1532a, 1532b, 1532c1, 1532c2, 1532d, 1532e or 1532f replaces at least via 232b, and similar detailed description is therefore omitted.

Via 1532a is between conductor 1520b and conductor 1530a, and electrically couples conductor 1520b and conductor 1530a together. Via 1532b is between conductor 1520d and conductor 1530b, and electrically couples conductor 1520d and conductor 1530b together. Via 1532c1 is between conductor 1520c and conductor 1530c, and electrically couples conductor 1520c and conductor 1530c together. Via 1532c2 is between conductor 1520i and conductor 1530c, and electrically couples conductor 1520i and conductor 1530c together. Via 1532d is between conductor 1520f and conductor 1530d, and electrically couples conductor 1520f and conductor 1530d together. Via 1532e is between conductor 1520g and conductor 1530e, and electrically couples conductor 1520g and conductor 1530e together. Via 1532f is between conductor 1520h and conductor 1530f, and electrically couples conductor 1520h and conductor 1530f together.

Other configurations, arrangements on other layout levels or quantities of vias in the set of vias 1532 are within the scope of the present disclosure.

Conductor 1530a corresponds to the input pin (e.g., input node A2) of the gates of PMOS transistor P14-2 and NMOS transistor N14-2. For example, conductor 1530a is electrically coupled to conductor 1520b by via 1532a, and conductor 1520b is electrically coupled to gate 204b by via 1512a.

Conductor 1530b corresponds to the input pin (e.g., input node A1) of the gates of PMOS transistor P14-1 and NMOS transistor N14-1. For example, conductor 1530b is electrically coupled to conductor 1520d by via 1532b, and conductor 1520d is electrically coupled to gate 204c by via 1512b.

Conductor 1530c corresponds to the output pin (e.g., output node ZN) of the drain of PMOS transistor P14-5, and the drains of NMOS transistors N14-1, N14-3 and N14-5. For example, conductor 1530c is electrically coupled to conductor 1520c by via 1532c1, conductor 1520c is electrically coupled to contact 1506f by via 1510d, and to contact 1506h by via 1510f. Contact 1506f is electrically coupled to the drain of NMOS transistor N14-1. Furthermore, conductor 1530c is electrically coupled to conductor 1520i by via 1532c2, conductor 1520i is electrically coupled to contact 1506i by via 1510g, and to contact 1506n by via 1510k. Contact 1506i is electrically coupled to the drain of NMOS transistor N14-3. Contact 1506n is electrically coupled to the drain of NMOS transistor N14-5 and the drain of PMOS transistor P15-5.

Conductor 1530d corresponds to the input pin (e.g., input node B1) of the gates of PMOS transistor P14-3 and NMOS transistor N14-3. For example, conductor 1530d is electrically coupled to conductor 1520f by via 1532d, and conductor 1520f is electrically coupled to gate 1504b by via 1512c.

Conductor 1530e corresponds to the input pin (e.g., input node B2) of the gates of PMOS transistor P14-4 and NMOS transistor N14-4. For example, conductor 1530e is electrically coupled to conductor 1520g by via 1532e, and conductor 1520g is electrically coupled to gate 1504c by via 1512d.

Conductor 1530f corresponds to the input pin (e.g., input node C) of the gates of PMOS transistor P14-5 and NMOS transistor N14-5. For example, conductor 1530f is electrically coupled to conductor 1520h by via 1532f, and conductor 1520h is electrically coupled to gate 1504d by via 1512e.

Other materials, configurations, arrangements on other layout levels or quantities of elements in integrated circuit 1500 are within the scope of the present disclosure.

In some embodiments, integrated circuit 1500 achieves one or more of the benefits discussed above in at least FIG. 1A-1D, 2A-2E, 3A-3D, 5, 7, 9, 11 or 13, or discussed hereinafter.

Figure 16:
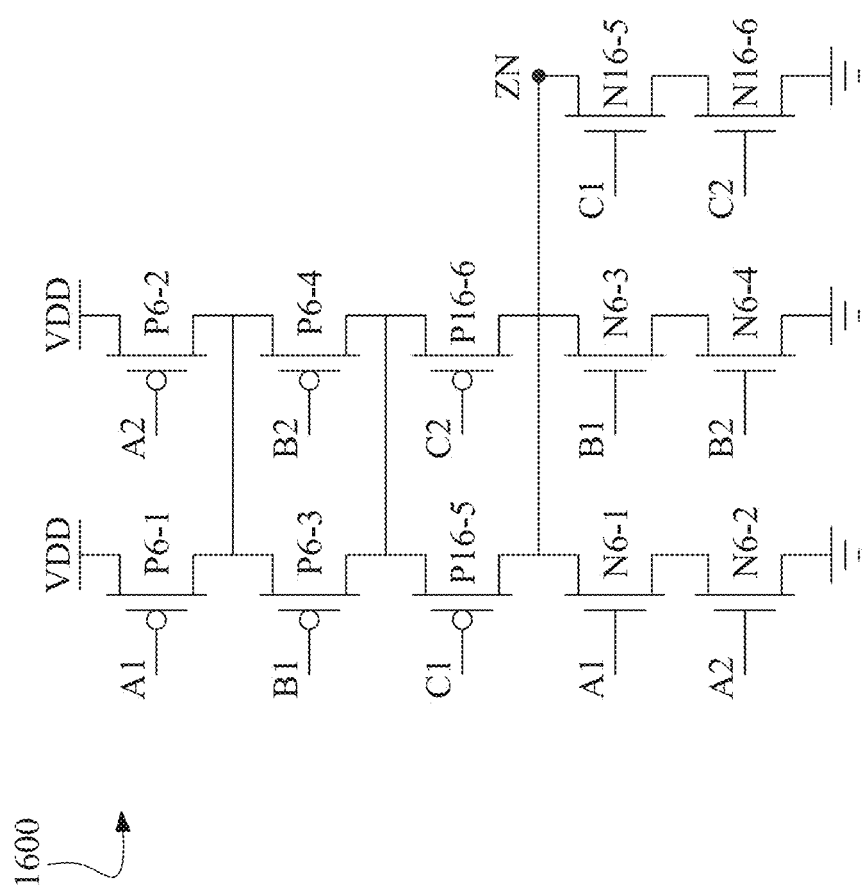
FIG. 16 is a circuit diagram of an integrated circuit, in accordance with some embodiments.

FIG. 16 is a circuit diagram of an integrated circuit 1600, in accordance with some embodiments. In some embodiments, integrated circuit 1600 is a 2-2-2 AOI circuit. A 2-2-2 AOI circuit is used for illustration, other types of circuits including other types of AOI circuits are within the scope of the present disclosure.

Integrated circuit 1600 includes PMOS transistors P6-1, P6-2, P6-3, P6-4, P16-5 and P16-6 coupled to NMOS transistors N6-1, N6-2, N6-3, N6-4, N16-5 and N16-6.

A gate terminal of PMOS transistor P6-1 and NMOS transistor N6-1 are coupled together, and are configured as an input node A1. A gate terminal of PMOS transistor P6-2 and NMOS transistor N6-2 are coupled together, and are configured as an input node A2. A gate terminal of PMOS transistor P6-3 and NMOS transistor N6-3 are coupled together, and are configured as an input node B1. A gate terminal of PMOS transistor P6-4 and NMOS transistor N6-4 are coupled together, and are configured as an input node B2. A gate terminal of PMOS transistor P16-5 and NMOS transistor N16-5 are coupled together, and are configured as an input node C1. A gate terminal of PMOS transistor P16-6 and NMOS transistor N16-6 are coupled together, and are configured as an input node C2.

A source terminal of PMOS transistor P6-1 and a source terminal of PMOS transistor P6-2 are coupled to the voltage supply VDD. A source terminal of NMOS transistor N6-2, a source terminal of NMOS transistor N6-4 and a source terminal of NMOS transistor N16-6 are each coupled to the reference voltage supply VSS.

A source terminal of PMOS transistor P6-3, a source terminal of PMOS transistor P6-4, a drain terminal of PMOS transistor P6-1 and a drain terminal of PMOS transistor P6-2 are coupled to each other. A source terminal of PMOS transistor P16-5, a source terminal of PMOS transistor P16-6, a drain terminal of PMOS transistor P6-3 and a drain terminal of PMOS transistor P6-4 are coupled to each other.

A source terminal of NMOS transistor N6-1 and a drain terminal of NMOS transistor N6-2 are coupled to each other. A source terminal of NMOS transistor N6-3 and a drain terminal of NMOS transistor N6-4 are coupled to each other. A source terminal of NMOS transistor N16-5 and a drain terminal of NMOS transistor N16-6 are coupled to each other.

A drain terminal of PMOS transistor P16-5, a drain terminal of PMOS transistor P16-6, a drain terminal of NMOS transistor N6-1, a drain terminal of NMOS transistor N6-3 and a drain terminal of NMOS transistor N16-5 are coupled to each other, and are configured as an output node ZN.

In some embodiments, one or more of the drains or sources are flipped with the other.

Other configurations, arrangements or other circuits in integrated circuit 1600 are within the scope of the present disclosure.

Figure 17:
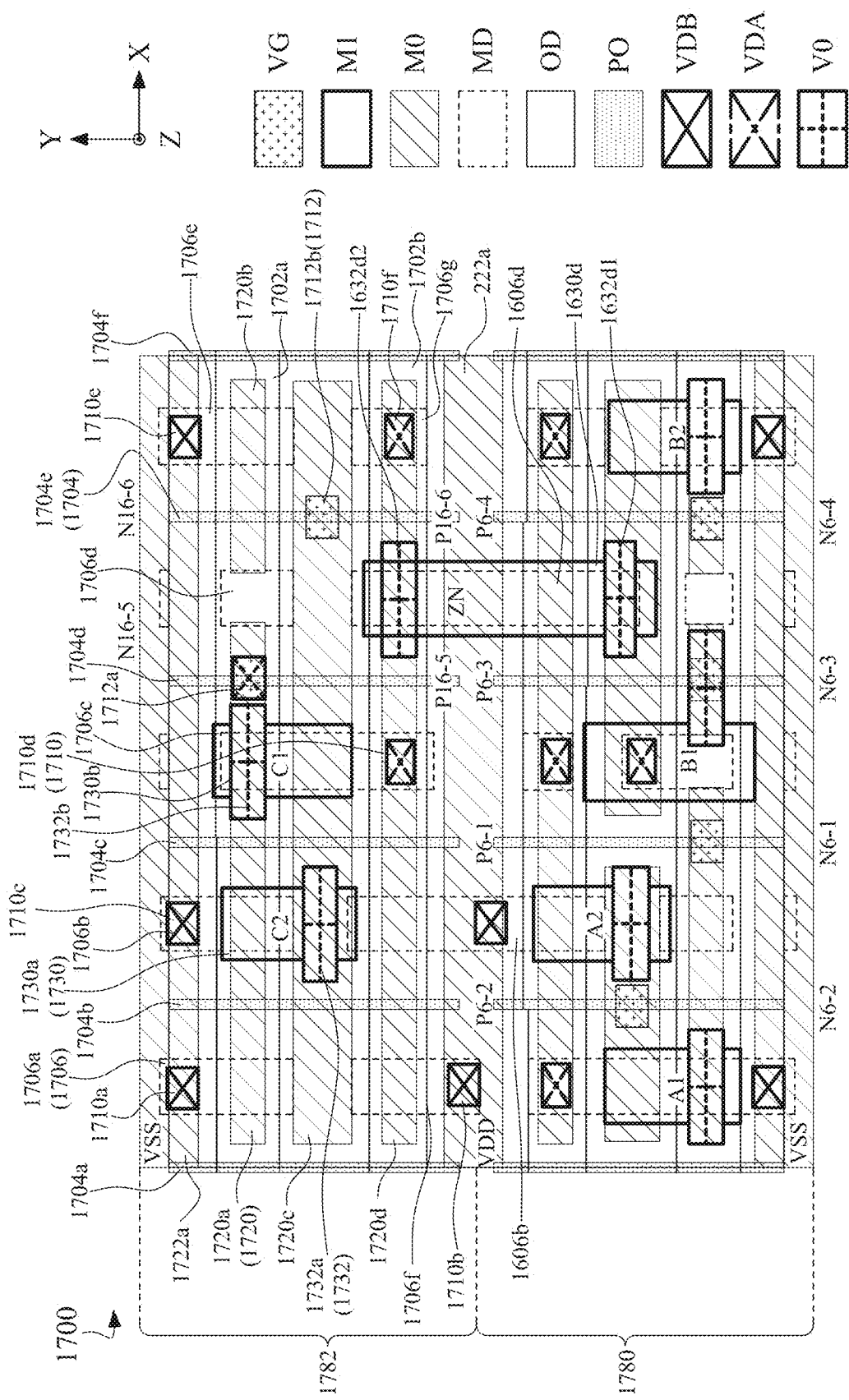
FIG. 17 is a top view of an integrated circuit, in accordance with some embodiments.

FIG. 17 is a top view of an integrated circuit 1700, in accordance with some embodiments.

Integrated circuit 1700 is manufactured by a corresponding layout design similar to integrated circuit 1700. Integrated circuit 1700 is an embodiment of integrated circuit 1600.

Integrated circuit 1700 is a variation of integrated circuit 200 (FIGS. 2A-2C) or 700 (FIG. 7), and similar detailed description is therefore omitted.

Integrated circuit 1700 includes a cell region 1780 and a cell region 1782.

Figures 3A, 3B:
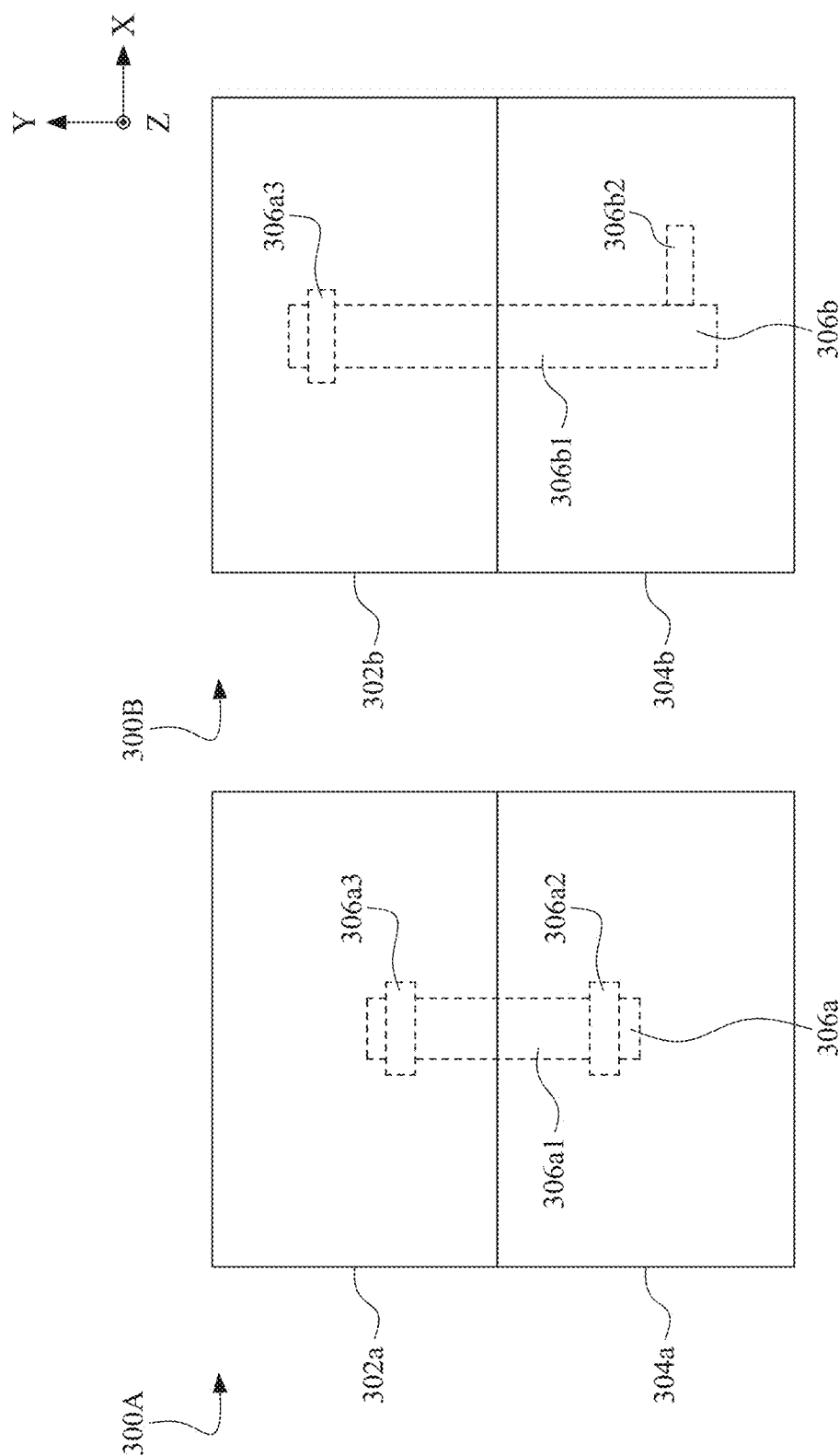

Cell region 1780 is an embodiment of cell 302a of FIG. 3A, and cell region 1782 is an embodiment of cell 302b of FIG. 3A, and similar detailed description is therefore omitted. Cell region 1780 and cell region 1782 correspond to a double height cell. Cell region 1780 and cell region 1782 are directly next to or adjacent to each other.

Cell region 1780 corresponds to a variation of integrated circuit 700 of FIG. 7, and similar detailed description is therefore omitted. For ease of illustration, similar elements in FIGS. 7 and 17 are not labelled.

In comparison with integrated circuit 700 of FIG. 7, contact 706b in the set of contacts 706 of FIG. 7 is replaced in FIG. 17 by a contact 1606b, contact 706d in the set of contacts 706 of FIG. 7 is replaced in FIG. 17 by a contact 1606d, conductor 730d in the set of conductors 730 of FIG. 7 is replaced in FIG. 17 by a conductor 1630d, via 732d in the set of vias 732 of FIG. 7 is replaced in FIG. 17 by a via 1632d1, and similar detailed description is therefore omitted.

In comparison with contact 706b of FIG. 7, contact 1606b extends from cell region 1780 to cell region 1782, and similar detailed description is therefore omitted.

In comparison with contact 706d of FIG. 7, contact 1606d extends from cell region 1780 to cell region 1782, and similar detailed description is therefore omitted.

In comparison with conductor 730d of FIG. 7, conductor 1630d extends from cell region 1780 to cell region 1782, and similar detailed description is therefore omitted.

Cell region 1782 is a variation of integrated circuit 200 of FIGS. 2A-2C, and similar detailed description is therefore omitted.

Cell region 1782 includes at least a set of active regions 1702, the insulating region 203, a set of gates 1704, a set of contacts 1706, a set of vias 1710, a set of vias 1712, a set of conductors 1720, a set of conductors 1722, a set of conductors 1730, a set of vias 1732 and the substrate 290.

In comparison with integrated circuit 200 of FIGS. 2A-2B, the set of active regions 1702 replaces the set of active regions 202 of FIGS. 2A-2C, the set of gates 1704 replaces the set of gates 204 of FIGS. 2A-2C, the set of contacts 1706 replaces the set of contacts 206 of FIG. 2A, the set of vias 1710 replaces the set of vias 210 of FIGS. 2B, the set of vias 1712 replaces the set of vias 212 of FIG. 2B, the set of conductors 1720 replaces the set of conductors 220 of FIG. 2B, the set of conductors 1722 replaces the set of conductors 222 of FIG. 2B, the set of conductors 1730 replaces the set of conductors 230 of FIG. 2B, the set of vias 1732 replaces the set of vias 232 of FIG. 2B, and similar detailed description is therefore omitted.

The set of active regions 1702 includes one or more of active regions 1702a or 1702b embedded in the substrate 290.

In comparison with integrated circuit 200, at least active region 1702a or 1702b replaces corresponding active region 202b or 202a, and similar detailed description is therefore omitted.

The set of gates 1704 includes one or more of gates 1704a, 1704b, 1704c, 1704d, 1704e or 1704f.

In comparison with integrated circuit 200, at least gate 1704a, 1704b, 1704c, 1704d, 1704e or 1704f replaces corresponding gate 204a, 204b, 204c, 204d, 204e or 204f, and similar detailed description is therefore omitted.

Gate 1704d corresponds to the gates of PMOS transistor P16-5 and NMOS transistor N16-5. Gate 1704e corresponds to the gates of PMOS transistor P16-6 and NMOS transistor N16-6.

In some embodiments, gates 1704a, 1704b, 1704c and 1704f are dummy gates.

Other configurations, arrangements on other layout levels or quantities of gates in the set of gates 1704 are within the scope of the present disclosure.

The set of contacts 1706 includes at least contact 1606b, 1606d, 1706a, 1706b, 1706c, 1706d, 1706e, 1706f or 1706g.

In comparison with integrated circuit 200, at least contact 1706a, 1706b, 1706c, 1706d, 1706e, 1706f or 1706g replaces at least corresponding contact 206a, 206b, 206c, 206d, 206e, 206f or 206g, and similar detailed description is therefore omitted.

Contact 1606b is electrically coupled to a source of PMOS transistor P6-2 and a source of PMOS transistor P6-1. Contact 1606d is electrically coupled to a drain of PMOS transistor P6-3, a drain of PMOS transistor P6-4, a source of PMOS transistor P16-5 and a source of PMOS transistor P16-6.

Contacts 1706a and 1706b are electrically coupled to a conductor 1722a (e.g., VSS) by corresponding vias 1710a and 1710c. Contact 1706c is electrically coupled to a drain of NMOS transistor N16-5 and a drain of PMOS transistor P16-5. Contact 1706d is electrically coupled to a source of NMOS transistor N16-5 and a drain of NMOS transistor N16-6. Contact 1706e is electrically coupled to a source of NMOS transistor N16-6. Contact 1706f is electrically coupled to conductor 222*a* (e.g., VDD) by via 1710*b*. Contact 1706*g* is electrically coupled to a drain of PMOS transistor P16-6.

Other configurations, arrangements on other layout levels or quantities of conductors in the set of contacts 1706 are within the scope of the present disclosure.

The set of vias 1710 includes at least via 1710*a*, 1710*b*, ..., 1710*e* or 1710*f*.

In comparison with integrated circuit 200, at least via 1710*a*, 1710*b*, ..., 1710*e* or 1710*f* replaces one or more of via 210*a*, 210*b*, ..., 210*d* or 210*e*, and similar detailed description is therefore omitted.

Via 1710*a* is between conductor 1722*a* and contact 1706*a*, and electrically couples conductor 1722*a* and contact 1706*a* together. Via 1710*b* is between conductor 222*a* and contact 1706*f*, and electrically couples conductor 222*a* and contact 1706*f* together. Via 1710*c* is between conductor 1722*a* and contact 1706*b*, and electrically couples conductor 1722*a* and contact 1706*b* together. Via 1710*d* is between conductor 1720*d* and contact 1706*c*, and electrically couples conductor 1720*d* and contact 1706*c* together. Via 1710*e* is between conductor 1722*a* and contact 1706*e*, and electrically couples conductor 1722*a* and contact 1706*e* together. Via 1710*f* is between conductor 1720*d* and contact 1706*g*, and electrically couples conductor 1720*d* and contact 1706*g* together.

Other configurations, arrangements on other layout levels or quantities of vias in the set of vias 1710 are within the scope of the present disclosure.

The set of vias 1712 includes at least via 1712*a* or 1712*b*.

In comparison with integrated circuit 200, via 1712*a*, 1712*b* replaces corresponding via 212*a*, 212*b*, and similar detailed description is therefore omitted.

Via 1712*a* is between conductor 1720*a* and gate 1704*d*, and electrically couples conductor 1720*a* and gate 1704*d* together. Via 1712*b* is between conductor 1720*c* and gate 1704*e*, and electrically couples conductor 1720*c* and gate 1704*e* together.

Other configurations, arrangements on other layout levels or quantities of vias in the set of vias 1712 are within the scope of the present disclosure.

The set of conductors 1720 includes at least conductor 1720*a*, 1720*b*, 1720*c* or 1720*d*.

In comparison with integrated circuit 200, conductors 1720*a* and 1720*b* replace conductor 220*a*, conductor 1720*c* replaces conductor 220*b*, and conductor 1720*d* replaces conductor 220*c*, and similar detailed description is therefore omitted.

Other configurations, arrangements on other layout levels or quantities of conductors in the set of conductors 1720 are within the scope of the present disclosure.

The set of conductors 1722 includes at least conductor 1720*a*.

In comparison with integrated circuit 200, conductors 1722*a* replaces conductor 222*b*, and similar detailed description is therefore omitted.

Other configurations, arrangements on other layout levels or quantities of conductors in the set of conductors 1722 are within the scope of the present disclosure.

The set of conductors 1730 includes at least conductor 1630*d*, 1730*a* or 1730*b*.

In comparison with integrated circuit 200, conductor 1730*a* or 1730*b* replaces corresponding conductor 230*a* or 230*b*, and similar detailed description is therefore omitted.

Each of conductors 1730*a* and 1730*b* are similar to conductor 230*d*, and similar detailed description is therefore omitted.

In some embodiments, conductor 1730*c* is similar to conductor 1630*d*, and similar detailed description is therefore omitted.

Other configurations, arrangements on other layout levels or quantities of conductors in the set of conductors 1730 are within the scope of the present disclosure.

The set of vias 1732 includes at least via 1632*d*1, 1632*d*2, 1732*a* or 1732*b*.

In comparison with integrated circuit 200, at least via 1632*d*2, 1732*a* or 1732*b* replaces at least via 232*b*, and similar detailed description is therefore omitted.

Via 1632*d*1 is between conductor 720*e* and conductor 1630*d*, and electrically couples conductor 720*e* and conductor 1630*d* together. Via 1632*d*2 is between conductor 1720*d* and conductor 1630*d*, and electrically couples conductor 1720*d* and conductor 1630*d* together. Via 1732*a* is between conductor 1720*c* and conductor 1730*a*, and electrically couples conductor 1720*c* and conductor 1730*a* together. Via 1732*b* is between conductor 1720*a* and conductor 1730*b*, and electrically couples conductor 1720*a* and conductor 1730*b* together. Other configurations, arrangements on other layout levels or quantities of vias in the set of vias 1732 are within the scope of the present disclosure.

Conductor 1730*a* corresponds to the input pin (e.g., input node C2) of the gates of PMOS transistor P16-6 and NMOS transistor N16-6. For example, conductor 1730*a* is electrically coupled to conductor 1720*c* by via 1732*a*, and conductor 1720*c* is electrically coupled to gate 1704*e* by via 1712*b*.

Conductor 1730*b* corresponds to the input pin (e.g., input node C1) of the gates of PMOS transistor P16-5 and NMOS transistor N16-5. For example, conductor 1730*b* is electrically coupled to conductor 1720*a* by via 1732*b*, and conductor 1720*a* is electrically coupled to gate 1704*d* by via 1712*a*.

Conductor 1630*d* corresponds to the output pin (e.g., output node ZN) of the drains of PMOS transistors P16-5 and P16-6 and the drains of NMOS transistors N6-1, N6-3 and N16-5. For example, conductor 1630*d* is electrically coupled to conductor 720*e* by via 1632*d*1, and conductor 720*e* is electrically coupled to contact 706*h* by via 710*e*. Contact 706*h* is electrically coupled to the drain of NMOS transistor N6-1 and the drain of NMOS transistor N6-3. Furthermore, conductor 1630*d* is electrically coupled to conductor 1720*d* by via 1632*d*2, and conductor 1720*d* is electrically coupled to contact 1706*c* by via 1710*d*, and to contact 1706*g* by via 1710*f*. Contact 1706*c* is electrically coupled to the drain of PMOS transistor P16-5 and the drain of NMOS transistor P16-5, and contact 1706*g* is electrically coupled to the drain of PMOS transistor P16-6.

Other materials, configurations, arrangements on other layout levels or quantities of elements in integrated circuit 1700 are within the scope of the present disclosure.

In some embodiments, integrated circuit 1700 achieves one or more of the benefits discussed above in at least FIG. 1A-1D, 2A-2E, 3A-3D, 5, 7, 9, 11, 13 or 15, or discussed hereinafter.

Figure 18B:
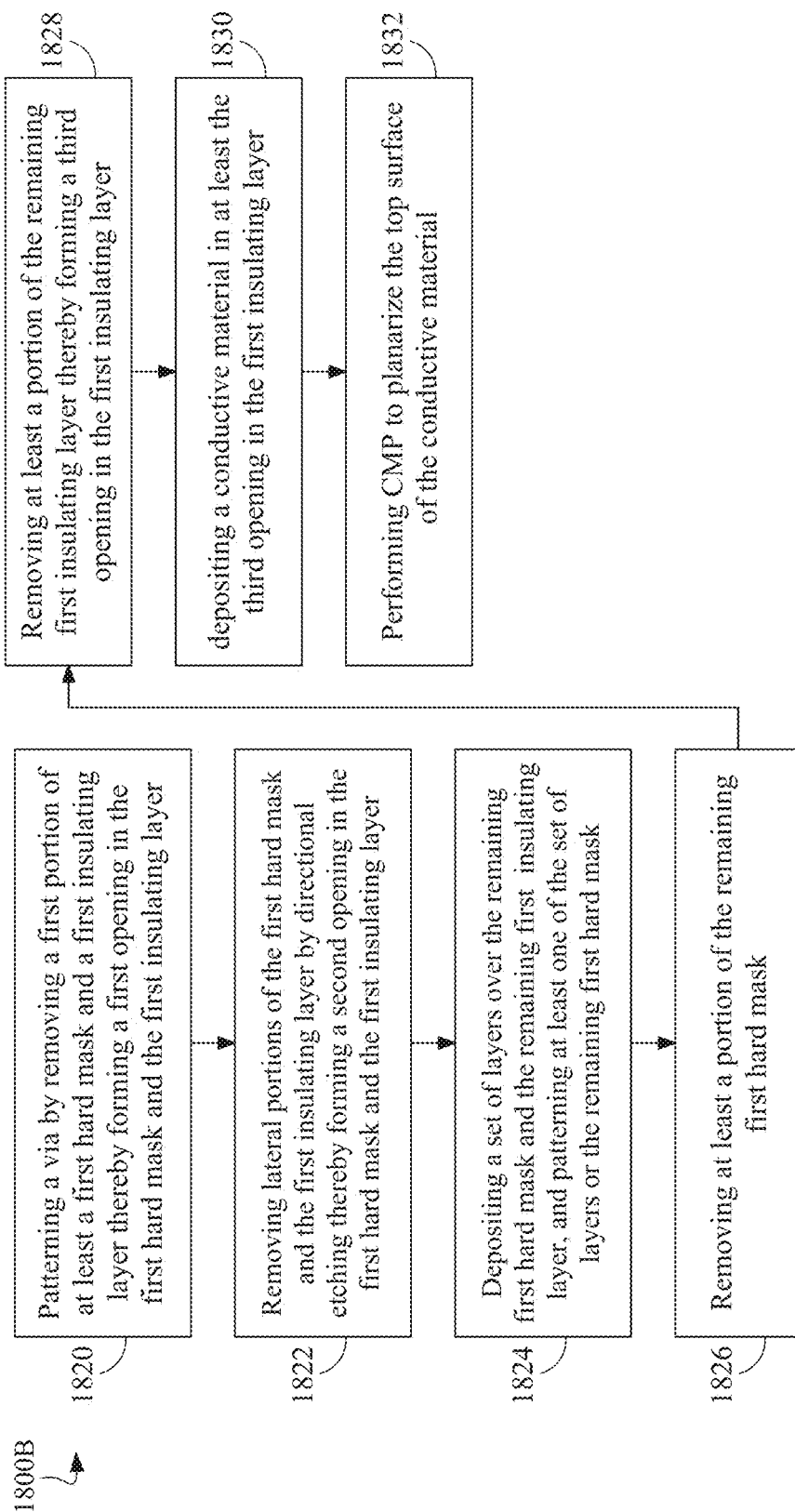
FIG. 18B is a flow chart of a method of forming or manufacturing an integrated circuit in accordance with some embodiments.

FIGS. 18A-18B are corresponding functional flow charts of corresponding methods 1800A-1800B of manufacturing an IC device, in accordance with some embodiments. It is understood that additional operations may be performed before, during, and/or after at least one of method 1800A depicted in FIG. 18A or method 1800B depicted in FIG. 18B, and that some other processes may only be briefly described herein.

In some embodiments, other order of operations of at least one of method 1800A or method 1800B is within the scope of the present disclosure. Methods 1800A-1800B include exemplary operations, but the operations are not necessarily performed in the order shown. Operations may be combined, divided, added, replaced, changed order, and/or eliminated as appropriate, in accordance with the spirit and scope of disclosed embodiments. In some embodiments, one or more of the operations of at least method 1800A, 1800B, 2000 or 2100 is not performed.

In some embodiments, methods 1800A-1800B are an embodiment of operations 2004 and 2006 of method 2000. In some embodiments, the methods 1800A-1800B are usable to manufacture or fabricate at least integrated circuit 200, 300A-300D, 500, 700, 900, 1100, 1300, 1500, 1700 or 1900A-1900F, or an integrated circuit with similar features as at least layout design 100.

In operation 1802 of method 1800A, a set of active regions 202 or 1702 of a set of transistors is formed in a front-side of a substrate 290. In some embodiments, the set of transistors of at least method 1800A or 1800B includes one or more transistors in the set of active regions 202 or 1702. In some embodiments, the set of transistors of at least method 1800A or 1800B includes one or more transistors described herein.

In some embodiments, operation 1802 further includes at least operation 1802a. In some embodiments, operation 1802a (not shown) includes fabricating source and drain regions of the set of transistors in a first well. In some embodiments, the first well comprises p-type dopants. In some embodiments, the p-dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1\times10^{12}$ atoms/cm$^3$ to $1\times10^{14}$ atoms/cm$^3$. Other dopant concentrations are in the scope of the present disclosure.

In some embodiments, the first well comprises n-type dopants. In some embodiments, the n-type dopants include phosphorus, arsenic or other suitable n-type dopants. In some embodiments, the n-type dopant concentration ranges from about $1\times10^{12}$ atoms/cm$^3$ to about $1\times10^{14}$ atoms/cm$^3$. Other dopant concentrations are in the scope of the present disclosure.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In operation 1804 of method 1800A, a first conductive material is deposited over source/drain regions of the set of transistors on a first level thereby forming a first set of contacts of the set of transistors. In some embodiments, the first level of at least method 1800A or 1800B includes the MD level or the POLY level.

In some embodiments, the source/drain regions of the set of transistors of at least method 1800A or 1800B includes the source/drain regions of one or more transistors in the set of active regions 202. In some embodiments, the set of contacts of at least method 1800A or 1800B include at least the set of contacts 206, 506, 706, 906, 1106, 1306, 1506 or 1706. In some embodiments, the set of contacts of at least method 1800A or 1800B includes features in the MD level.

In operation 1806 of method 1800A, a set of gates of the set of transistors is formed on the second level. In some embodiments, the set of gates of at least method 1800A or 1800B includes gate regions that include the set of gates 204, 504, 704, 904, 1104, 1304, 1504 or 1704. In some embodiments, the second level of at least method 1800A or 1800B includes the POLY level.

In some embodiments, the gate region is between the drain region and the source region. In some embodiments, the gate region is over the first well and the substrate. In some embodiments, fabricating the gate regions of operation 1806 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 1808 of method 1800A, a cut process is performed to remove portions of the set of gates. In some embodiments, the removed portions of the set of gates of at least method 1800A or 1800B includes features similar to at least the removed gate portions 205 of gate structure 204c1 and 204c2. In some embodiments, the removed portions of the set of gates of at least method 1800A or 1800B includes features in the POLY level.

In some embodiments, further details of operation 1808 are described in operation 2006 of method 2000 (FIG. 20).

In operation 1810 of method 1800A, a first set of vias and a second set of vias are formed.

In some embodiments, the first set of vias of at least method 1800A or 1800B are in the VD. In some embodiments, the first set of vias of at least method 1800A or 1800B includes at least the set of vias 210, 510, 710, 910, 1110, 1310, 1510 or 1710.

In some embodiments, operation 1810 is performed by a first VD mask. In some embodiments, operation 1810 is performed by a first VD mask, a second VD mask different from the first VD mask.

In some embodiments, the second set of vias of at least method 1800A or 1800B are in the VG level. In some embodiments, the second set of vias of at least method 1800A or 1800B includes at least the set of vias 212, 512, 712, 912, 1112, 1312, 1512 or 1712.

In some embodiments, the first set of vias are formed over the first set of contacts. In some embodiments, the second set of vias are formed over the set of gates.

In some embodiments, operation 1810 includes forming a first and second set of self-aligned contacts (SACs) in the insulating layer over the front-side of the wafer. In some embodiments, the first and second set of vias are electrically coupled to at least the set of transistors.

In operation 1812 of method 1800A, a second conductive material is deposited on a third level thereby forming a first set of power rails and a first set of conductive lines. In some embodiments, the third level of at least method 1800A or 1800B includes the M0 layer. In some embodiments, operation 1814 includes at least depositing a first set of conductive regions over the front-side of the integrated circuit.

In some embodiments, the first set of power rails of at least method 1800A or 1800B includes one or more portions of at least the set of conductors 222 or 1722.

In some embodiments, the first set of conductive lines of at least method 1800A or 1800B includes one or more portions of at least the set of conductors 220, 520, 720, 920, 1120, 1320, 1520 or 1720.

In some embodiments, the first set of power rails is electrically coupled to at least the set of contacts by the first set of vias. In some embodiments, the first set of conductive lines is electrically coupled to at least the set of gates or the set of contacts by the first set of vias or the second set of vias.

In operation 1814 of method 1800A, a cut process is performed to remove portions of the first set of conductive lines. In some embodiments, the removed portions of the set of conductive lines of at least method 1800A or 1800B includes features similar to at least the removed conductor portions 208b and 208c of conductors 220c1 and 220c2. In some embodiments, the removed portions of the first set of conductive lines of at least method 1800A or 1800B includes features in the M0 level.

In some embodiments, further details of operation 1814 are described in operation 2006 of method 2000 (FIG. 20).

In operation 1816 of method 1800A, a third set of vias are formed. In some embodiments, the third set of vias of at least method 1800A or 1800B are in the V0 level. In some embodiments, the third set of vias of at least method 1800A or 1800B includes at least the set of vias 232, 532, 732, 932, 1132, 1332, 1532 or 1732. In some embodiments, the third set of vias are formed over at least the first set of conductive lines.

In some embodiments, operation 1816 includes forming a first set of self-aligned contacts (SACs) in the insulating layer over the front-side of the wafer. In some embodiments, the third set of vias is electrically coupled to at least the set of transistors.

In operation 1818 of method 1800A, a third conductive material is deposited on a fourth level thereby forming a first set of conductors. In some embodiments, the fourth level of at least method 1800A or 1800B includes the M1 layer. In some embodiments, the first set of conductors of at least method 1800A or 1800B includes one or more portions of at least the set of conductors 230, 530, 730, 930, 1130, 1330, 1530 or 1730. In some embodiments, the first set of conductors of at least method 1800A or 1800B includes one or more conductors similar to at least conductors in the M1 layer.

FIG. 18B is a flow chart showing a method 1800B of fabricating a third set of vias and a first set of conductors of an integrated circuit, in accordance with some embodiments.

Method 1800B is an embodiment of operations 1816 and 1818 of method 1800A of FIG. 18A, and similar detailed description is therefore omitted. In some embodiments, method 1800B includes a dual-damascene process.

FIGS. 19A-19F are cross-sectional views of corresponding intermediate device structures 1900A-1900F, in accordance with some embodiments.

In some embodiments, the intermediate device structures 1900A-1900F are obtained when fabricating the third set of vias and the first set of conductors. In some embodiments, FIGS. 19A-19E are cross-sectional views of intermediate device structures of integrated circuit 200. The device structures in FIGS. 19A-19F correspond to intermediate versions of integrated circuit 200 along line B-B' of FIG. 2A.

In some embodiments, the third set of vias of at least FIGS. 19A-19F include at least the set of vias 232, 532, 732, 932, 1132, 1332, 1532 or 1732. In some embodiments, the first set of conductors of at least FIGS. 19A-19F include one or more portions of at least the set of conductors 230, 530, 730, 930, 1130, 1330, 1530 or 1730.

In operation 1820 of method 1800B, a via is patterned by removing a first portion of at least a first hard mask 1908a and a first insulating layer 1906a thereby forming a first opening 1944 in the first hard mask 1908a and the first insulating layer 1906a. In some embodiments, operation 1820 further includes removing a portion of an insulating layer 1904a.

Figure 19A:
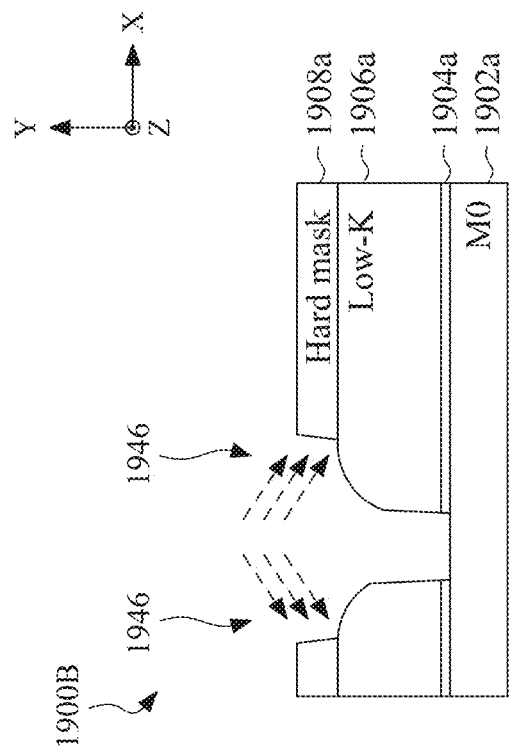
FIGS. 19A-19F are cross-sectional views of corresponding intermediate device structures, in accordance with some embodiments.

In the cross-sectional view of FIG. 19A, the insulating layer 1904a covers a portion of a top surface of a conductive layer 1902a, the first insulating layer 1906a covers the insulating layer 1904a, and the first hard mask 1908a covers the first insulating layer 1906a, but the patterned via region is exposed (shown as first opening 1944). In some embodiments, the conductive layer 1902a corresponds to one or more portions of at least the set of conductors 220, 520, 720, 920, 1120, 1320, 1520 or 1720.

In some embodiments, the insulating layer 1904a or the first insulating layer 1906a electrically isolates the underlying layers from one or more upper layers deposited in at least one or more of operations 1820, 1822, 1824, 1826, 1828, 1830 or 1832.

In some embodiments, the insulating layer 1904a is a hard mask. In some embodiments, the insulating layer 1904a is a dielectric material. In some embodiments, the dielectric material includes silicon dioxide, silicon oxy-nitride, or the like.

In some embodiments, the first insulating layer 1906a is a low-k layer. A low-k layer is, in some embodiments, further characterized or classified as ultra low-K (ULK), extra low-K (ELK), or extreme low-k (XLK), where the classification is generally based upon the k-value. For example, ULK generally refers to materials with a k-value of between about 2.7 to about 2.4, ELK generally refers to materials with a k-value of between about 2.3 to about 2.0, and XLK generally refers to materials with a k-value of less than about 2.0, in accordance with some embodiments. In some embodiments, the first insulating layer 1906a comprises silicon dioxide and/or other suitable materials. In some embodiments, the material(s) for the first insulating layer 1906a comprises at least one of Si, O, C, or H, such as SiCOH, SiOC, oxygen-doped SiC (ODC), nitrogen-doped SiC (NDC), plasma-enhanced oxide (PEOX), and/or other suitable materials.

In some embodiments, the hard mask 1908a includes amorphous carbon or silicon. In some embodiments, the hard mask 1908a includes silicon carbide, silicon nitride, silicon oxy-nitride, or the like. In some embodiments, the hard mask 1908a is deposited by CVD or some other deposition technique compatible with method 1800B. Other hard-mask materials compatible with methods 1800A-1800B are also included within the scope of the present disclosure. In some embodiments, after hard-mask formation, the surface of hard mask 1908a is planarized to provide a level surface for subsequent steps.

In operation 1822 of method 1800B, lateral portions of the first hard mask 1908a and the first insulating layer 1906a are removed by directional etching thereby forming a second opening 1946 in the first hard mask 1908a and the first insulating layer 1906a. In some embodiments, operation 1822 causes the hard mask 1852 to have a second opening 1946 that is greater in the second direction Y than the first opening 1944 formed in at least the first insulating layer 1906a or the insulating layer 1904a. In some embodiments, the directional etching of operation 1822 includes a plasma etching process that includes an etchant gas such as chlorine, fluorine or the like.

Figure 19B:
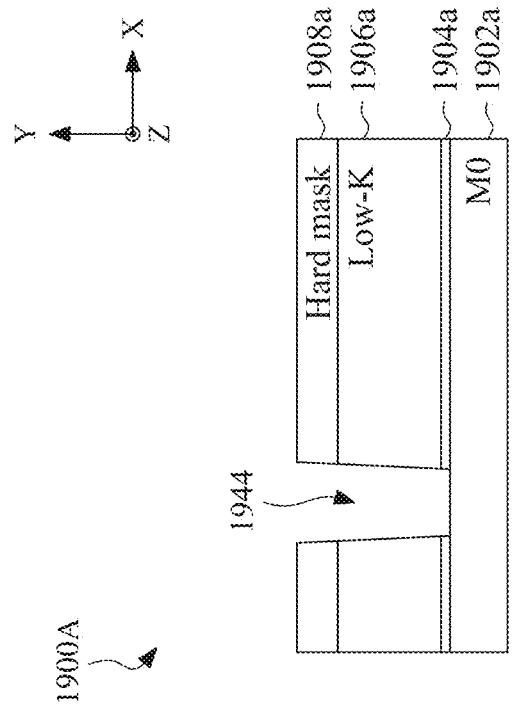

In the cross-sectional view of FIG. 19B, the second opening 1946 formed in the hard mask 1908a is greater in the second direction Y than the first opening 1944 formed in at least the first insulating layer 1906a or the insulating layer 1904a.

In operation 1824 of method 1800B, a set of layers (e.g., photo-resist layer 1920a, lithographic bottom layer 1910a and lithographic middle layer 1912a) are deposited over the remaining first hard mask 1908a and the remaining first insulating layer 1906a, and at least one of the set of layers (e.g., photo-resist layer 1920a, lithographic bottom layer 1910a and lithographic middle layer 1912a) or the remaining first hard mask 1908a are patterned. In some embodiments, the set of layers includes a photo-resist layer 1920a, a lithographic bottom layer 1910a and a lithographic middle layer 1912a.

In some embodiments, at least one of the set of layers (e.g., photo-resist layer 1920a, lithographic bottom layer 1910a and lithographic middle layer 1912a) is patterned in forming a patterned region 1948 in photo-resist layer 1920a.

In some embodiments, the photo-resist layer 1920a includes a C, H or O base or the like.

In some embodiments, the lithographic bottom layer 1910a includes a carbon-based material. In some embodiments, the lithographic bottom layer 1910a includes a C rich base or the like. In some embodiments, the lithographic bottom layer 1910a includes an ash-able hard mask film or an AHM film which can be removed by $O_2$.

In some embodiments, the lithographic middle layer 1912a includes a silicon-based material. In some embodiments, the lithographic middle layer 1912a includes a Si or an O base or the like.

Figure 19D:
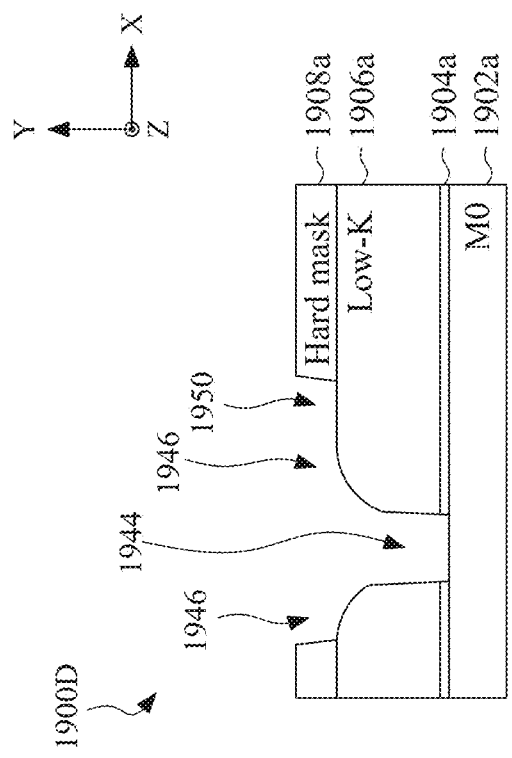
Figure 19C:
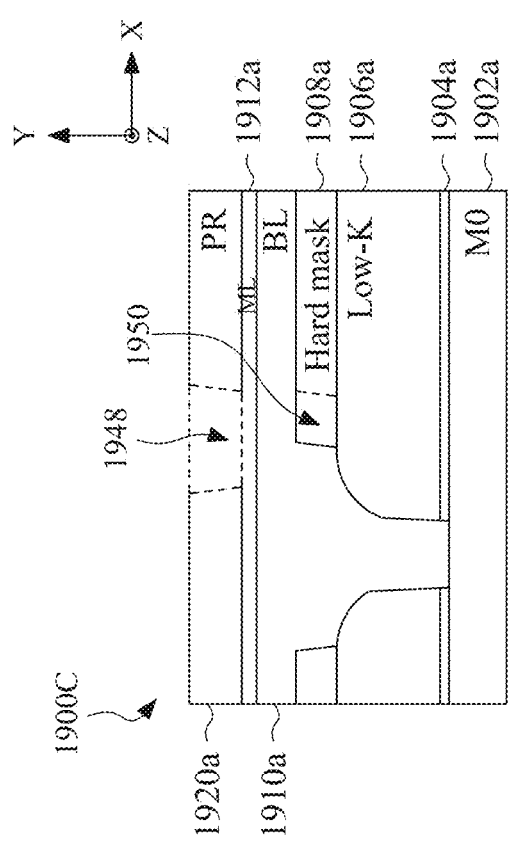

In the cross-sectional view of FIG. 19C, the photo-resist layer 1920a includes a patterned region 1948. In some embodiments, the patterned region 1948 is transferred to the underlying layers (e.g., lithographic bottom layer 1910a, lithographic middle layer 1912a and first hard mask 1908a).

In operation 1826 of method 1800B, a portion 1950 of at least the remaining first hard mask 1908a is removed. In some embodiments, operation 1826 further includes removing the photo-resist layer 1920a, the lithographic bottom layer 1912a and the lithographic middle layer 1912a.

In some embodiments, operation 1826 includes one or more material removal processes. In some embodiments, the material removal process includes a wet etching process, a dry etching process, an RIE process, laser drilling or another suitable etching process.

In the cross-sectional view of FIG. 19D, the removed portion 1950 of the hard mask 1908a causes the opening in the hard mask 1908a to be increased in the second direction Y.

In operation 1828 of method 1800B, at least a portion of the remaining first insulating layer 1906a is removed, thereby forming a third opening 1952 in the first insulating layer 1906a. In some embodiments, operation 1828 further includes removing the remaining first hard mask 1908a. In some embodiments, operation 1828 includes one or more material removal processes. In some embodiments, the material removal process includes a wet etching process, a dry etching process, an RIE process, laser drilling or another suitable etching process.

Figure 19F:
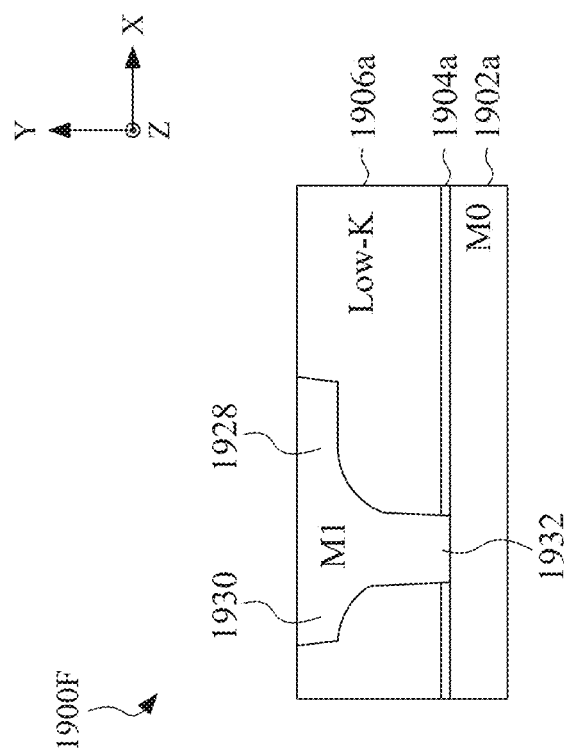
Figure 19E:
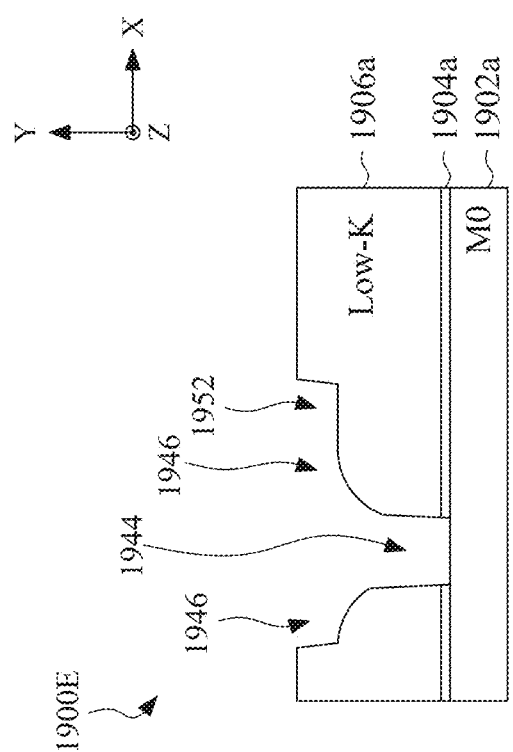

In the cross-sectional view of FIG. 19E, the pattern of the remaining first hard mask 1908a shown in FIG. 19D is transferred to the underlying first insulating layer 1906a.

In operation 1830 of method 1800B, conductive material 1928 is deposited in the third opening 1952 in the first insulating layer 1906a. In some embodiments, operation 1830 further includes depositing conductive material 1928 in the first opening 1944 and the second opening 1946 in the first insulating layer 1906a.

In some embodiments, the conductive material 1928 includes copper, aluminum, titanium, nickel, tungsten, or other suitable conductive material. In some embodiments, the openings and trench are filled using CVD, PVD, sputtering, ALD or other suitable formation process.

In operation 1832 of method 1800B, after conductive material 1928 is deposited in operation 1830, the conductive material 1928 is planarized to provide a level surface for subsequent steps. In some embodiments, operation 1832 includes a thinning process. In some embodiments, the thinning process includes at least one of a grinding operation or a polishing operation (such as chemical mechanical polishing (CMP)) or other suitable processes. In some embodiments, after the thinning process, a wet etching operation is performed to remove defects formed on the surface of intermediate structure 1900F.

In some embodiments, after operation 1832, via 1932 and conductor 1930 are formed. In some embodiments, via 1932 corresponds to one or more vias in at least the set of vias 232, 532, 732, 932, 1132, 1332, 1532 or 1732. In some embodiments, conductor 1930 corresponds to one or more conductors in at least the set of conductors 230, 530, 730, 930, 1130, 1330, 1530 or 1730.

In the cross-sectional view of FIG. 19F, a top surface of the conductive material 1928 is level with a top surface of the remaining first insulating layer 1906a in the first direction X.

In some embodiments, one or more of operations 1804, 1806, 1808, 1810, 1812, 1814, 1816 or 1818 of method 1800A or one or more of operations 1820, 1822, 1824, 1826, 1828, 1830 or 1832 of method 1800B include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 23:
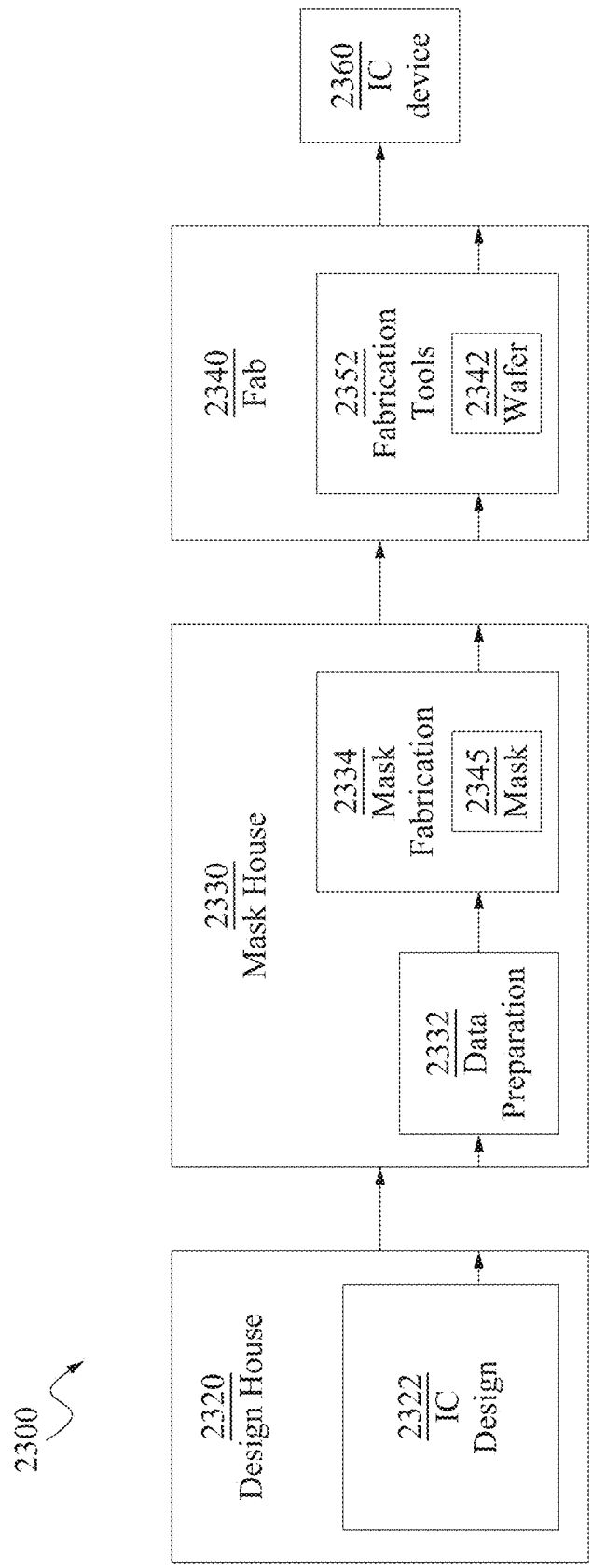
FIG. 23 is a block diagram of an IC manufacturing system, and an IC manufacturing flow associated therewith, in accordance with at least one embodiment of the present disclosure.

In some embodiments, at least one or more operations of at least one of method 1800A or 1800B is performed by system 2300 of FIG. 23. In some embodiments, at least one method(s), such as at least one of method 1800A or 1800B discussed above, is performed in whole or in part by at least one manufacturing system, including system 2300. One or more of the operations of at least one of method 1800A or 1800B is performed by IC fab 2340 (FIG. 23) to fabricate IC device 2360. In some embodiments, one or more of the operations of at least one of method 1800A or 1800B is performed by fabrication tools 2352 to fabricate wafer 2342.

In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in one or more of operations 1804, 1806, 1808, 1810, 1812, 1814, 1816 or 1818 of method 1800A or one or more of operations 1820, 1822, 1824, 1826, 1828 or 1830 of method 1800B, the conductive material is planarized (for example, as in operation 1832) to provide a level surface for subsequent steps.

In some embodiments, one or more of the operations of method 1800A, 1800B, 2000 or 2100 is not performed.

One or more of the operations of methods 2000-2100 is performed by a processing device configured to execute instructions for manufacturing an integrated circuit, such as at least integrated circuit 200, 300A-300D, 500, 700, 900, 1100, 1300, 1500, 1700 or 1900A-1900F. In some embodiments, one or more operations of methods 2000-2100 is performed using a same processing device as that used in a different one or more operations of methods 2000-2100. In some embodiments, a different processing device is used to perform one or more operations of methods 2000-2100 from that used to perform a different one or more operations of methods 2000-2100. In some embodiments, other order of operations of method 1800A, 1800B, 2000 or 2100 is within the scope of the present disclosure. Method 1800A, 1800B, 2000 or 2100 includes exemplary operations, but the operations are not necessarily performed in the order shown. Operations in method 1800A, 1800B, 2000 or 2100 may be added, replaced, changed order, and/or eliminated as appropriate, in accordance with the spirit and scope of disclosed embodiments.

FIG. 20 is a flowchart of a method 2000 of forming or manufacturing an integrated circuit in accordance with some embodiments. It is understood that additional operations may be performed before, during, and/or after the method 2000 depicted in FIG. 20, and that some other operations may only be briefly described herein. In some embodiments, the method 2000 is usable to form integrated circuits, such as at least integrated circuit 200, 300A-300D, 500, 700, 900, 1100, 1300, 1500, 1700 or 1900A-1900F. In some embodiments, the method 2000 is usable to form integrated circuits having similar features and similar structural relationships as one or more of layout design 100.

In operation 2002 of method 2000, a layout design of an integrated circuit is generated. Operation 2002 is performed by a processing device (e.g., processor 2202 (FIG. 22)) configured to execute instructions for generating a layout design. In some embodiments, the layout design of method 2000 includes one or more patterns of at least layout design 100, or one or more features similar to at least integrated circuit 200, 300A-300D, 500, 700, 900, 1100, 1300, 1500, 1700 or 1900A-1900F. In some embodiments, the layout design of the present application is in a graphic database system (GDSII) file format.

In operation 2004 of method 2000, the integrated circuit is manufactured based on the layout design. In some embodiments, operation 2004 of method 2000 comprises manufacturing at least one mask based on the layout design, and manufacturing the integrated circuit based on the at least one mask. In some embodiments, operation 2004 is an embodiment of at least one of method 1800A or 1800B.

In operation 2006 of method 2000, a portion of the integrated circuit is removed by one or more cut processes.

In some embodiments, operation 2006 comprises at least one of removing one or more gate portions from the gate by one or more cut-poly (CPO) processes or one or more conductive portions from the conductor by one or more cut-metal (CM0) processes. In some embodiments, the one or more cut-poly (CPO) processes of operation 2006 includes removing a portion 205 of gate structure 204c thereby forming gate structure 204c1 and 204c2. In some embodiments, the removed portion 205 of the gate structure 204c corresponds to a poly cut region (e.g., poly cut feature pattern).

In some embodiments, the portion 205 of the gate structure 204c that is removed in operation 2006 is identified in a layout design such as layout design 100 by a poly cut feature pattern. In some embodiments, the poly cut feature pattern identifies a location of the removed portion 205 of the gate structure 204c of integrated circuit 200.

In some embodiments, operation 2006 is performed by one or more removal processes. In some embodiments, the one or more removal processes include one or more etching processes suitable to remove a portion of gate structure 204c. In some embodiments, the etching process of operation 2006 includes identifying a portion 205 of the gate structure 204c that is to be removed, and etching the portion 205 of the gate structure 204c that is to be removed. In some embodiments, a mask is used to specify portions 205 of the gate structure 204c that are to be cut or removed.

In some embodiments, the one or more CM0 processes of operation 2006 includes removing portions 208b and 208c of conductor 220c thereby forming conductors 220c1, 220c2 and 220c3. In some embodiments, the removed portions 208b and 208c of the conductor 220c corresponds to a cut metal region (e.g., cut metal feature patterns 108b and 108c).

In some embodiments, the portions 208b and 208c of the conductor 220c that are removed in operation 2006 are identified in a layout design such as layout design 100 by a cut M0 feature pattern (e.g., cut metal feature patterns 108b and 108c). In some embodiments, the cut M0 feature pattern identifies a location of the removed portions 208b and 208c of the conductor 220c of integrated circuit 200.

In some embodiments, operation 2006 is performed by one or more removal processes. In some embodiments, the one or more removal processes include one or more etching processes suitable to remove a portion of conductor 220c. In some embodiments, the etching process of operation 2006 includes identifying portions 208b and 208c of the conductor 220c that are to be removed, and etching the portions 208b and 208c of the conductor 220c that are to be removed. In some embodiments, a mask is used to specify portions 208b and 208c of the conductor 220c that are to be cut or removed.

In some embodiments the mask is a hard mask. In some embodiments, the mask is a soft mask. In some embodiments, etching corresponds to plasma etching, reactive ion etching, chemical etching, dry etching, wet etching, other suitable processes, any combination thereof, or the like. In some embodiments, operation 2004 or 2006 of method 2000 is useable to manufacture one or more integrated circuits having one or more of the advantages described in FIG. 1A-1D or 2A-19F, and similar detailed description is therefore omitted.

In some embodiments, operation 2006 results in the formation of integrated circuit 200, 300A-300D, 500, 700, 900, 1100, 1300, 1500, 1700 or 1900A-1900F. In some embodiments, operation 2006 is not performed.

Figure 21:
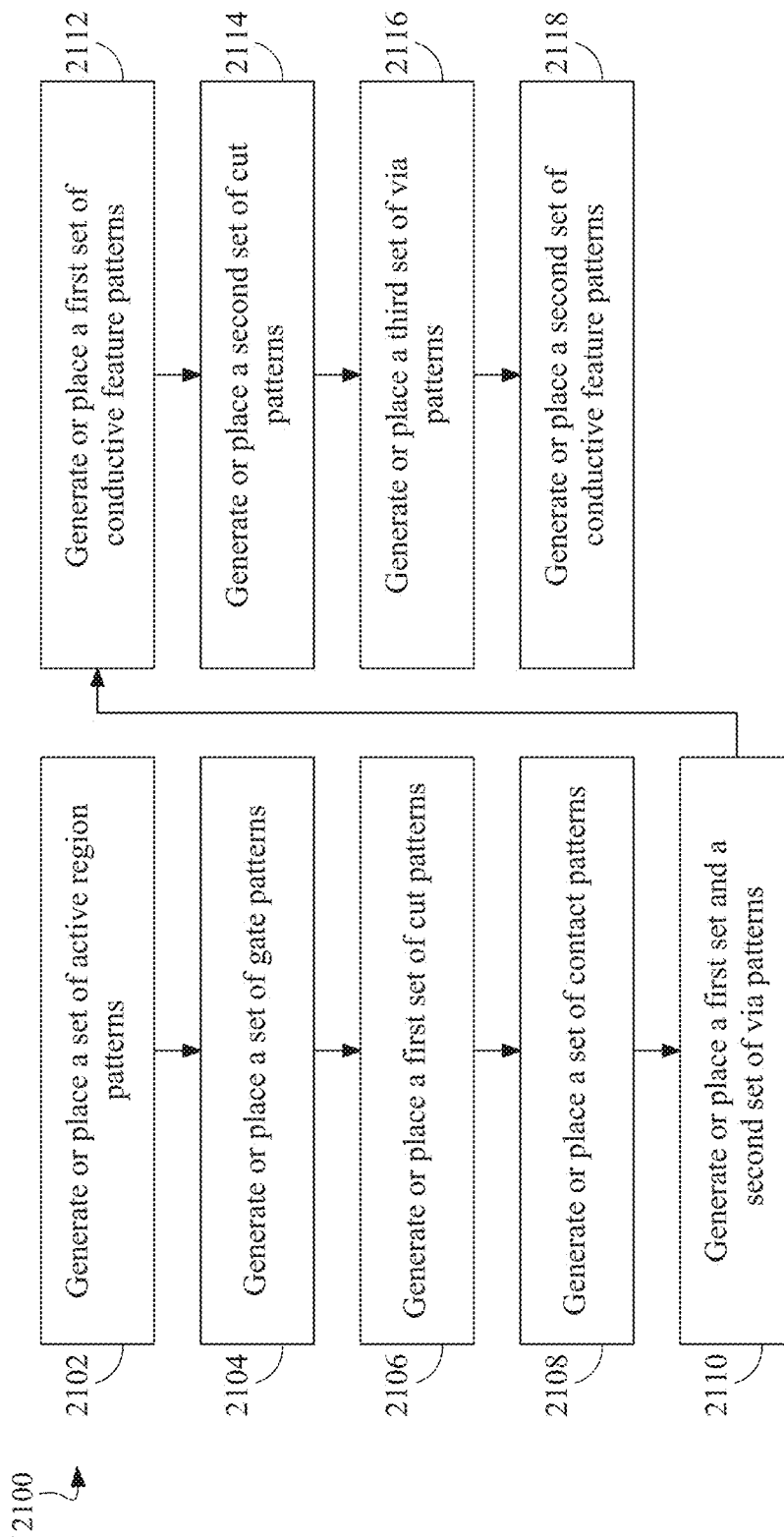
FIG. 21 is a flowchart of a method of generating a layout design of an integrated circuit in accordance with some embodiments.

FIG. 21 is a flowchart of a method 2100 of generating a layout design of an integrated circuit, in accordance with some embodiments. It is understood that additional operations may be performed before, during, and/or after the method 2100 depicted in FIG. 21, and that some other processes may only be briefly described herein. In some embodiments, method 2100 is an embodiment of operation 2002 of method 2000. In some embodiments, method 2100 is usable to generate one or more layout patterns of at least layout design 100, or one or more features similar to at least integrated circuit 200, 300A-300D, 500, 700, 900, 1100, 1300, 1500, 1700 or 1900A-1900F.

In some embodiments, method 2100 is usable to generate one or more layout patterns having structural relationships including alignment, lengths and widths, as well as configurations and layers of at least layout design 100, or one or more features similar to at least integrated circuit 200, 300A-300D, 500, 700, 900, 1100, 1300, 1500, 1700 or 1900A-1900F, and similar detailed description will not be described in FIG. 21, for brevity.

In operation 2102 of method 2100, a set of active region patterns is generated or placed on the layout design. In some embodiments, the set of active region patterns of method 2100 includes at least portions of one or more patterns of set of active region patterns 102. In some embodiments, the set of active region patterns of method 2100 includes one or more regions similar to the set of active regions 202 or 1702.

In operation 2104 of method 2100, a set of gate patterns is generated or placed on the layout design. In some embodiments, the set of gate patterns of method 2100 includes at least portions of one or more gate patterns of set of gate patterns 104. In some embodiments, the set of gate patterns of method 2100 includes one or more gate patterns similar to at least the set of gates 204, 504, 704, 904, 1104, 1304, 1504 or 1704.

In operation 2106 of method 2100, a first set of cut patterns is generated or placed on the layout design. In some embodiments, the first set of cut patterns of method 2100 includes at least portions of one or more cut patterns of the set of poly cut feature patterns 105.

In some embodiments, the first set of cut patterns of method 2100 includes one or more cut patterns similar to at least gate portion 205 of gate structure 204c1 or 204c2 that are removed during operation 2006 of method 2000 (FIG. 20).

In operation 2108 of method 2100, a set of contact patterns is generated or placed on the layout design. In some embodiments, the set of contact patterns of method 2100 includes at least portions of one or more patterns of at least the set of contact patterns 106. In some embodiments, the set of contact patterns of method 2100 includes one or more contact patterns similar to at least the set of contacts 206, 506, 706, 906, 1106, 1306, 1506 or 1706.

In operation 2110 of method 2100, a first set of via patterns and a second set of via patterns are generated or placed on the layout design. In some embodiments, the first set of via patterns of method 2100 includes at least portions of one or more patterns of set of via patterns 110. In some embodiments, the first set of via patterns of method 2100 includes one or more via patterns similar to at least the set of vias 210, 510, 710, 910, 1110, 1310, 1510 or 1710. In some embodiments, the first set of via patterns of method 2100 includes one or more vias similar to at least vias in the VD layer.

In some embodiments, the second set of via patterns of method 2100 includes at least portions of one or more patterns of set of via patterns 112. In some embodiments, the second set of via patterns of method 2100 includes one or more via patterns similar to at least the set of vias 212, 512, 712, 912, 1112, 1312, 1512 or 1712. In some embodiments, the second set of via patterns of method 2100 includes one or more vias similar to at least vias in the VG layer.

In operation 2112 of method 2100, a first set of conductive patterns is generated or placed on the layout design. In some embodiments, the first set of conductive patterns of method 2100 includes at least portions of one or more conductive feature patterns of at least the set of conductive feature patterns 120. In some embodiments, the first set of conductive patterns of method 2100 includes one or more conductive feature patterns similar to at least the set of conductors 220, 520, 720, 920, 1120, 1320, 1520 or 1720. In some embodiments, the first set of conductive patterns of method 2100 includes one or more conductors similar to at least conductors in the M0 layer.

In operation 2114 of method 2100, a second set of cut patterns is generated or placed on the layout design. In some embodiments, the second set of cut patterns of method 2100 includes at least portions of one or more cut patterns of the set of conductive feature cut feature patterns 108.

In some embodiments, the second set of cut patterns of method 2100 includes one or more cut patterns 108 similar to at least portions 208*b* and 208*c* of conductor 220*c* that are removed during operation 2006 of method 2000 (FIG. 20).

In operation 2116 of method 2100, a third set of via patterns is generated or placed on the layout design. In some embodiments, the third set of via patterns of method 2100 includes one or more via patterns of the set of via patterns 132. In some embodiments, the third set of via patterns of method 2100 includes one or more via patterns similar to at least the set of vias 232, 532, 732, 932, 1132, 1332, 1532 or 1732. In some embodiments, the third set of via patterns of method 2100 includes one or more vias similar to at least vias in the V0 layer.

In operation 2118 of method 2100, a second set of conductive patterns is generated or placed on the layout design. In some embodiments, the second set of conductive patterns of method 2100 includes at least portions of one or more conductive feature patterns of at least the set of conductive feature patterns 130. In some embodiments, the second set of conductive patterns of method 2100 includes one or more conductive feature patterns similar to at least the set of conductors 230, 530, 730, 930, 1130, 1330, 1530 or 1730. In some embodiments, the second set of conductive patterns of method 2100 includes one or more conductors similar to at least conductors in the M1 layer.

Figure 22:
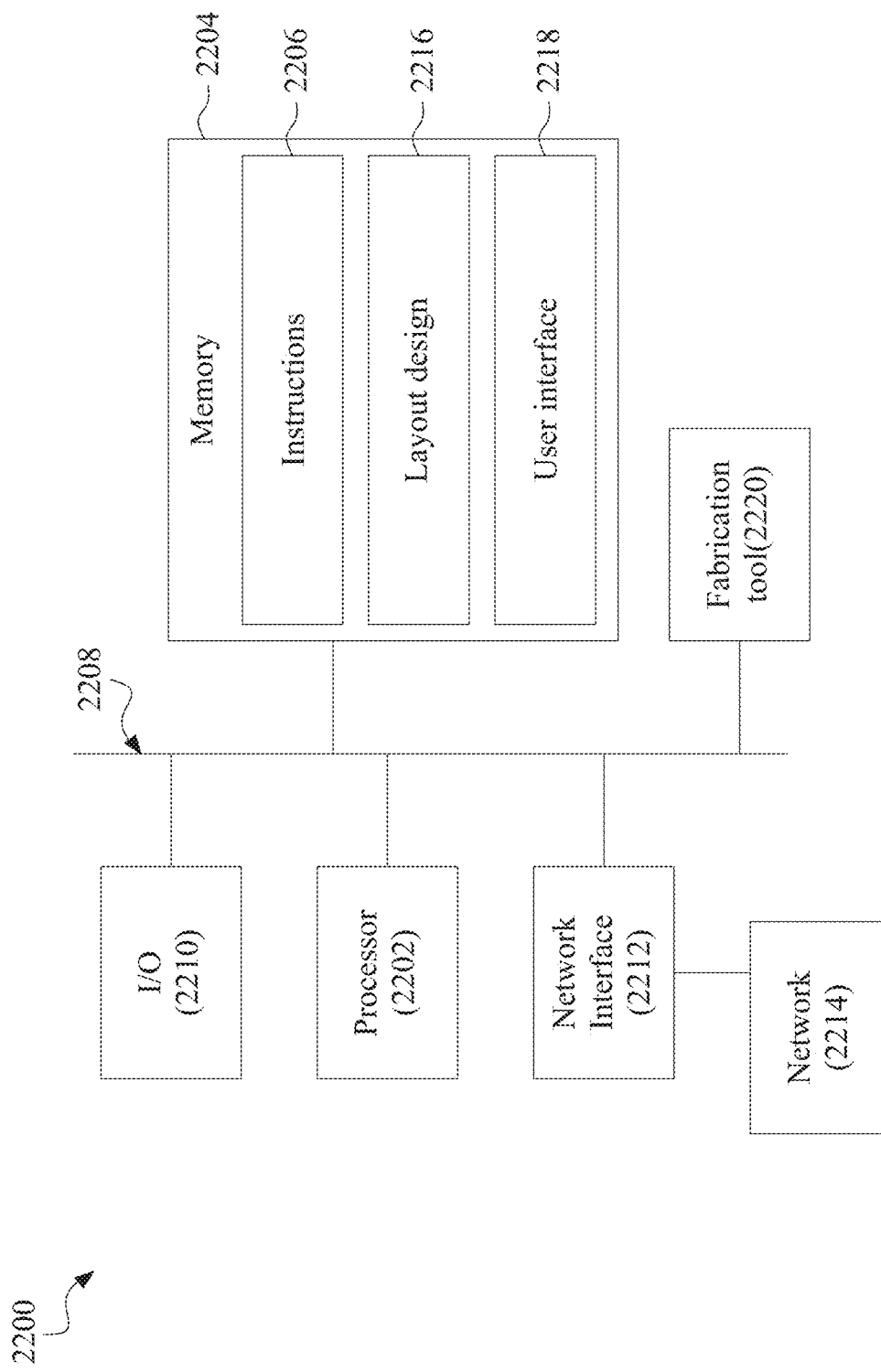
FIG. 22 is a schematic view of a system for designing an IC layout design and manufacturing an IC circuit in accordance with some embodiments.

FIG. 22 is a schematic view of a system 2200 for designing an IC layout design and manufacturing an IC circuit in accordance with some embodiments.

In some embodiments, system 2200 generates or places one or more IC layout designs described herein. System 2200 includes a hardware processor 2202 and a non-transitory, computer readable storage medium 2204 (e.g., memory 2204) encoded with, i.e., storing, the computer program code 2206, i.e., a set of executable instructions 2206. Computer readable storage medium 2204 is configured for interfacing with manufacturing machines for producing the integrated circuit. The processor 2202 is electrically coupled to the computer readable storage medium 2204 via a bus 2208. The processor 2202 is also electrically coupled to an I/O interface 2210 by bus 2208. A network interface 2212 is also electrically connected to the processor 2202 via bus 2208. Network interface 2212 is connected to a network 2214, so that processor 2202 and computer readable storage medium 2204 are capable of connecting to external elements via network 2214. The processor 2202 is configured to execute the computer program code 2206 encoded in the computer readable storage medium 2204 in order to cause system 2200 to be usable for performing a portion or all of the operations as described in method 2000-2100.

In some embodiments, the processor 2202 is a central processing unit (CPU), a multi-processor, a distributed processing system, an application specific integrated circuit (ASIC), and/or a suitable processing unit.

In some embodiments, the computer readable storage medium 2204 is an electronic, magnetic, optical, electromagnetic, infrared, and/or a semiconductor system (or apparatus or device). For example, the computer readable storage medium 2204 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 2204 includes a compact disk-read only memory (CD-ROM), a compact disk-read/write (CD-R/W), and/or a digital video disc (DVD).

In some embodiments, the storage medium 2204 stores the computer program code 2206 configured to cause system 2200 to perform method 2000-2100. In some embodiments, the storage medium 2204 also stores information needed for performing method 2000-2100 as well as information generated during performing method 2000-2100, such as layout design 2216, user interface 2218 and fabrication tool 2220, and/or a set of executable instructions to perform the operation of method 2000-2100. In some embodiments, layout design 2216 comprises one or more of layout patterns of at least layout design 100, or features similar to at least integrated circuit 200, 300A-300D, 500, 700, 900, 1100, 1300, 1500, 1700 or 1900A-1900F.

In some embodiments, the storage medium 2204 stores instructions (e.g., computer program code 2206) for interfacing with manufacturing machines. The instructions (e.g., computer program code 2206) enable processor 2202 to generate manufacturing instructions readable by the manufacturing machines to effectively implement method 2000-2100 during a manufacturing process.

System 2200 includes I/O interface 2210. I/O interface 2210 is coupled to external circuitry. In some embodiments, I/O interface 2210 includes a keyboard, keypad, mouse, trackball, trackpad, and/or cursor direction keys for communicating information and commands to processor 2202.

System 2200 also includes network interface 2212 coupled to the processor 2202. Network interface 2212 allows system 2200 to communicate with network 2214, to which one or more other computer systems are connected. Network interface 2212 includes wireless network interfaces such as BLUETOOTH, WIFI, WIMAX, GPRS, or WCDMA; or wired network interface such as ETHERNET, USB, or IEEE-2094. In some embodiments, method 2000-2100 is implemented in two or more systems 2200, and information such as layout design, and user interface are exchanged between different systems 2200 by network 2214.

System 2200 is configured to receive information related to a layout design through I/O interface 2210 or network interface 2212. The information is transferred to processor 2202 by bus 2208 to determine a layout design for producing at least integrated circuit 200, 300A-300D, 500, 700, 900, 1100, 1300, 1500, 1700 or 1900A-1900F. The layout design is then stored in computer readable medium 2204 as layout design 2216. System 2200 is configured to receive information related to a user interface through I/O interface 2210 or network interface 2212. The information is stored in computer readable medium 2204 as user interface 2218. System 2200 is configured to receive information related to a fabrication tool 2220 through I/O interface 2210 or network interface 2212. The information is stored in computer readable medium 2204 as fabrication tool 2220. In some embodiments, the fabrication tool 2220 includes fabrication information utilized by system 2200. In some embodiments, the fabrication tool 2220 corresponds to mask fabrication 2334 of FIG. 23.

In some embodiments, method 2000-2100 is implemented as a standalone software application for execution by a processor. In some embodiments, method 2000-2100 is implemented as a software application that is a part of an additional software application. In some embodiments, method 2000-2100 is implemented as a plug-in to a software application. In some embodiments, method 2000-2100 is implemented as a software application that is a portion of an EDA tool. In some embodiments, method 2000-2100 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 2000-2100 is implemented by a manufacturing device to manufacture an integrated circuit using a set of masks manufactured based on one or more layout designs generated by system 2200. In some embodiments, system 2200 is a manufacturing device configured to manufacture an integrated circuit using a set of masks manufactured based on one or more layout designs of the present disclosure. In some embodiments, system 2200 of FIG. 22 generates layout designs of an integrated circuit that are smaller than other approaches. In some embodiments, system 2200 of FIG. 22 generates layout designs of integrated circuit structure that occupy less area and provide better routing resources than other approaches.

FIG. 23 is a block diagram of an integrated circuit (IC) manufacturing system 2300, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 2300.

In FIG. 23, IC manufacturing system 2300 (hereinafter "system 2300") includes entities, such as a design house 2320, a mask house 2330, and an IC manufacturer/fabricator ("fab") 2340, that interact with one another in the design, development, and manufacturing cycles and/or services related to manufacturing an IC device 2360. The entities in system 2300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 2320, mask house 2330, and IC fab 2340 is owned by a single larger company. In some embodiments, one or more of design house 2320, mask house 2330, and IC fab 2340 coexist in a common facility and use common resources.

Design house (or design team) 2320 generates an IC design layout 2322. IC design layout 2322 includes various geometrical patterns designed for an IC device 2360. The geometrical patterns correspond to patterns of metal, oxide, or semiconductor layers that make up the various components of IC device 2360 to be fabricated. The various layers combine to form various IC features. For example, a portion of IC design layout 2322 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 2320 implements a proper design procedure to form IC design layout 2322. The design procedure includes one or more of logic design, physical design or place and route. IC design layout 2322 is presented in one or more data files having information of the geometrical patterns. For example, IC design layout 2322 can be expressed in a GDSII file format or DFII file format.

Mask house 2330 includes data preparation 2332 and mask fabrication 2334. Mask house 2330 uses IC design layout 2322 to manufacture one or more masks 2345 to be used for fabricating the various layers of IC device 2360 according to IC design layout 2322. Mask house 2330 performs mask data preparation 2332, where IC design layout 2322 is translated into a representative data file (RDF). Mask data preparation 2332 provides the RDF to mask fabrication 2334. Mask fabrication 2334 includes a mask writer. A mask writer converts the RDF to an image on a substrate, such as a mask (reticle) 2345 or a semiconductor wafer 2342. The design layout 2322 is manipulated by mask data preparation 2332 to comply with particular characteristics of the mask writer and/or requirements of IC fab 2340. In FIG. 23, mask data preparation 2332 and mask fabrication 2334 are illustrated as separate elements. In some embodiments, mask data preparation 2332 and mask fabrication 2334 can be collectively referred to as mask data preparation.

In some embodiments, mask data preparation 2332 includes optical proximity correction (OPC) which uses lithography enhancement techniques to compensate for image errors, such as those that can arise from diffraction, interference, other process effects and the like. OPC adjusts IC design layout 2322. In some embodiments, mask data preparation 2332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 2332 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 2334, which may undo part of the modifications performed by OPC in order to meet mask creation rules.

In some embodiments, mask data preparation 2332 includes lithography process checking (LPC) that simulates processing that will be implemented by IC fab 2340 to fabricate IC device 2360. LPC simulates this processing based on IC design layout 2322 to create a simulated manufactured device, such as IC device 2360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 2322.

It should be understood that the above description of mask data preparation 2332 has been simplified for the purposes of clarity. In some embodiments, data preparation 2332 includes additional features such as a logic operation (LOP) to modify the IC design layout according to manufacturing rules. Additionally, the processes applied to IC design layout 2322 during data preparation 2332 may be executed in a variety of different orders.

After mask data preparation 2332 and during mask fabrication 2334, a mask 2345 or a group of masks 2345 are fabricated based on the modified IC design layout 2322. In some embodiments, mask fabrication 2334 includes performing one or more lithographic exposures based on IC design layout 2322. In some embodiments, an electron-beam (e-beam) or a mechanism of multiple e-beams is used to form a pattern on a mask (photomask or reticle) 2345 based on the modified IC design layout 2322. The mask 2345 can be formed in various technologies. In some embodiments, the mask 2345 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 2345 includes a transparent substrate (e.g., fused quartz) and an opaque material (e.g., chromium) coated in the opaque regions of the binary mask. In another example, the mask 2345 is formed using a phase shift technology. In the phase shift mask (PSM) version of mask 2345, various features in the pattern formed on the mask are configured to have proper phase difference to enhance the resolution and imaging quality. In various examples, the phase shift mask can be attenuated PSM or alternating PSM. The mask(s) generated by mask fabrication 2334 is used in a variety of processes. For example, such a mask(s) is used in an ion implantation process to form various doped regions in the semiconductor wafer, in an etching process to form various etching regions in the semiconductor wafer, and/or in other suitable processes.

IC fab 2340 is an IC fabrication entity that includes one or more manufacturing facilities for the fabrication of a variety of different IC products. In some embodiments, IC Fab 2340 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 2340 includes wafer fabrication tools 2352 (hereinafter "fabrication tools 2352") configured to execute various manufacturing operations on semiconductor wafer 2342 such that IC device 2360 is fabricated in accordance with the mask(s), e.g., mask 2345. In various embodiments, fabrication tools 2352 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 2340 uses mask(s) 2345 fabricated by mask house 2330 to fabricate IC device 2360. Thus, IC fab 2340 at least indirectly uses IC design layout 2322 to fabricate IC device 2360. In some embodiments, a semiconductor wafer 2342 is fabricated by IC fab 2340 using mask(s) 2345 to form IC device 2360. In some embodiments, the IC fabrication includes performing one or more lithographic exposures based at least indirectly on IC design layout 2322. Semiconductor wafer 2342 includes a silicon substrate or other proper substrate having material layers formed thereon. Semiconductor wafer 2342 further includes one or more of various doped regions, dielectric features, multilevel interconnects, and the like (formed at subsequent manufacturing steps).

System 2300 is shown as having design house 2320, mask house 2330 or IC fab 2340 as separate components or entities. However, it is understood that one or more of design house 2320, mask house 2330 or IC fab 2340 are part of the same component or entity.

One aspect of this description relates to an integrated circuit. In some embodiments, the integrated circuit includes a first active region extending in a first direction, and being on a first level of a substrate. In some embodiments, the integrated circuit further includes a first contact extending in a second direction different from the first direction, being on a second level different from the first level, and overlapping at least the first active region. In some embodiments, the integrated circuit further includes a first gate extending in the second direction, overlapping the first active region, and being on a third level different from the first level. In some embodiments, the integrated circuit further includes a first conductive line extending in the first direction, and overlapping the first gate, and being on a fourth level different from the first level, the second level and the third level. In some embodiments, the integrated circuit further includes a first conductor extending in the first direction and the second direction, overlapping the first contact, the first gate and the first conductive line, and being on a fifth level different from the first level, the second level, the third level and the fourth level. In some embodiments, the integrated circuit further includes a first via between the first conductor and the first conductive line, the first via electrically coupling the first conductor and the first conductive line together.

Another aspect of this description relates to an integrated circuit. In some embodiments, the integrated circuit includes a first active region extending in a first direction, and being on a first level of a substrate. In some embodiments, the integrated circuit further includes a second active region extending in the first direction, being on the first level, and being separated from the first active region in a second direction different from the first direction. In some embodiments, the integrated circuit further includes a first contact extending in the second direction, being on a second level different from the first level, and overlapping the second active region. In some embodiments, the integrated circuit further includes a first gate extending in the second direction, overlapping the first active region and the second active region, and being on a third level different from the first level. In some embodiments, the integrated circuit further includes a first conductive line extending in the first direction, and overlapping the first gate, and being on a fourth level different from the first level, the second level and the third level. In some embodiments, the integrated circuit further includes a first conductor extending in the first direction and the second direction, overlapping the first active region, the first gate and the first conductive line, and being on a fifth level different from the first level, the second level, the third level and the fourth level. In some embodiments, the integrated circuit further includes a first via between the first conductor and the first conductive line, the first via electrically coupling the first conductor and the first conductive line together. In some embodiments, the integrated circuit further includes a second conductor extending in the first direction and the second direction, overlapping the second active region and the first contact, being separated from the first conductor in the first direction, and being electrically coupled to a first region in the second active region by at least the first contact, and being on the fifth level.

Still another aspect of this description relates to a method of fabricating an integrated circuit. In some embodiments, the method includes depositing a first conductive material over a set of active regions on a first level thereby forming a set of contacts, the set of active regions extending in a first direction, the set of contacts including a first contact, the set of contacts extending in a second direction different from the first direction, and overlapping at least a first active region of the set of active regions. In some embodiments, the method further includes fabricating a set of gates over the set of active regions on a second level, the set of gates extending in the second direction, the set of gates including a first gate, and the set of gates overlapping the set of active regions. In some embodiments, the method further includes fabricating a first set of vias over the set of contacts, and a second set of vias over the set of gates, the second set of vias including a first via over the first gate. In some embodiments, the method further includes depositing a second conductive material over at least the set of contacts on a third level thereby forming a first set of conductive lines, the third level being above the first level and the second level, the first set of conductive lines including a first conductive line extending in the first direction, overlapping the first gate, and being electrically coupled to the first gate by the first via. In some embodiments, the method further includes fabricating a third set of vias over the first set of conductive lines, the third set of vias including a second via over the first conductive line. In some embodiments, the method further includes depositing a third conductive material over at least the first set of conductive lines on a fourth level thereby forming a set of conductors, the fourth level being above the first level, the second level and the third level, the set of conductors including a first conductor extending in the first direction and the second direction, the first conductor overlapping the first gate, and being electrically coupled to the first conductive line by the second via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
    a first active region extending in a first direction, and being on a first level of a substrate;
    a first contact extending in a second direction different from the first direction, being on a second level different from the first level, and overlapping at least the first active region;
    a first gate extending in the second direction, overlapping the first active region, and being on a third level different from the first level;
    a first conductive line extending in the first direction, and overlapping the first gate, and being on a fourth level different from the first level, the second level and the third level;
    a first conductor extending in the first direction and the second direction, overlapping the first contact, the first gate and the first conductive line, and being on a fifth level different from the first level, the second level, the third level and the fourth level, wherein the first conductor comprises:
        a first conductive portion extending in the second direction, and overlapping the first active region and the first contact; and
        a second conductive portion extending in the first direction, and overlapping the first gate and the first active region;
    a first via between the first conductor and the first conductive line, the first via electrically coupling the first conductor and the first conductive line together; and
    a second via between the first gate and the second conductive portion, the second via electrically coupling the first gate and the second conductive portion together, wherein the first via is between the second conductive portion and the first conductive line.

2. The integrated circuit of claim 1, further comprising:
    a second contact extending in the second direction, being on the second level, overlapping the first active region, and being separated from the first contact in the first direction; and
    a second gate extending in the second direction, overlapping the first active region, being on the third level, and being separated from the first gate in the first direction.

3. The integrated circuit of claim 2, further comprising:
    a second conductive line extending in the first direction, and overlapping the second contact and the second gate, being on the fourth level, and being separated from the first conductive line in the first direction; and
    a third via between the second gate and the second conductive line, the third via electrically coupling the second gate and the second conductive line together.

4. The integrated circuit of claim 3, further comprising:
    a second conductor extending in the first direction and the second direction, overlapping the second contact and the second conductive line, and being on the fifth level; and
    a fourth via between the second conductor and the second conductive line, the fourth via electrically coupling the second conductor and the second conductive line together.

5. The integrated circuit of claim 4, wherein the second conductor comprises:
    a third conductive portion extending in the second direction, and overlapping the first active region, the second contact and the second conductive line; and
    a fourth conductive portion extending in the first direction, and overlapping the second contact,
    wherein the fourth via is between the fourth conductive portion and the second conductive line.

6. The integrated circuit of claim 5, further comprising:
    a third conductive line extending in the first direction, and overlapping the first contact and the second contact, being on the fourth level, and being separated from the first conductive line and the second conductive line in the second direction;
    a fifth via between the first contact and the third conductive line, the fifth via electrically coupling the first contact and the third conductive line together; and
    a sixth via between the second contact and the third conductive line, the sixth via electrically coupling the second contact and the third conductive line together.

7. The integrated circuit of claim 4, wherein
the first conductor has an L-shape; and
the second conductor has a T-shape.

8. The integrated circuit of claim 1, wherein the integrated circuit is part of an AND OR INVERT logic circuit or an OR AND INVERT logic circuit.

9. The integrated circuit of claim 7, wherein
the integrated circuit is part of an AND OR INVERT logic circuit.

10. The integrated circuit of claim 9, wherein
the first conductor corresponds to a first input pin of the AND OR INVERT logic circuit; and
the second conductor corresponds to a second input pin of the AND OR INVERT logic circuit.

11. An integrated circuit comprising:
a first active region extending in a first direction, and being on a first level of a substrate;
a second active region extending in the first direction, being on the first level, and being separated from the first active region in a second direction different from the first direction;
a first contact extending in the second direction, being on a second level different from the first level, and overlapping the second active region;
a first gate extending in the second direction, overlapping the first active region and the second active region, and being on a third level different from the first level;
a first conductive line extending in the first direction, and overlapping the first gate, and being on a fourth level different from the first level, the second level and the third level;
a first conductor extending in the first direction and the second direction, overlapping the first active region, the first gate and the first conductive line, and being on a fifth level different from the first level, the second level, the third level and the fourth level;
a first via between the first conductor and the first conductive line, the first via electrically coupling the first conductor and the first conductive line together; and
a second conductor extending in the first direction and the second direction, overlapping the second active region and the first contact, being separated from the first conductor in the first direction, and being electrically coupled to a first region in the second active region by at least the first contact, and being on the fifth level.

12. The integrated circuit of claim 11, further comprising:
a second via between the first gate and the first conductor, the second via electrically coupling the first gate and the first conductor together.

13. The integrated circuit of claim 11, further comprising:
a second conductive line extending in the first direction, and overlapping the first contact, being on the fourth level, and being separated from the first conductive line in the second direction;
a second via between the second conductor and the second conductive line, the second via electrically coupling the second conductor and the second conductive line together; and
a third via between the first contact and the second conductive line, the third via electrically coupling the first contact and the second conductive line together.

14. The integrated circuit of claim 13, further comprising:
a second contact extending in the second direction, being on the second level, overlapping the first active region, being separated from the first contact in at least the first direction and the second direction, and being overlapped by the first conductor; and
a fourth via between the second contact and the second conductive line, the fourth via electrically coupling the second contact and the second conductive line together,
wherein the first contact corresponds to a drain of a first transistor of a first type and a drain of a second transistor of the first type; and
the second contact corresponds to a drain of a third transistor of a second type different from the first type, and a drain of a fourth transistor of the second type.

15. The integrated circuit of claim 14, further comprising:
a second gate extending in the second direction, overlapping the first active region and the second active region, being on the third level, and being separated from the first gate in the first direction;
a third gate extending in the second direction, overlapping the first active region and the second active region, being on the third level, being separated from the first gate and the second gate in the first direction, wherein
the first contact is between the first gate and the third gate; and
the second contact is between the first gate and the second gate.

16. The integrated circuit of claim 13, wherein the first conductor comprises:
a first conductive portion extending in the second direction, and overlapping the first active region; and
a second conductive portion extending in the first direction, and overlapping the first gate and the first conductive line,
wherein the first via is between the second conductive portion and the first conductive line, and
the first conductor has a hatchet shape.

17. The integrated circuit of claim 13, wherein the second conductor comprises:
a first conductive portion extending in the second direction, and overlapping the second active region, the first contact and the second conductive line; and
a second conductive portion extending in the first direction, and overlapping the first contact,
wherein the second via is between the second conductive portion and the second conductive line, and
the second conductor has a cross shape.

18. The integrated circuit of claim 11, further comprising:
a first power rail extending in the first direction, configured to supply a first supply voltage, and being on the fourth level; and
a second power rail extending in the first direction, configured to supply a second supply voltage different from the first supply voltage, being on the fourth level, and being separated from the first power rail in the second direction.

19. The integrated circuit of claim 11, wherein
the integrated circuit is part of an AND OR INVERT logic circuit;
the first conductor corresponds to an input pin of the AND OR INVERT logic circuit; and
the second conductor corresponds to an output pin of the AND OR INVERT logic circuit, and electrically couples a drain of a first transistor of a first type and a drain of a second transistor of the first type, a drain of a third transistor of a second type different from the first type, and a drain of a fourth transistor of the second type together.

20. A method of fabricating an integrated circuit, the method comprising:
depositing a first conductive material over a set of active regions on a first level thereby forming a set of contacts, the set of active regions extending in a first direction, the set of contacts including a first contact, the set of contacts extending in a second direction different from the first direction, and overlapping at least a first active region of the set of active regions;

fabricating a set of gates over the set of active regions on a second level, the set of gates extending in the second direction, the set of gates including a first gate, and the set of gates overlapping the set of active regions;

fabricating a first set of vias over the set of contacts, and a second set of vias over the set of gates, the second set of vias including a first via over the first gate;

depositing a second conductive material over at least the set of contacts on a third level thereby forming a first set of conductive lines, the third level being above the first level and the second level, the first set of conductive lines including a first conductive line extending in the first direction, overlapping the first gate, and being electrically coupled to the first gate by the first via;

fabricating a third set of vias over the first set of conductive lines, the third set of vias including a second via over the first conductive line; and depositing a third conductive material over at least the first set of conductive lines on a fourth level thereby forming a set of conductors, the fourth level being above the first level, the second level and the third level, the set of conductors including a first conductor extending in the first direction and the second direction, the first conductor overlapping the first gate, and being electrically coupled to the first conductive line by the second via.

* * * * *